(12) United States Patent
Feurtado et al.

(10) Patent No.: US 10,917,992 B2
(45) Date of Patent: *Feb. 9, 2021

(54) HIGH POWER MULTILAYER MODULE HAVING LOW INDUCTANCE AND FAST SWITCHING FOR PARALLELING POWER DEVICES

(71) Applicant: Cree Fayetteville, Inc., Fayetteville, AR (US)

(72) Inventors: Matthew Feurtado, Fayetteville, AR (US); Brice McPherson, Fayetteville, AR (US); Daniel Martin, Fayetteville, AR (US); Alexander Lostetter, Fayetteville, AR (US)

(73) Assignee: CREE FAYETTEVILLE, INC., Fayetteville, AR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/658,630

(22) Filed: Oct. 21, 2019

(65) Prior Publication Data

US 2020/0053900 A1 Feb. 13, 2020

Related U.S. Application Data

(63) Continuation-in-part of application No. 16/266,771, filed on Feb. 4, 2019, now Pat. No. 10,749,443, and
(Continued)

(51) Int. Cl.
*H05K 7/00* (2006.01)
*H05K 7/14* (2006.01)
(Continued)

(52) U.S. Cl.
CPC .......... *H05K 7/1432* (2013.01); *H02M 1/088* (2013.01); *H02M 7/003* (2013.01);
(Continued)

(58) Field of Classification Search
USPC ....................................................... 361/760
See application file for complete search history.

(56) References Cited

U.S. PATENT DOCUMENTS

| 7,965,522 B1 | 6/2011 | Hornberger et al. |
| 8,441,275 B1 | 5/2013 | Alladio |

(Continued)

OTHER PUBLICATIONS

International Search Report and Written Opinion issued in PCT/US2020/012167, dated May 7, 2020.

*Primary Examiner* — Andargie M Aychillhum
(74) *Attorney, Agent, or Firm* — BakerHostetler

(57) ABSTRACT

A power module including at least one substrate, a housing arranged on the at least one power substrate, a first terminal electrically connected to the at least one power substrate, a second terminal including a contact surface, a third terminal electrically connected to the at least one power substrate, a plurality of power devices arranged on and connected to the at least one power substrate, and the third terminal being electrically connected to at least one of the plurality of power devices. The power module further including a base plate and a plurality of pin fins arranged on the base plate and the plurality of pin fins configured to provide direct cooling for the power module.

30 Claims, 61 Drawing Sheets

Related U.S. Application Data a continuation-in-part of application No. 15/405,520, filed on Jan. 13, 2017, now Pat. No. 10,212,838.

(60) Provisional application No. 62/914,847, filed on Oct. 14, 2019, provisional application No. 62/790,965, filed on Jan. 10, 2019.

(51) Int. Cl.
*H02M 1/088* (2006.01)
*H02M 7/00* (2006.01)
*H02M 7/537* (2006.01)
*H05K 1/02* (2006.01)
*H05K 1/18* (2006.01)
*H05K 7/20* (2006.01)
*H05K 5/00* (2006.01)
*H05K 5/02* (2006.01)
*H02M 1/00* (2006.01)

(52) U.S. Cl.
CPC .......... *H02M 7/537* (2013.01); *H05K 1/0271* (2013.01); *H05K 1/181* (2013.01); *H05K 5/0069* (2013.01); *H05K 5/0247* (2013.01); *H05K 7/20509* (2013.01); *H05K 7/20909* (2013.01); *H02M 2001/0054* (2013.01); *H05K 2201/064* (2013.01); *H05K 2201/10151* (2013.01); *H05K 2201/10272* (2013.01)

(56) References Cited

U.S. PATENT DOCUMENTS

| | | | |
|---|---|---|---|
| 9,040,338 | B2 | 5/2015 | Eisele |
| 10,020,237 | B2 | 7/2018 | Hoehn et al. |
| 2007/0246635 | A1* | 10/2007 | Nakajima .......... H05K 7/20927 248/637 |
| 2009/0309524 | A1 | 12/2009 | Rider et al. |
| 2013/0105961 | A1* | 5/2013 | Jones .................... H01L 23/24 257/691 |
| 2014/0198475 | A1 | 7/2014 | Menzies et al. |
| 2015/0137871 | A1 | 5/2015 | Takano |
| 2016/0219693 | A1 | 7/2016 | Nishimoto et al. |
| 2018/0070462 | A1 | 3/2018 | Cole et al. |
| 2018/0206359 | A1 | 7/2018 | McPherson et al. |

* cited by examiner

US 10,917,992 B2

HIGH POWER MULTILAYER MODULE HAVING LOW INDUCTANCE AND FAST SWITCHING FOR PARALLELING POWER DEVICES

CROSS REFERENCE TO PRIOR APPLICATIONS

This application is a continuation in part of U.S. patent application Ser. No. 16/266,771, filed Feb. 4, 2019, which is hereby incorporated by reference in its entirety for all purposes as if fully set forth herein; which application is a continuation in part of U.S. patent application Ser. No. 15/405,520, filed Jan. 13, 2017 now U.S. Pat. No. 10,212,838, which is hereby incorporated by reference in its entirety for all purposes as if fully set forth herein; and which application also claims the benefit of U.S. Provisional Application No. 62/790,965 filed on Jan. 10, 2019, which is hereby incorporated by reference in its entirety for all purposes as if fully set forth herein. This application also claims the benefit of U.S. Provisional Application No. 62/914,847 filed on Oct. 14, 2019, which is hereby incorporated by reference in its entirety for all purposes as if fully set forth herein.

BACKGROUND OF THE DISCLOSURE

1. Field of the Disclosure

This disclosure is directed to a high power multilayer module having low inductance and fast switching for paralleling power devices. Moreover, the disclosure is directed to a process of configuring a high power multilayer module having low inductance and fast switching for paralleling power devices.

2. Related Art

As will be appreciated by those skilled in the art, power modules are known in various forms. Power modules provide a physical containment for power components, usually power semiconductor devices. These power semiconductors are typically soldered or sintered on a power electronic substrate. The power module typically carries the power semiconductors, provides electrical and thermal contact, and includes electrical insulation.

Current trends in electrification are placing increasing demands on power modules including the power semiconductor devices, power electronics, and/or the like associated with the power modules. For example, improved efficiency and higher power density. These demands extend from the system level down to the component level. However, operation of the power modules to meet these demands results in increased generation of heat within the power module. The increased generation of heat limits the ability of the power modules to operate due to physical limitations of the power semiconductor devices, the power electronics, and/or the like. In particular, the various components of the power modules including the power semiconductor devices, power electronics, and/or the like typically have operational temperature limitations.

Additionally, parasitic impedances in the power module limit the practical implementation of these devices in current technologies. Specifically, the loop inductance during switching events can result in a voltage overshoot and ringing. This reduces stability, increases switching losses, creates Electromagnetic Interference (EMI), and stresses system components. Ultimately, these factors may limit the maximum switching frequency, which is desirable to reduce the size of external filters in a power conversion system.

Accordingly, what is needed is a power module configured to address the additional generation of heat.

Additionally, what is needed is a power module configured to address parasitic impedances, such as loop inductance, to increase stability, decrease switching losses, reduce EMI, and/or limit stresses on system components.

SUMMARY OF THE DISCLOSURE

One general aspect includes a power module, including: at least one electrically conductive power substrate, a housing arranged on the at least one electrically conductive power substrate, a first terminal electrically connected to the at least one electrically conductive power substrate, the first terminal including a contact surface located on the housing, a second terminal including a contact surface located on the housing, a third terminal electrically connected to the at least one electrically conductive power substrate, a plurality of power devices arranged on and connected to the at least one electrically conductive power substrate, the third terminal being electrically connected to at least one of the plurality of power devices, a base plate, and a plurality of pin fins arranged on the base plate and the plurality of pin fins configured to provide direct cooling for the power module.

One general aspect includes a power module, including: a base plate, at least one power substrate, a housing arranged on the at least one power substrate, a first terminal electrically connected to the at least one power substrate, a second terminal, a third terminal electrically connected to the at least one power substrate, a plurality of power devices electrically connected to the at least one power substrate, a gate-source board electrically connected to the plurality of power devices, a plurality of pin fins arranged on the base plate and the plurality of pin fins are configured to provide direct cooling for the power module.

One general aspect includes a process of configuring a power module, including: providing at least one power substrate, arranging a housing on the at least one power substrate, connecting a first terminal to the at least one power substrate, providing a second terminal, electrically connecting a third terminal to the at least one power substrate, connecting a plurality of power devices to the at least one power substrate, mounting a gate-source board electrically connected to the plurality of power devices, the gate-source board configured to receive at least one electrical signal, providing a plurality of pin fins arranged on the base plate, and configuring the plurality of pin fins to cool at least one component of the power module.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure.

No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1A:
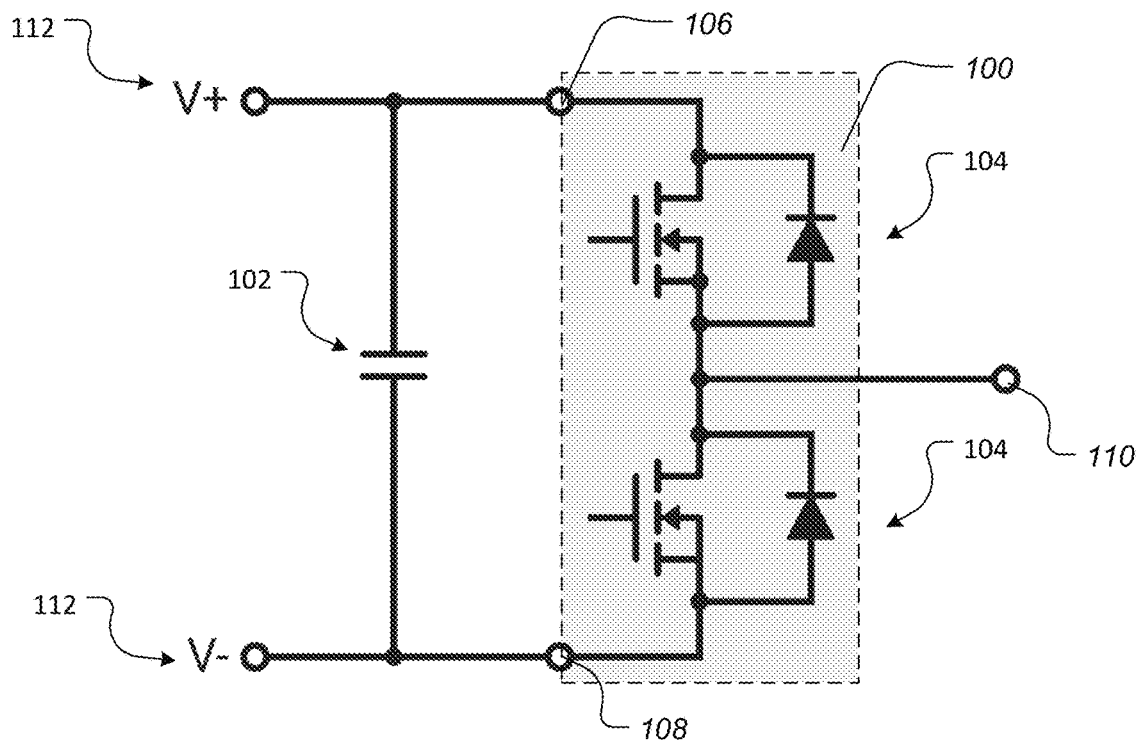
FIG. 1A schematically illustrates a half-bridge based topology of a power module according to aspects of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

This disclosure describes a power module that may include structure optimized for state-of-the-art wide band gap power semiconductor devices such as Gallium Nitride (GaN), Silicon Carbide (SiC), and the like, which are capable of carrying high amounts of currents and voltages and switching at increasingly faster speeds in comparison with established technologies. Conventional power electronic packages are limited in their functionality for these semiconductors, having internal layouts intended for silicon (Si) device technologies.

The disclosed power module may be configured to evenly distribute current between large arrays of paralleled devices with a significantly lower loop inductance than standard packaging approaches. A multi-level current path with terraced power terminals simplify an external connection with a bussing system, reducing inductance between the power module and filtering capacitors. The layout of the power module is highly configurable and may be configured to adopt most power circuit topologies common in the power electronics industry.

The disclosed power module makes significant improvements to the internal module performance, system level implementation, manufacturability, and ease of use through the addition of a tighter power loop and logical external terminal placement.

In this regard, the disclosed power module may be configured to provide at least one or more of the following:

Highly optimized low inductance power module structure.

Modular, scalable, and flexible layout and power flow.

Equalized paralleling of many power semiconductors to form a high current switch position.

Optimized gate and sense signal structure for paralleling of many power semiconductors.

Sense connectors for temperature sensing and over current protection.

Form factor suitable for high voltage operation up to about 1700 V (volts) or more.

Scalable height to exceed 1700 V operation.

Multi-layer internal conductor layout for optimized external system interconnection.

Modular internal structure designed to accommodate a variety of state-of-the-art materials, attaches, isolation and interconnection techniques.

Heavily optimized for high performance system level integration.

Easy to parallel, facilitating a direct scale up to higher currents.

Configurable in a wide variety of power topologies, including half-bridge, full-bridge, three phase, booster, chopper, and like arrangements.

Scalable system implementation to meet a variety of power processing needs.

In essence, the disclosed power module configuration may allow for full utilization of the capabilities of advanced power semiconductors, providing significant improvements to power density, switching, efficiency, and the like.

The power devices of the power module range in structure and purpose. The term 'power device' refers to various forms of transistors and diodes designed for high voltages and currents. The transistors may be controllable switches allowing for unidirectional or bidirectional current flow (depending on device type) while the diodes may allow for current flow in one direction and may not controllable. The transistor types may include but are not limited to Metal Oxide Field Effect Transistor (MOSFET), a Junction Field Effect Transistor (JFET), Bipolar Junction Transistor (BJT), Insulated Gate Bipolar Transistor (IGBT), and the like.

The power devices may include Wide Band Gap (WBG) semiconductors, including Gallium Nitride (GaN), Silicon Carbide (SiC), and the like, and offer numerous advantages over conventional Silicon (Si) as a material for the power devices. Nevertheless, various aspects of the disclosure may utilize Si type power devices and achieve a number of the benefits described herein. The key metrics of the WBG semiconductors may include one or more of the following non-limiting aspects:

Higher voltage blocking.

Higher current density.

Higher temperature operation.

Faster switching.

Improved thermal performance.

Lower on-resistance (reduced conduction losses).

Lower turn-on and turn-off energies (reduced switching losses). It should be appreciated that these above-noted key metrics of the WBG semiconductors are not required and may not be the implemented in some aspects of the disclosure.

To effectively utilize the WBG semiconductor devices, a power module (also referred to as a power package) is employed. The power module may serve a number of functions including one or more of the following non-limiting aspects:

Provides electrical interconnection of power semiconductor devices into useful topologies.

Protects the sensitive devices from moisture, vibration, contamination, and the like Produces an effective and efficient means for the removal of waste heat generated from the devices as a result of conduction and switching losses.

Facilitates system level implementation with robust power and signal electrical connections to the internal layout. The power and signal electrical connections may be bolt-on, crimp-on, solder, plug and receptacle, and the like implementations.

Provides voltage safety with internal dielectric encapsulation and external voltage creepage and clearance distances according to industry adopted standards.

It should be appreciated that these above-noted functions are not required and may not be the implemented in some aspects of the disclosure.

FIG. 1A schematically illustrates a half-bridge based topology of a power module according to aspects of the disclosure. A half-bridge based topology is a fundamental building block in many switching power converters. For motor drives, inverters, and DC-DC converters, these topologies are typically connected to a DC supply 112, with a bank of DC link capacitors 102 as an intermediate connection between them. This is presented schematically in FIG. 1A. The DC link capacitors 102 may act to filter ripple on the line and counter the effects of inductance in the current path. Two half-bridges in parallel may form a full-bridge, while three in parallel may form a three phase topology. The three phase topology is also often referred to as a six pack, signifying the six switch positions among the three phase legs. Moreover, other topologies are contemplated for the power module including common source, common drain, and neutral point clamp.

FIG. 1A further illustrates a power module 100 having one or more switch positions 104. The power module 100 may include a first terminal 106, a second terminal 108, and a third terminal 110.

Figure 1B:
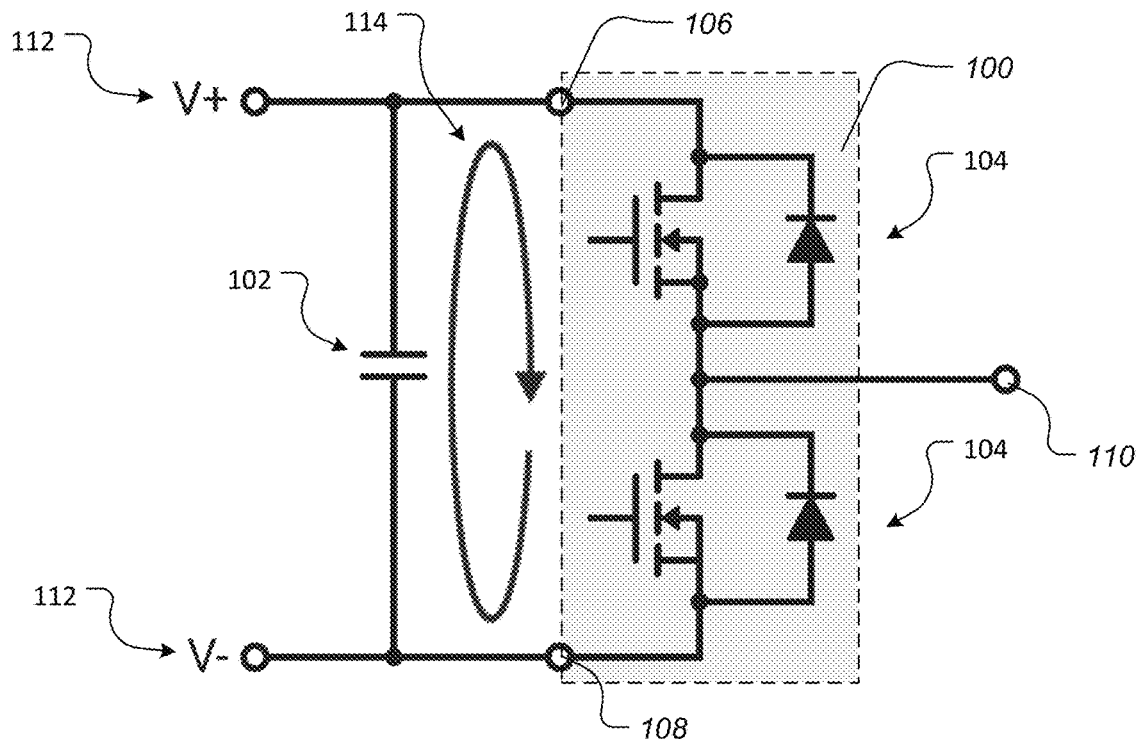
FIG. 1B illustrates a current loop between the DC link capacitors and switch positions inside of the power module of FIG. 1A.

FIG. 1B illustrates a current loop between the DC link capacitors and switch positions inside of the power module of FIG. 1A. The current loop 114 between the DC link capacitors 102 and the switch positions 104 inside of the power module 100 is crucially important in the system, having a significant influence in the switching performance of the semiconductors.

No system is perfect; for example, undesirable parasitic resistances, capacitances, and inductances are present in any electrical system. These impedances introduce detrimental effects on the performance and reliability unless they are reduced or mitigated. While a resistance and capacitance may be associated with each interconnection, the most influential for switching power devices may be the parasitic inductance. Higher inductances result in higher stored energy in the magnetic field, which causes voltage overshoots and ringing during switching transitions.

Figure 2:
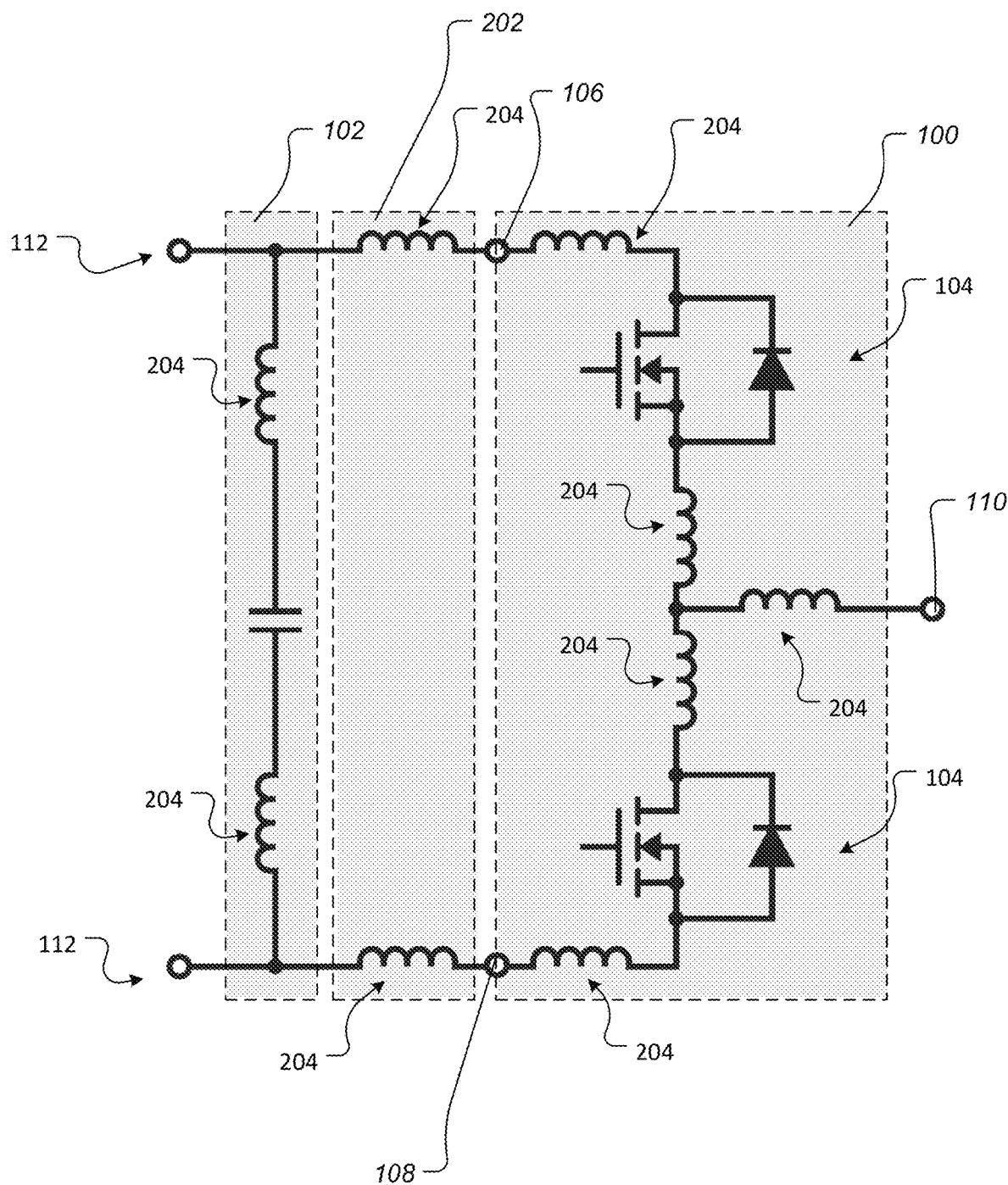
FIG. 2 illustrates various interconnections and associated impedances according to aspects of the disclosure.

FIG. 2 illustrates various interconnections and associated impedances according to aspects of the disclosure. For a power conversion system, such as the half-bridge configuration of the power module 100 presented in FIG. 1A, there are impedances 204 within each component including the DC link capacitors 102, a bussing system 202, and the power module 100, and the like and in the physical interconnections between them. This is depicted in FIG. 2 for the inductance. More functional elements and associated impedances are often present in power converters; however, for switching performance this loop may be the most significant.

In most power converters, these inductances must be carefully accounted for in the system design. Often, this requires adding more DC link capacitors 102 or slowing down the switching speed to counter the parasitic effects. While effective, it results in a bulkier system (more large and heavy capacitors) with higher losses (due to a slower switching event where both high currents and voltages are present).

In power packages intended for Si devices, the turn-on and turn-off times typical of a Si IGBT are inherently slow enough that the inductances encountered in the internal power loop are sufficiently low. However, for extremely fast switching of wide band gap devices, such as SiC MOSFETs, the inductances in conventional packages can result in voltage overshoots of hundreds of volts.

These issues are further amplified due to the need to parallel many SiC devices together to reach high current levels in a power module 100. A paralleled array of power switches and diodes in a variety of combinations (all switches, all diodes, interleaved diodes, edge diodes, etc.) is referred to as a 'position' or 'switch position'. Each switch in the switch position 104 acts together as a single effective switch, increasing the amount of current the circuit can process or reducing the overall loss by lowering the effective resistance.

Figure 3:
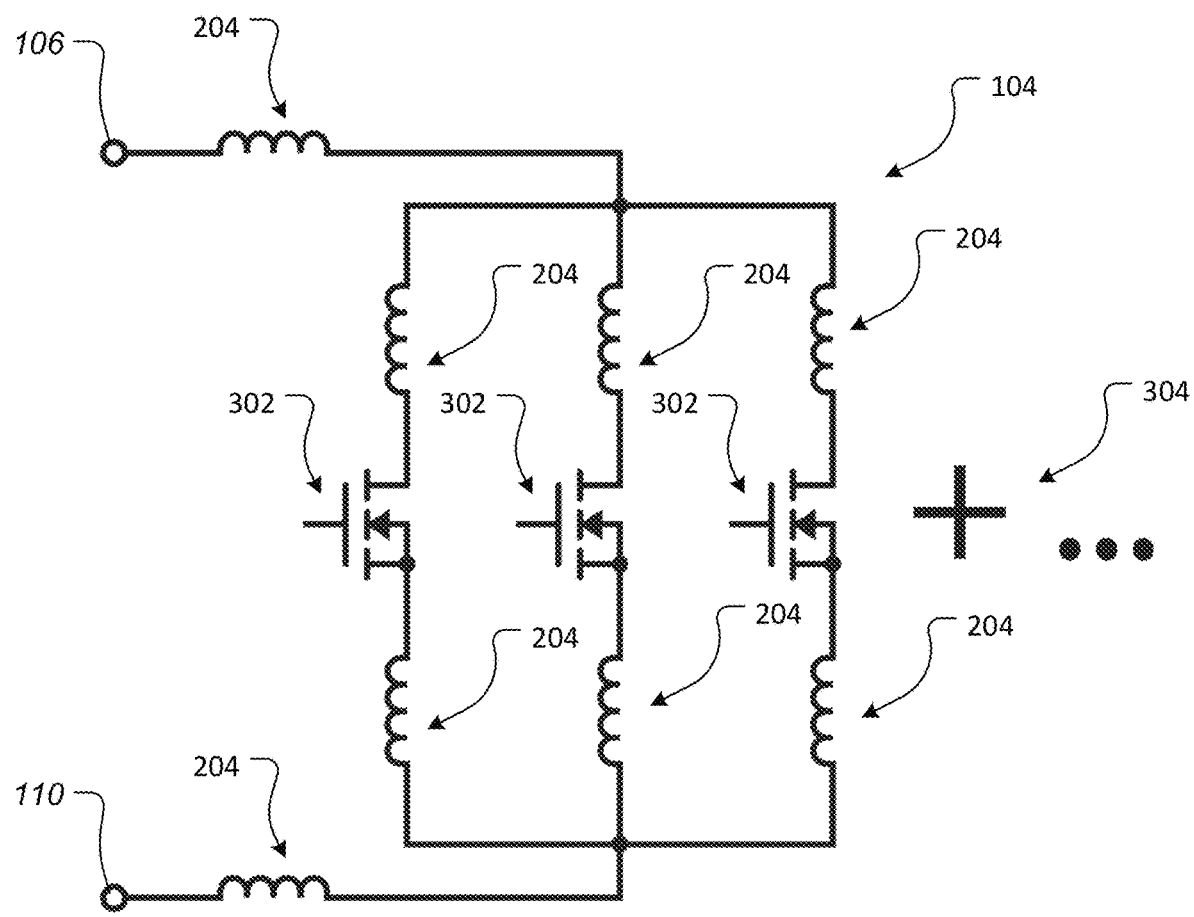
FIG. 3 illustrates various interconnections and associated impedances of a switch position according to aspects of the disclosure.

FIG. 3 illustrates various interconnections and associated impedances of a switch position according to aspects of the disclosure. In a switch position 104, each switch or power device 302 has its own individual current path in the structure. Each interconnection has an associated impedance 204, as illustrated in FIG. 3. As further shown in FIG. 3, the switch position 104 may include any number of power devices 302 as indicated by the symbology shown at arrow 304. Care must be taken to ensure that the effective current paths are equalized between the power devices 302, such that they each see matched inductances. Otherwise, the current and voltages encountered during switching transitions may not be equivalently shared between the power devices 302 across a switch position 104, unevenly stressing the components and increasing switching losses. This is exacerbated by thermal effects—uneven current loading and switching events create uneven heat rise, which results in a drift in semiconductor properties and more instability across a paralleled switch position 104.

Conventional power packages are typically designed for a single Si IGBT, or a small array of these devices (usually 4 or less). Consequently, they are not suitable for paralleling large numbers of SiC MOSFETs and diodes (or similar wide band gap devices) in a manner which results in clean, well-controlled switching.

The disclosed power module 100 provides a solution for the power devices 302, such as wide band gap devices, that may include one or more of the following non-limiting aspects:

Reduces the internal inductance of the power module 100.

Facilitates equalized current paths between paralleled power devices 302 in a switch position 104.

Equally shares heat between power devices 302 across a switch position 104.

Has an external structure that allows for low inductance interconnection with the DC link capacitors 102.

Is capable of safely carrying high currents (hundreds of amps) at high voltages (≥700 V).

It should be appreciated that these above-noted characteristics of the power module 100 are not required and may not be the implemented in some aspects of the disclosure.

Figure 4B:
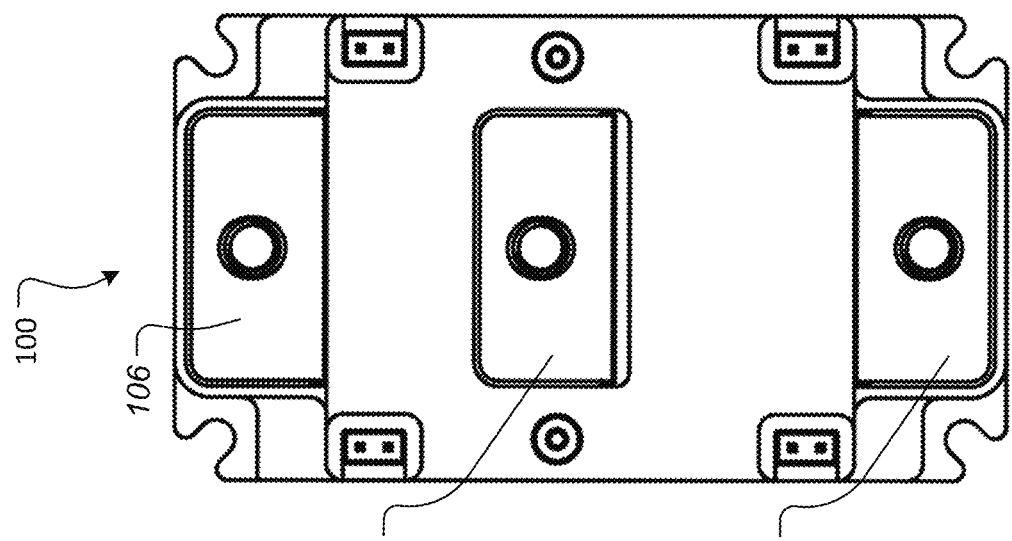
FIG. 4B illustrates a top schematic view of a power module according to an aspect of the disclosure.
Figure 4A:
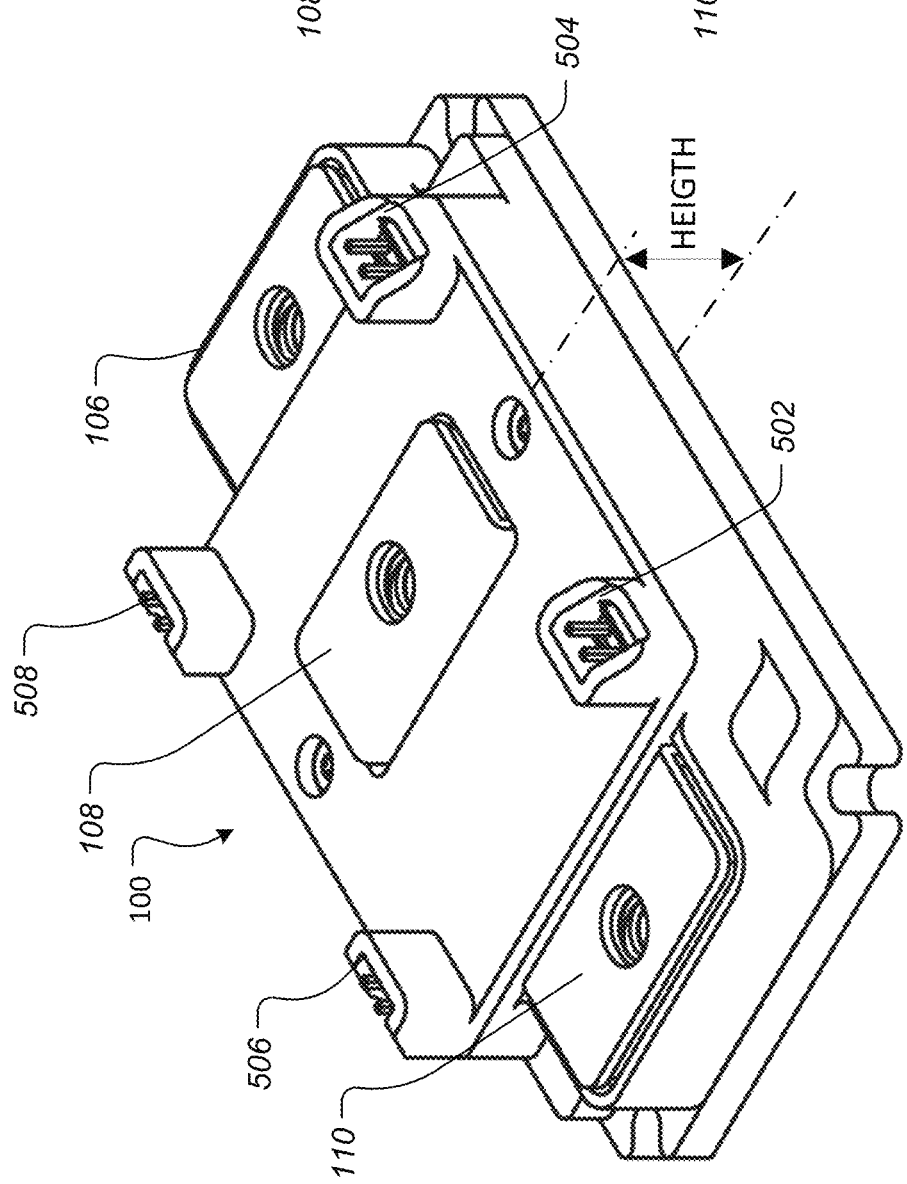
FIG. 4A illustrates a perspective schematic view of a power module according to an aspect of the disclosure.

FIG. 4A illustrates a perspective schematic view of a power module according to an aspect of the disclosure; and FIG. 4B illustrates a top schematic view of a power module according to an aspect of the disclosure. In particular, a half-bridge configuration of the power module 100 is illustrated in FIG. 4A and FIG. 4B. The disclosed power module 100 addresses each of the previously listed concerns with a custom designed power layout and associated structure to facilitate most common bridge topologies with each switch position 104 possessing an equalized, low inductance current path. The terminals 106, 108, 110 may be arranged such that the path to the external filtering DC link capacitors 102 may have a correspondingly low inductance as well, with uncomplicated laminated buss bars requiring no bends or special design features as described in greater detail below.

A power terminal pin-out of a single half-bridge configuration of the power module 100 is depicted in FIG. 4A. The V+ terminal 106 and V− terminal 108 may be placed intentionally close together (with enough space for voltage clearances) to physically minimize the external current loop to the DC link capacitors 102.

The power module 100 may include signal terminals 502, 504, 506, 508. The specific pin-out of the signal terminals 502, 504, 506, 508 may be modular and may be modified as necessary. The configuration is illustrated in FIG. 4A. As shown, there are four pairs of signal pins for the signal terminals 502, 504, 506, 508 for differential signal transfer. Of course, any number of signal pins and any number of signal terminals may be implemented to provide the functionality as described in conjunction with the disclosure. Each switch position 104 may utilize a pair of pins with the terminals 502, 504 for the gate signal and a source kelvin for optimal control. The other pin pairs of the signal terminals 506, 508 may be used for an internal temperature sensor, overcurrent sensing, or for other diagnostic signals. It is contemplated that more pins and/or more signal terminals may also be added to any of the rows if necessary, as long as they do not result in voltage isolation issues. In some aspects, the other diagnostic signals may be generated from diagnostic sensors that may include strain gauges sensing vibration, and the like. The diagnostic sensors can also determine humidity. Moreover, the diagnostic sensors may sense any environmental or device characteristic.

Figure 5:
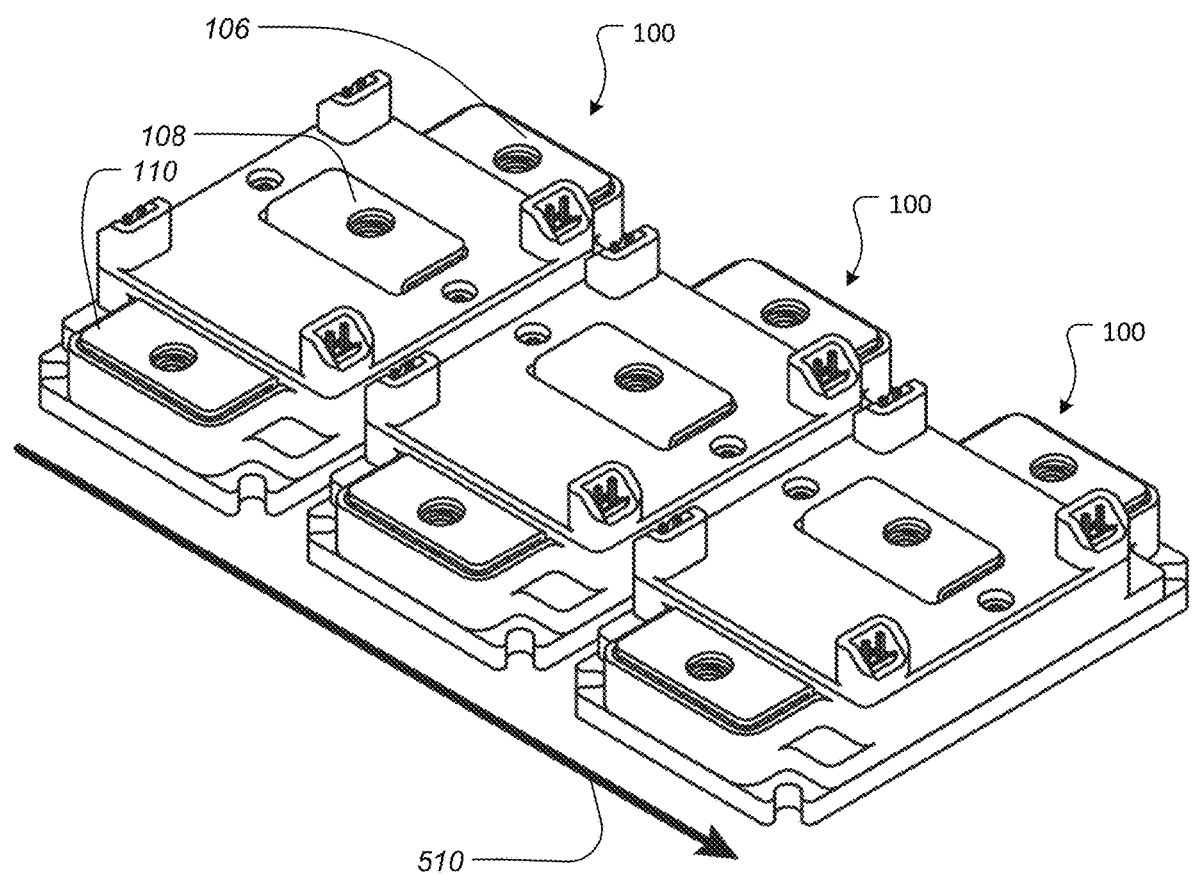
FIG. 5 illustrates a plurality of single phase modules in a paralleled configuration according to aspects of the disclosure.

FIG. 5 illustrates a plurality of single phase modules in a paralleled configuration according to aspects of the disclosure. Modularity is fundamental to the disclosed power module 100. A single phase configuration of the power module 100 may be easily paralleled to reach higher currents. As is illustrated in FIG. 5 there are three power modules 100 illustrated, but there is no limit to how many could be configured in this manner. In this regard, arrow 510 shows that additional power modules 100 may be arranged in parallel. When paralleled, each of the corresponding terminals 106, 108, 110 may be electrically connected between each of the power modules 100.

Figure 6A:
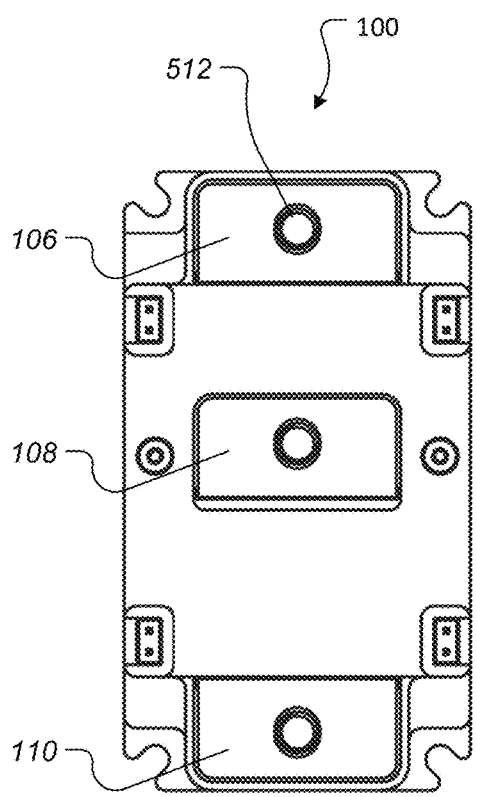
FIG. 6A illustrates a first power module configuration according to aspects of the disclosure.
Figure 6B:
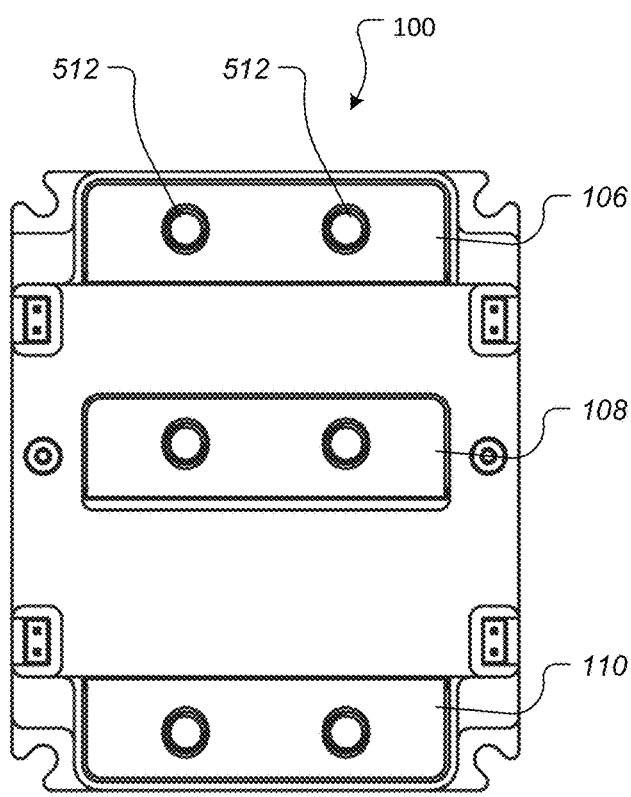
FIG. 6B illustrates a second power module configuration according to aspects of the disclosure.

FIG. 6A illustrates a first power module configuration according to aspects of the disclosure; and FIG. 6B illustrates a second power module configuration according to aspects of the disclosure. Scalability of the disclosed power modules 100 may be another defining feature. This is depicted in FIGS. 6A and 6B. As shown in FIG. 6B, the power module 100 width may be extended to accommodate more paralleled devices for each switch position 104 in comparison to the power module 100 shown in FIG. 6A. Additional fastener holes 512 may be added to the power contacts of the terminals 106, 108, 110 due to the increased current of the power module 100. It is important to note that the power modules 100 may be paralleled as shown in FIG. 5 or may be scaled as shown in FIG. 6B to match most power levels without sacrificing the benefits of this disclosure including, for example, low inductance, clean switching, high power density, and the like.

Figure 7:
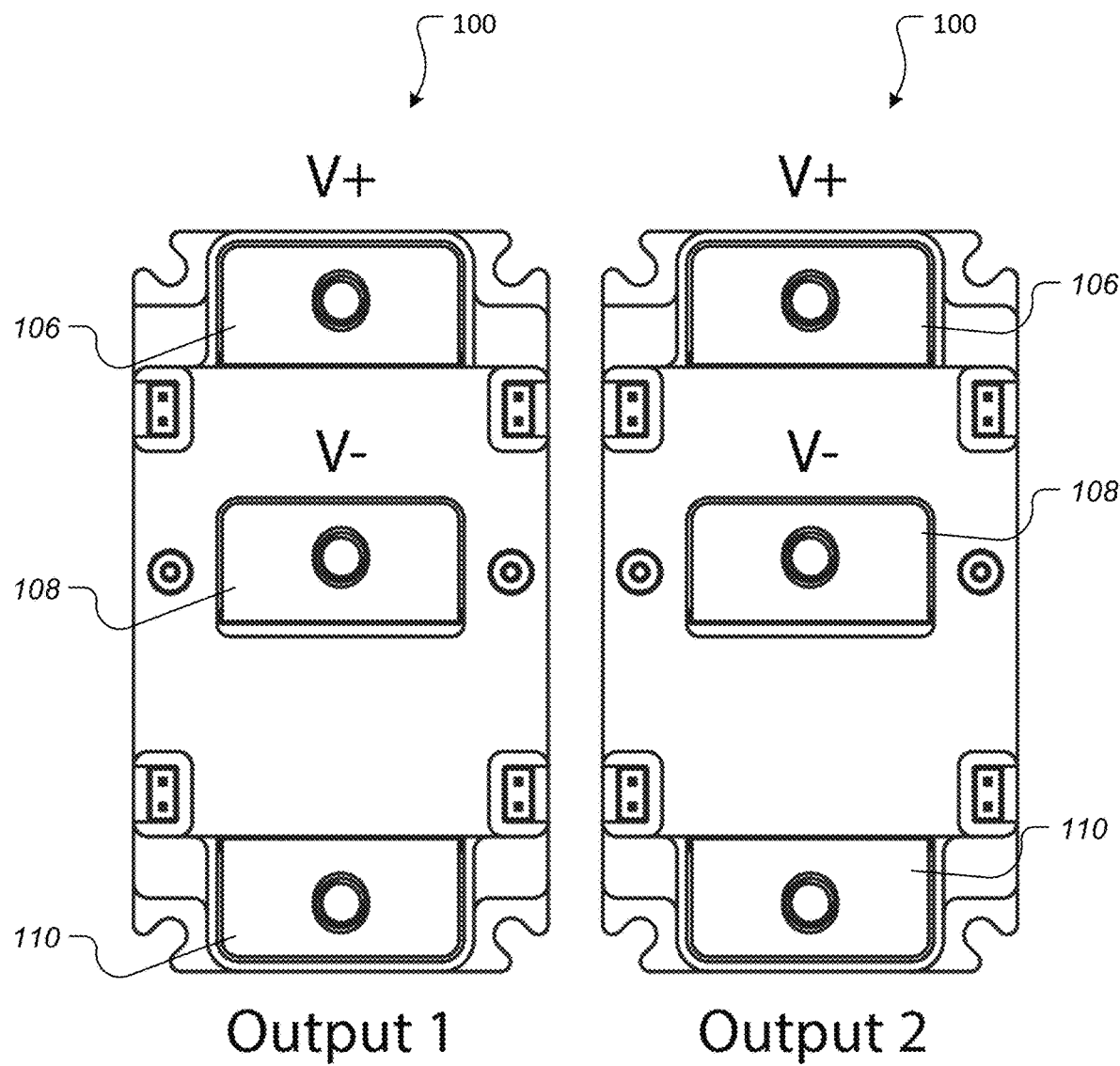
FIG. 7 illustrates a plurality of power modules in a full bridge configuration according to aspects of the disclosure.
Figure 8:
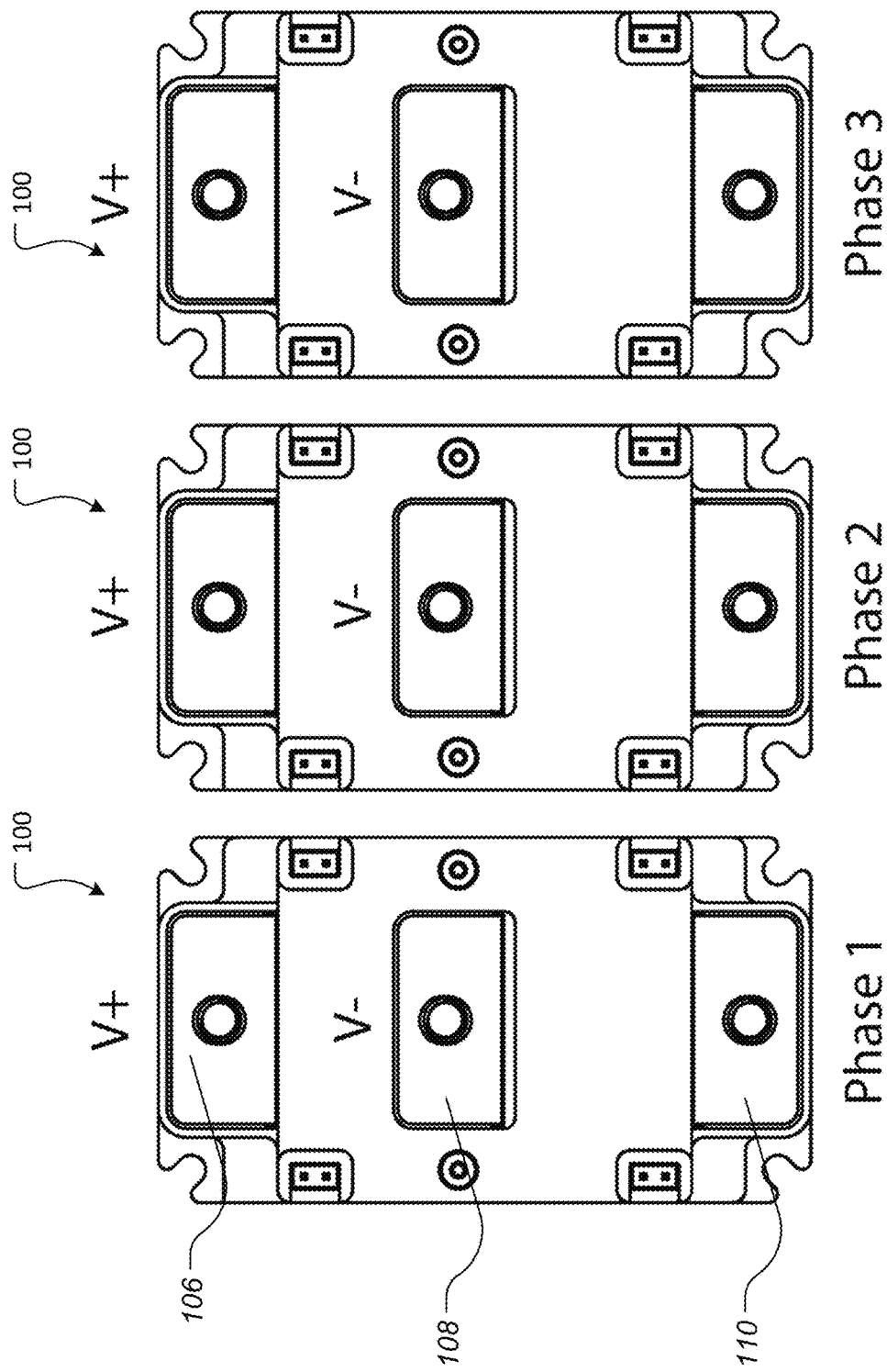
FIG. 8 illustrates a plurality of power modules in a three-phase configuration according to aspects of the disclosure.
Figure 9:
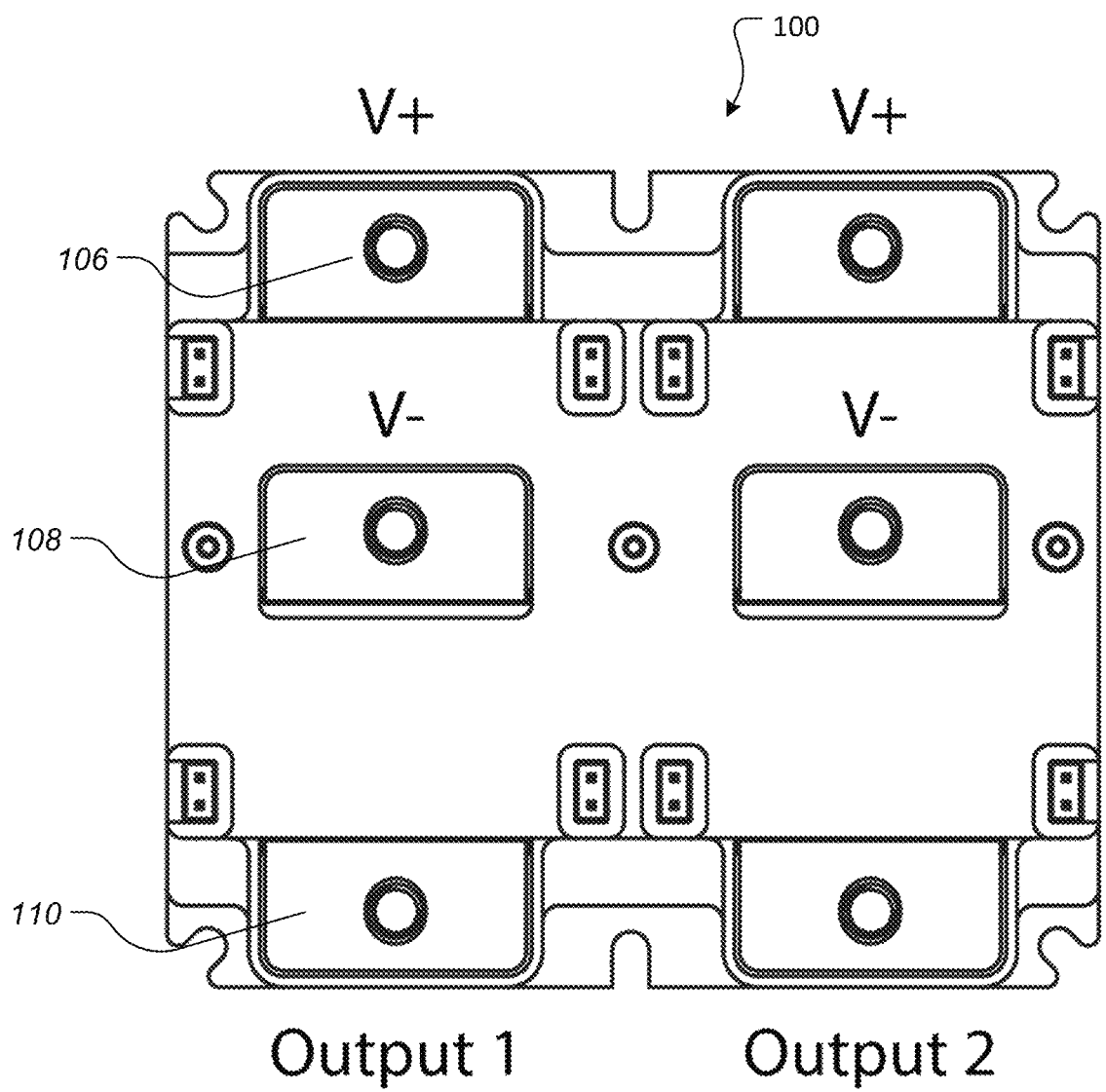
FIG. 9 illustrates a single power module having a full bridge configuration according to aspects of the disclosure.

FIG. 7 illustrates power modules in a full bridge configuration according to aspects of the disclosure; FIG. 8 illustrates a power module in a three-phase configuration according to aspects of the disclosure; and FIG. 9 illustrates a single power module having a full bridge configuration according to aspects of the disclosure. In some aspects, modularity may also be found in the formation of various electrical topologies, such as FIG. 7 for a full-bridge configuration of two power modules 100 and FIG. 8 for a three-phase configuration of three power modules 100. For these topologies, the V+ terminal 106 and V− terminal 108 may be interconnected while the phase output terminals 110 may remain separate. The configuration of FIG. 7 and FIG. 8 may also be placed in a single housing and may be configured with a shared base plate as illustrated in FIG. 9, which may increase power density with the tradeoff of higher unit complexity and cost.

While the various arrangements, configurations, and scaled width version of the power module 100 cover a range of applications and power levels, the core internal components and layouts may remain identical. This reinforces the modular nature of the disclosed power module 100. This structure encompasses a family of modules showcasing a high level of performance while being easy to use and to grow with a range of customer specific systems.

Figure 10:
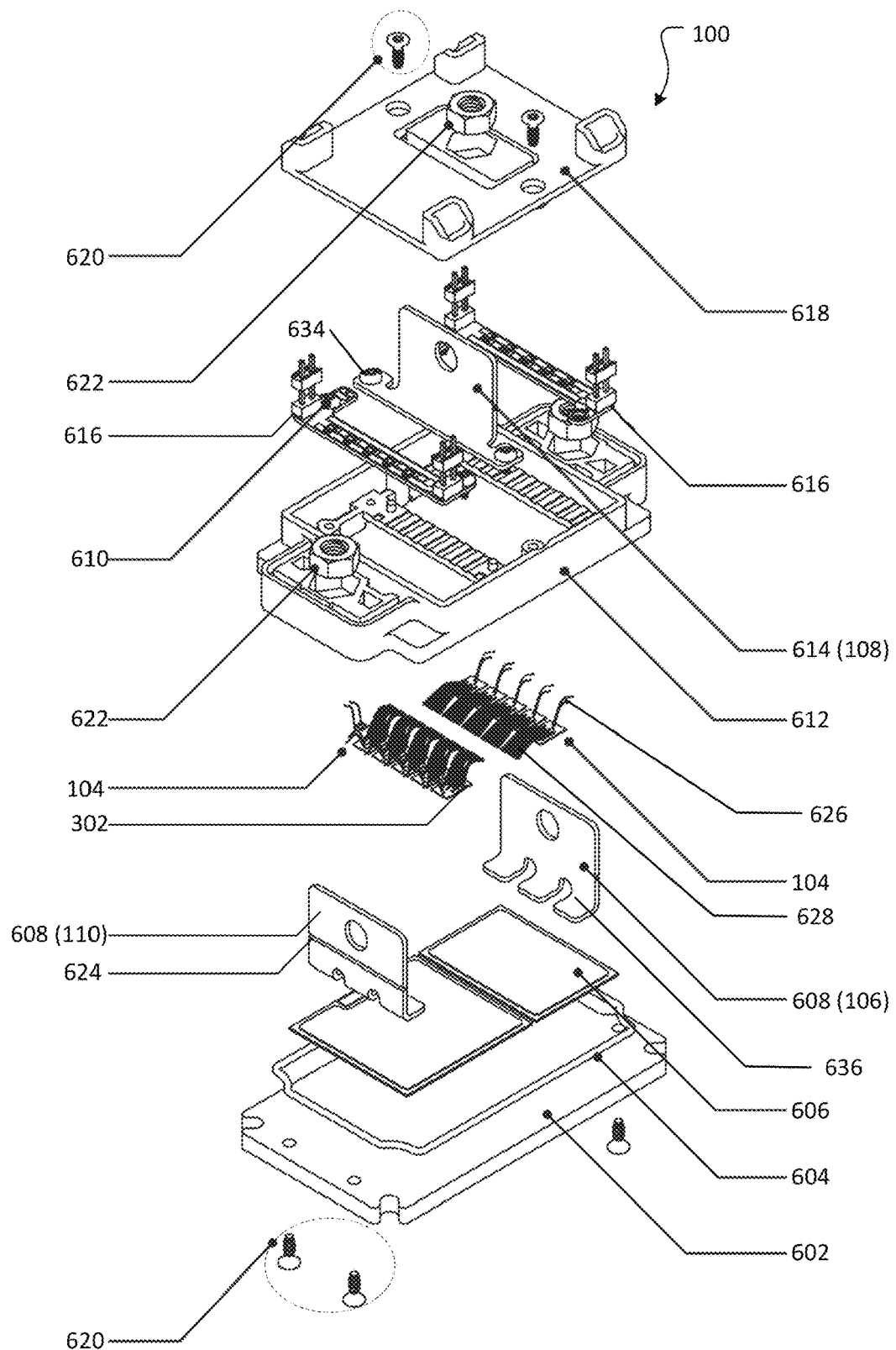
FIG. 10 illustrates an exploded view of the power module according to aspects of the disclosure.
Figure 11:
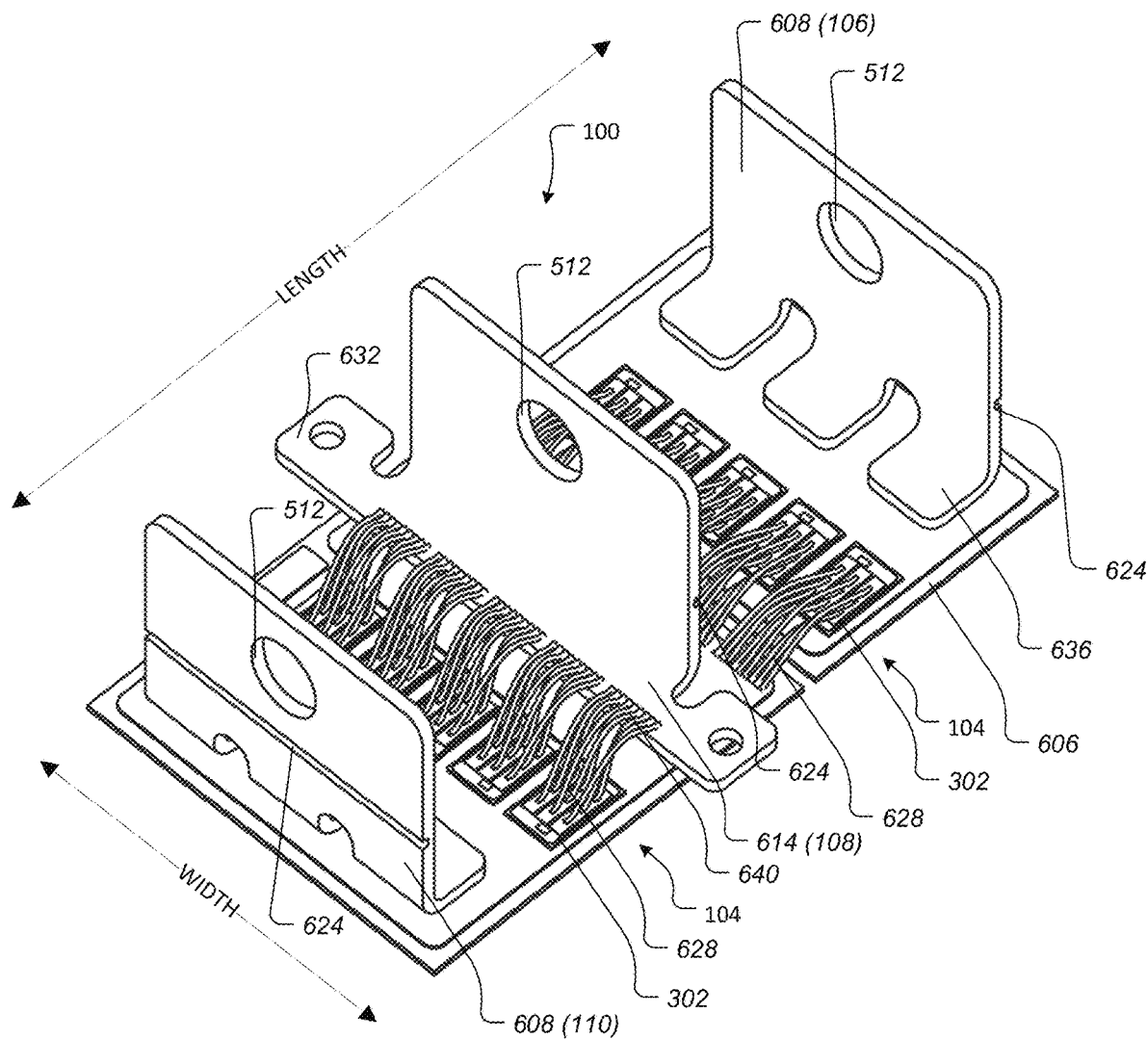
FIG. 11 illustrates a partial view of the power module of FIG. 10.

FIG. 10 illustrates an exploded view of the power module according to aspects of the disclosure; and FIG. 11 illustrates a partial view of the power module of FIG. 10. In particular, FIG. 10 illustrates a number of elements in the power module 100. These elements include one or more of a base plate 602, a gasket 604, one or more power substrates 606, one or more edge power contacts 608, one or more switch positions 104, one or more temperature sensors 610, housing sidewalls 612, a center power contact 614, a signal interconnection assembly 616, a housing lid 618, fasteners 620, captive fasteners 622, and the like. In one aspect, the base plate 602 may include a metal. In one aspect, the metal may include copper. Moreover, it is contemplated that the power module 100 may include fewer or different elements than those described herein.

The power module 100 may include the base plate 602. The base plate 602 may provide structural support to the power module 100 as well as facilitating heat spreading for thermal management of the power module 100. The base plate 602 may include a base metal, such as copper, aluminum, or the like, or a metal matrix composite (MMC) which may provide coefficient of thermal expansion (CTE) matching to reduce thermally generated stress. In one aspect, the MMC material may be a composite of a high conductivity metal such as copper, aluminum, and the like, and either a low CTE metal such as molybdenum, beryllium, tungsten, and/or a nonmetal such as diamond, silicon carbide, beryllium oxide, graphite, embedded pyrolytic graphite, or the like. Depending on the material, the base plate 602 may be formed by machining, casting, stamping, or the like. The base plate 602 may have a metal plating, such as nickel, silver, gold and/or the like, to protect surfaces of the base plate 602 and improve solder-ability. In one aspect, the base plate 602 may have a flat backside. In one aspect, the base plate 602 may have a convex profile to improve planarity after reflow. In one aspect, the base plate 602 may have pin fins 642 for direct cooling as further discussed below with reference to FIGS. 43-59.

The power module 100 may include the gasket 604. The gasket 604 may improve an encapsulation process by providing a liquid tight seal. In this regard, the power module 100 may include dielectric encapsulation within. The gasket 604 may be injection molded, dispensed, or the like, and may be applied in a groove in the housing sidewalls 612 and compressed between the housing sidewalls 612 and the base plate 602.

The power module 100 may include one or more power substrates 606. The one or more power substrates 606 may provide electrical interconnection, voltage isolation, heat transfer, and the like for the power devices 302. The one or more power substrates 606 may be constructed as a direct bond copper (DBC), an active metal braze (AMB), an insulated metal substrate (IMS), or the like. In the case of the IMS structure, the one or more power substrates 606 and the base plate 602 may be integrated as the same element. In some aspects, the one or more power substrates 606 may be attached to the base plate 602 with solder, thermally conductive epoxy, silver sintering or the like. In one aspect there may be two of the power substrates 606, one for each switch position 104.

The power module 100 may include one or more edge power contacts 608. A surface of one of the one or more edge power contacts 608 may form the V+ terminal or first terminal 106. A surface of one of the one or more edge power contacts 608 may form the phase terminal or third terminal 110. The one or more edge power contacts 608 may create a high current path between an external system and the one or more power substrates 606. The one or more edge power contacts 608 may be fabricated from sheet metal through an etching process, a stamping operation, or the like. The one or more edge power contacts 608 may have a partial thickness bend assist line 624 to facilitate bending of the one or more edge power contacts 608 to aid in final assembly. In one aspect, the one or more edge power contacts 608 may be folded over the captive fastener 622. In one aspect, the one or more edge power contacts 608 may be soldered, ultrasonically welded, or the like directly to the power substrate 606. The one or more edge power contacts 608 may have a metal plating, such as nickel, silver, gold, and/or the like to protect the surfaces and improve solder-ability.

In one aspect, a base 636 of the edge power contact 608 may be split into feet to aid in the attach process. The base 636 may have a metal plating, such as nickel, silver, and/or gold to protect the surfaces and improve solder-ability.

The power module 100 may further include one or more switch positions 104. The one or more switch positions 104 may include the power devices 302 that may include any combination of controllable switches and diodes placed in parallel to meet requirements for current, voltage, and efficiency. The power devices 302 may be attached with solder, conductive epoxy, a silver sintering material, or the like. The upper pads on the power devices 302, including the gate and the source, may be wire bonded to their respective locations with power wire bonds 628. The power wire bonds 628 may include aluminum, an aluminum alloy, copper, or the like wires, which may be ultrasonically welded, or the like at both feet, forming a conductive arch between two metal pads. Signal bonds 626 may be formed in a similar manner and may be aluminum, gold, copper, or the like. In some aspects, the diameter of the wire of the power wire bonds at 626 may be smaller than the wire of the power wire bonds 628.

The power module 100 may further include one or more temperature sensors 610. The one or more temperature sensors 610 may be implemented with resistive temperature sensor elements attached directly to the power substrate 606. Other types of temperature sensors are contemplated as well including resistance temperature detectors (RDTs) type sensors, Negative Temperature Coefficient (NTC) type sensors, optical type sensors, thermistors, thermocouples, and the like. The one or more temperature sensors 610 may be attached with solder, conductive epoxy, a silver sintering material, or the like, and then may be wire bonded to the signal interconnection assembly 616. The power module 100 may further include one or more diagnostic sensors that may include strain gauges sensing vibration, and the like. The diagnostic sensors can also determine humidity. Moreover, the diagnostic sensors may sense any environmental or device characteristic.

The power module 100 may further include housing sidewalls 612. The housing sidewalls 612 may be formed of a synthetic material. In one aspect, the housing sidewalls 612 may be an injection molded plastic element. The housing sidewalls 612 may provide electrical insulation, voltage creepage and clearance, structural support, and cavities for holding a voltage and moisture blocking encapsulation. In one aspect, the housing sidewalls 612 may be formed in an injection molding process with reinforced high temperature plastic.

The power module 100 may further include the center power contact 614. A surface of the center contact 614 may form the V− terminal or second terminal 108. The center power contact 614 may create a high current path between an external system and the power devices 302. The center power contact 614 may be fabricated from sheet metal through an etching process, a stamping operation, or the like. The center power contact 614 may be isolated from the underlying power substrate 606 by being embedded in the housing sidewalls 612 (as illustrated) or may be soldered or welded to a secondary power substrate as described below. The center power contact 614 may include one or more apertures 632 as shown in FIG. 11 for receiving a corresponding fastener 634 that fastens the center power contact 614 to the housing sidewalls 612.

The low side switch position power devices 302 may be wire bonded 640 directly from their terminals to the center power contact 614 as illustrated in FIG. 11. The center power contact 614 may have a partial thickness bend assist line 624 to aid in folding at the final assembly stage. The center power contact 614 may have a metal plating, such as nickel, silver, gold, and/or the like to protect the surfaces and improve bond-ability.

The power module 100 may further include the signal interconnection assembly 616. The signal interconnection assembly may be a gate-source board. The signal interconnection assembly 616 may be a small signal circuit board facilitating electrical connection from the signal contacts to the power devices 302. The signal interconnection assembly 616 may allow for gate and source kelvin connection, as well as connection to additional nodes or internal sensing elements. The signal interconnection assembly 616 may allow for individual gate resistors for each of the power devices 302. The signal interconnection assembly 616 may be a printed circuit board, ceramic circuit board, flex circuit board, embedded metal strips, or the like arranged in the housing sidewalls 612. In one aspect, the signal interconnection assembly 616 may include a plurality assemblies. In one aspect, the signal interconnection assembly 616 may include a plurality assemblies, one for each switch position 104.

The power module 100 may further include the housing lid 618. The housing lid 618 may be a synthetic element. In one aspect, the housing lid 618 may be an injection molded plastic element. The housing lid 618 may provide electrical insulation, voltage creepage and clearance, and structural support. In this regard, the housing lid 618 together with the housing sidewalls 612 may form a closed assembly. The closed assembly may prevent the ingress of foreign materials from entering the interior of the power module 100. In one aspect, the housing lid 618 may be formed in an injection molding process with reinforced high temperature plastic.

The power module 100 may further include the fasteners 620. The fasteners 620 may be thread forming screws. Other types of fasteners are contemplated as well. The fasteners 620 may be used to screw directly into the housing sidewalls 612 to fasten down multiple elements in the power module 100. The fasteners 620 may be used for housing lid 618 attachment, signal interconnection assembly 616 attachment, embedding the center power contact 614 (if it is not embedded through another means), for fastening the housing sidewalls 612 to the base plate 602, and the like.

The power module 100 may further include the captive fasteners 622. The captive fasteners 622 may be hex nuts placed in the housing sidewalls 612 and housing lid 618 and may be held captive underneath the edge power contacts 608 and the center power contact 614 after they are folded over. Other types of fasteners or connectors are contemplated to implement the captive fasteners 622. The captive fasteners 622 may facilitate electrical connection to external buss bars or cables. The captive fasteners 622 may be arranged such that when the power module 100 is bolted to buss bars, the captive fasteners 622 and the edge power contacts 608 are pulled upwards into the bussing, forming a better quality electrical connection. If the captive fasteners 622 were affixed to the housing, they could act to pull the bussing down into the power module 100, which could form a poor connection due to the stiffness of the buss bars.

In one aspect, the housing lid 618 may include an aperture having a shape consistent with the external shape of the captive fasteners 622 to prevent the captive fasteners 622 from rotating. A corresponding fastener (shown in FIG. 26) may be received by the captive fasteners 622. The corresponding fastener extending through a fastener hole 512 in the center power contact 614 to facilitate electrical connection to external buss bars or cables.

In one aspect, the housing sidewalls 612 may include an aperture having a shape consistent with the external shape of the captive fasteners 622 to prevent the captive fasteners 622 from rotating. A corresponding fastener (shown in FIG. 26) may be received by the captive fasteners 622. The corresponding fastener extending through a fastener hole 512 in the one or more edge power contacts 608 to facilitate electrical connection to external buss bars or cables.

To achieve a low internal inductance, current paths of the power module 100 may be wide, short in length, and overlap whenever possible to achieve flux cancellation. Flux cancellation occurs when the current traveling through the loop moves in opposing directions in close proximity, effectively counteracting their associated magnetic fields. A principal benefit of this module approach is that the entire width of the footprint is utilized for conduction. Module height may be minimized to reduce a length the current must travel through the structure.

The power loop for a half-bridge phase leg is illustrated in FIG. 11, with the edge power contacts 608 and center power contact 614 folded up to show detail. The wide, low profile edge power contact 608 and center power contact 614 brings in the current directly to the power devices 302. The effective current path from the terminal surfaces to individual power devices 302 may be functionally equivalent. Additionally, the power devices 302 may be placed in close proximity, minimizing imbalances in their relative loop inductances and ensuring excellent thermal coupling.

Figures 12A, 12B:
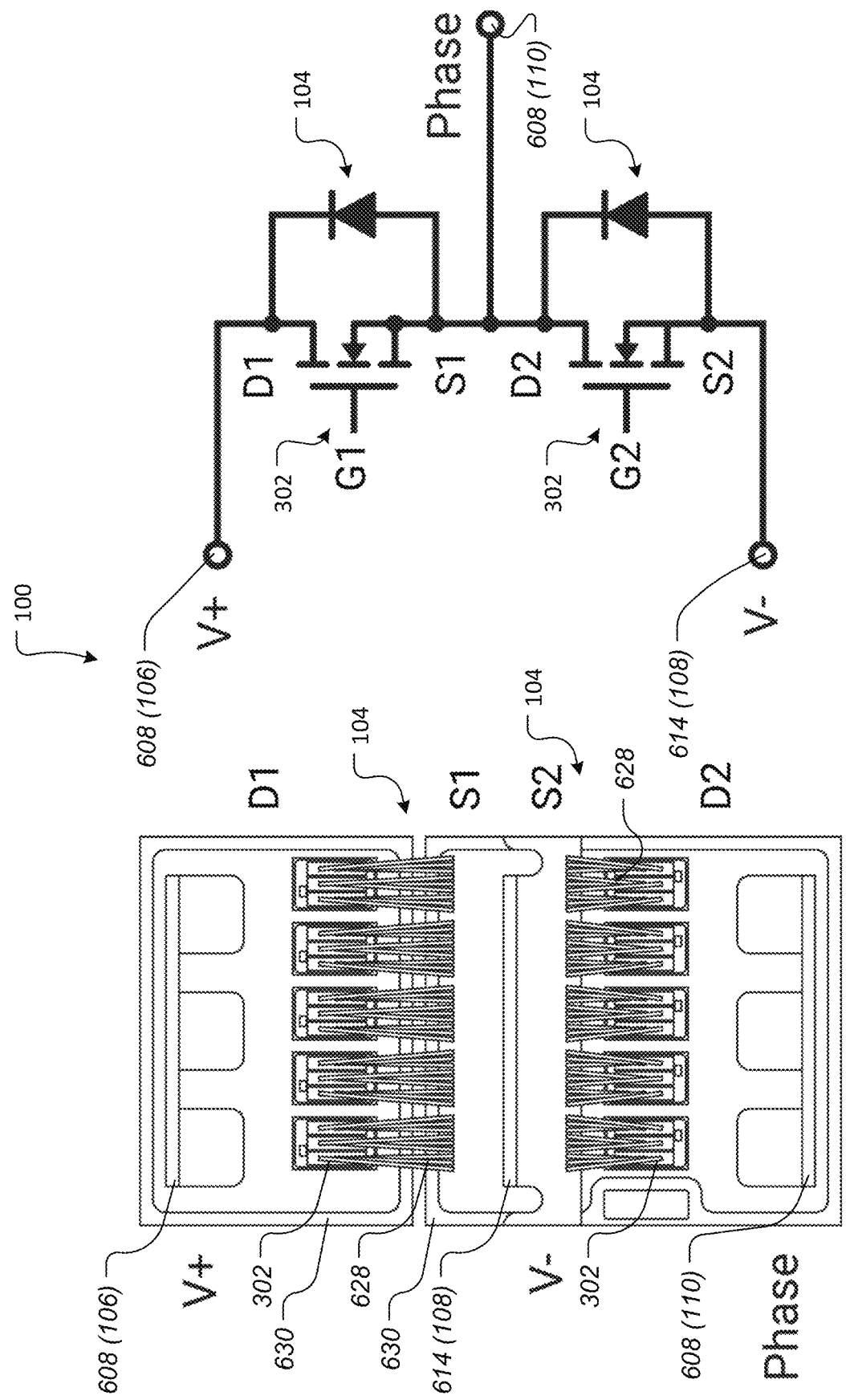
FIG. 12A illustrates a top view of the phase leg of the power module constructed according to the disclosure, with each node identified in a half-bridge topology.
FIG. 12B illustrates a schematic of the phase leg of the power module constructed according to the disclosure, with each node identified in a half-bridge topology according to FIG. 12A.

FIG. 12A illustrates a top view of the phase leg of the power module constructed according to the disclosure, with each node identified in a half-bridge topology; and FIG. 12B illustrates a schematic of the phase leg of the power module constructed according to the disclosure, with each node identified in a half-bridge topology according to FIG. 12A. The power module 100 may include one or more diodes. In one aspect, the diode in the schematic may be a discrete diode placed in antiparallel (not illustrated). In one aspect, the diode in the schematic may be a representation of the body diode of the power device 302 implemented as a MOSFET (as illustrated).

In one aspect, the current path may begin at the V+ node terminal 608, which may be attached to the power substrate 630 and drains D1 of the upper one of the power devices 302. The sources S1 of the upper one of the power devices 302 may then wire bonded 628 to a lower power substrate pad 630, which is attached to the drains D2 of the low side power devices 302, as well as the phase power terminal 608. Finally, the sources S2 of the low side power devices 302 may be wire bonded 628 to the V− power contact terminal 614, which may be above the lower power substrate 630 providing some overlap and may be sufficiently voltage isolated from the underlying power substrate 630.

Figure 13:
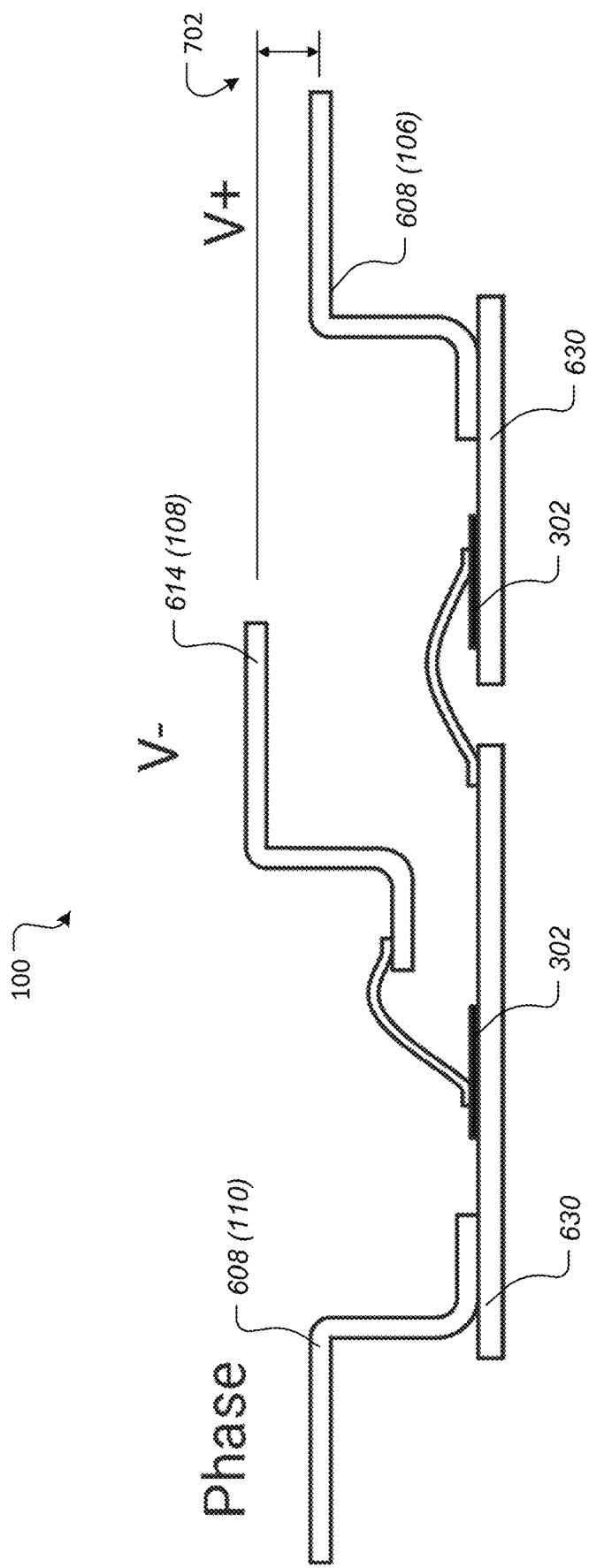
FIG. 13 illustrates a cross section view of the phase leg of FIG. 12A and FIG. 12B.
Figure 14:
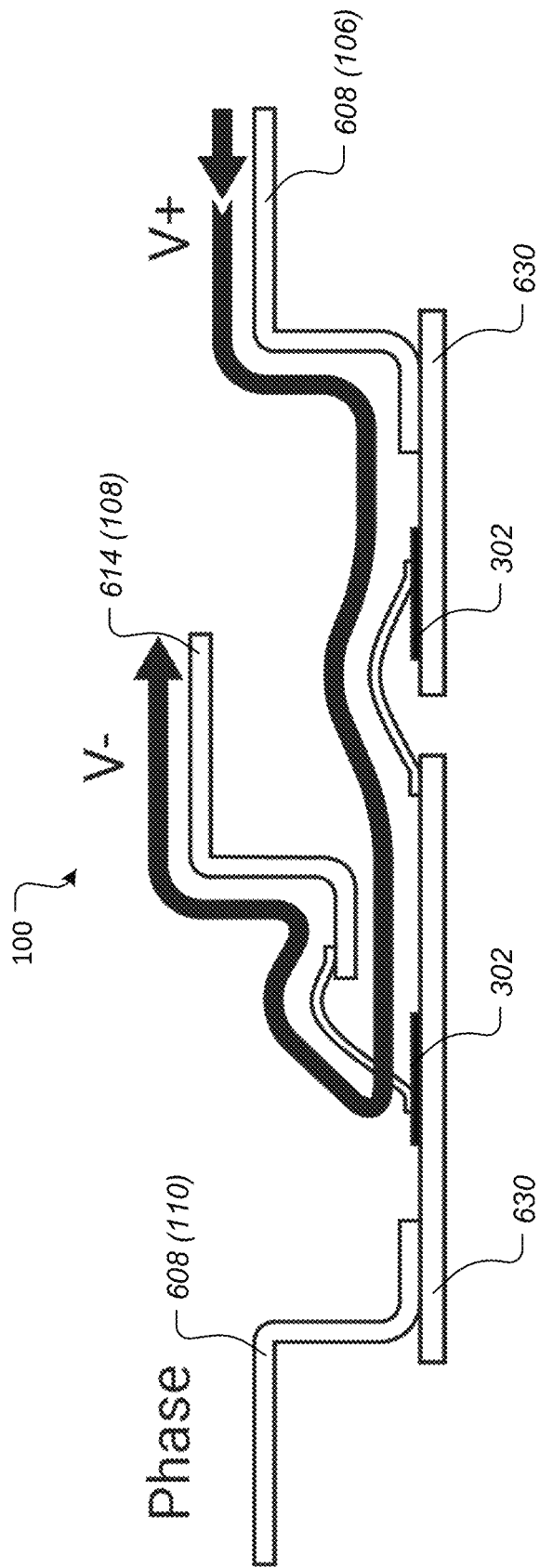
FIG. 14 illustrates a cross section view of the phase leg of FIG. 12A and FIG. 12B that includes a current path.

FIG. 13 illustrates a cross section view of the phase leg of FIG. 12A and FIG. 12B; and FIG. 14 illustrates a cross section view of the phase leg of FIG. 12A and FIG. 12B that includes a current path. As shown in FIG. 13, tabs of the power contacts or terminals 106, 108, 110 are folded over as they are in the final configuration of the power module 100 structure. Layer thicknesses are exaggerated to show detail. All elements in this figure can be considered to be conductors when visualizing current flow.

FIG. 13 further illustrates the terraced, multiple height, or multiple elevation configuration of the power module 100. In this regard, a vertical position of the terminal 614 is shown higher than the vertical position of the terminal 608. The height difference is indicated by arrow 702. This multiple height configuration may provide the critical loop described in greater detail below. Moreover, the multiple height configuration may assist in providing a buss connection, which is further described below as well.

FIG. 14 presents an overlay of the current path from the V+ terminal to the V− terminal, representing the critical loop for clean switching according to aspects of the disclosure. Inductance is proportional to a path length, lessens with increased cross-sectional area of the conductors, and is reduced with flux cancellation in the magnetic field. The identified path starts at terminal 608 and flows through the power substrate 630 across the power devices 302 on to a second substrate 630 through power device 302 and output by the terminal 614. The identified path is low inductance, owing to the following factors:

Low height of the module.
Close proximity of the power device 302 to the terminals 608, 614.
Tight packing of all functional elements.
Wide cross-sectional area of the conductors.
Optimized paralleled wire bonds 628 for each power device 302.
Even current sharing between the power devices 302.

Flux cancellation when the current direction reverses in the low side switch position.

Flux cancellation in the external V+/V− buss bars.

Figure 15:
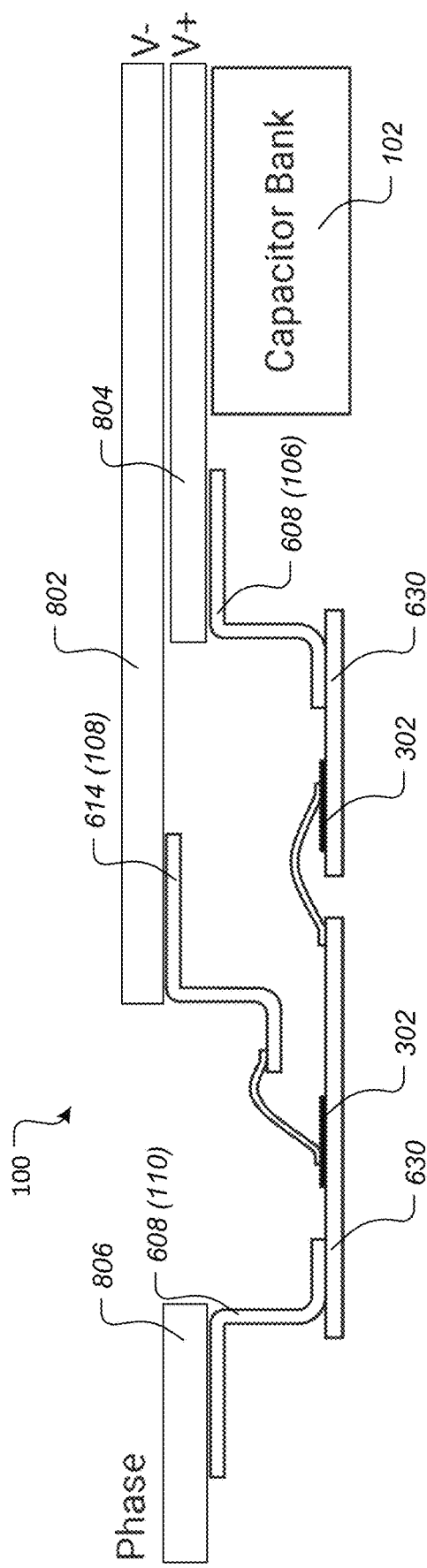
FIG. 15 illustrates contact surfaces of the power module together with bussing according to an aspect of the disclosure.

FIG. 15 illustrates contact surfaces of the power module together with bussing according to an aspect of the disclosure. The contact surfaces of the V+ terminal 608 and phase terminal 608 may be planar, while the top of the V− terminal 614 is offset from the others. This feature allows for the external V+/V− laminated bussing 802, 804 to contact both terminals 608, 614, without requiring a bend in the laminated bussing 802, 804, as illustrated in FIG. 15. The offset distance 702 (illustrated in FIG. 13) may be adjusted to match the thickness of the buss bar metal and an associated dielectric isolation film.

The low internal module inductance combined with the minimized external inductance in the bussing 802, 804, 806 to the DC link capacitors 102 bank results in an optimized structure of the power module 100 for clean, rapid switching events with low voltage overshoot and stable performance. Less loop inductance results in a reduced total capacitance required on the DC link capacitors 102.

These benefits, altogether, allow for lower switching losses, higher switching frequencies, improved controllability, and reduced EMI. Ultimately, this helps system designers achieve more power dense and robust power conversion systems.

Figure 16:
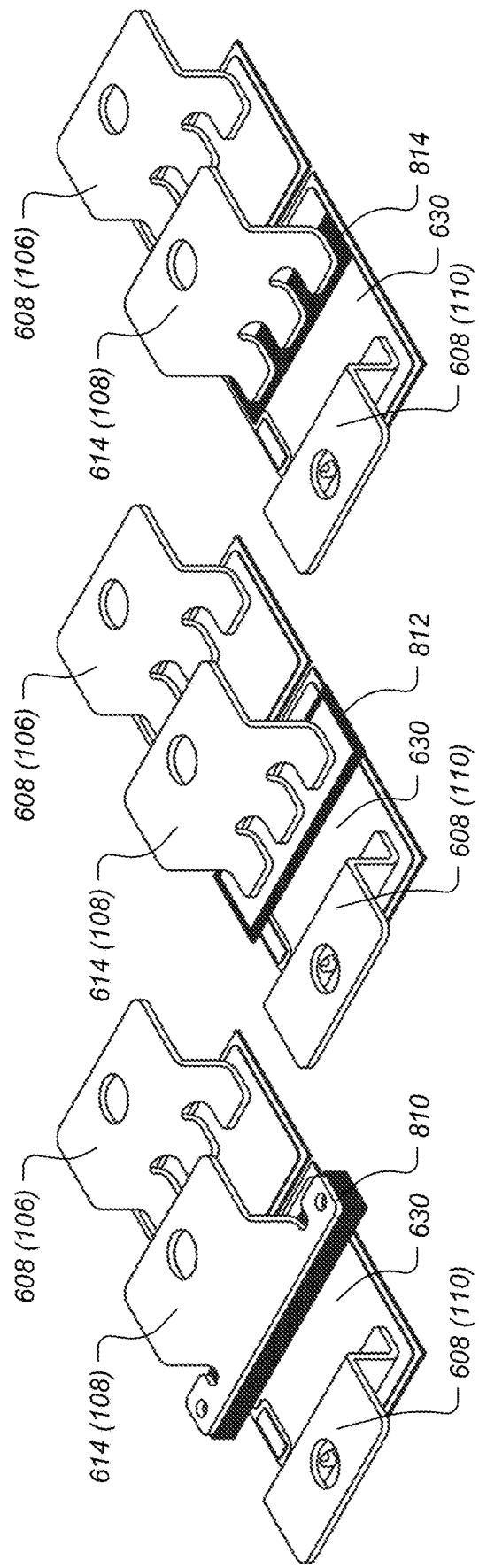
FIGS. 16A, 16B, and 16C illustrate various aspects of a terminal of the power module according to aspects of the disclosure.

FIGS. 16A, 16B, and 16C illustrate various aspects of a terminal of the power module according to aspects of the disclosure. A multilayer layout where the V− terminal 614 is in the middle of the power module 100 may be essential to this design. Suitable voltage isolation of this terminal 614, which lays directly over an output trace on the power substrate 630, may be realized through a variety of constructions that form an isolation structure. This power module 100 design is compatible with each of the following:

FIG. 16A illustrates one aspect of the isolation of the V− terminal 614. In this aspect, the power module 100 may include an embedded isolation 810 of the V− terminal 614. The embedded isolation 810 may be formed with a plastic or other synthetic material. The embedded isolation 810 may be located in the housing sidewalls 612 as a strip 810 bridging a center region. In one aspect, the strip 810 may be formed of plastic. The power contact 614 may be embedded in the strip 810 through a number of methods, including mechanical fastening such as with a thread forming screw, direct integration such as through a plastic over-molding process, riveted in place with a plastic heat staking operation, or the like.

FIG. 16B illustrates another aspect of the isolation of the V− terminal 614. In this aspect, the power module 100 may form the isolation of the V− terminal 614 by a power substrate isolation. In this regard, a secondary power substrate 812 may be utilized to provide the isolation through its layer of dielectric material, such as a ceramic or the like. This secondary power substrate 812 made be soldered, sintered, or epoxied to the power substrate 630, while the power contact 614 may be soldered or welded to the upper metal pad on the secondary substrate. A benefit of this approach is the improved heat transfer of the center power contact 614, as the secondary power substrate 812 is highly conductive and would facilitate heat removal from the power contact 614 to a cold plate or heat sink.

FIG. 16C illustrates another aspect of the isolation of the V− terminal 614. In this regard, a thick film isolation 814 may be utilized. The thick film isolation 814 may utilize a printed thick film dielectric directly on the power substrate 630 and may provide voltage blocking. The center contact 614 may be attached to the thick film isolation 814 through an epoxy, directly soldered to a thin layer of metal thick film printed on top of the dielectric film, or the like.

In other aspects, the isolation of the V− terminal 614 may include suspension isolation (not shown). In this aspect, the central power contact 614 may be suspended a sufficient distance over the power substrate 630 and attached to the housing sidewalls 612 in a similar manner to the embedded approach. In this regard, gel encapsulation filling the power module 100 may provide dielectric isolation. The center contact 614 may need to utilize a high stiffness material, however, to not hinder the formation of power wire bonds 628 between the low side devices and the contact.

Figure 17:
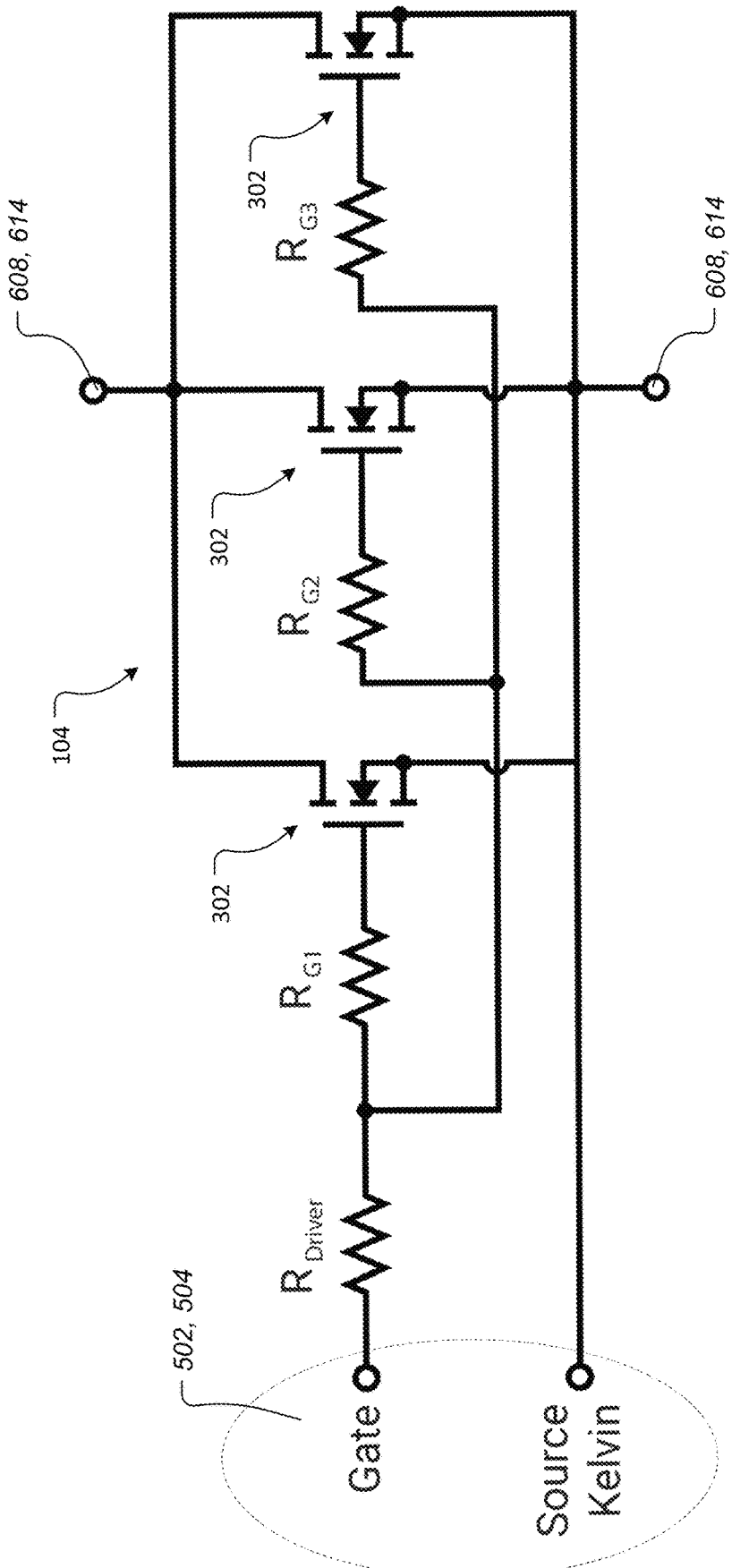
FIG. 17 schematically illustrates a plurality of devices in parallel according to aspects of the disclosure.

FIG. 17 schematically illustrates a plurality of devices in parallel according to aspects of the disclosure. In particular, FIG. 17 shows three power devices 302. This is merely exemplary and for ease of illustration and understanding. The power module 100 of the disclosure may include any number of power devices 302.

The gate control and sense signals factor prominently into switching performance of the power module 100 and may be of particular importance in a paralleled switch position 104. The signal loops may be optimized in the power module 100 for high performance, robustness, and uniform current sharing. Similar to the power loops, the paths may be configured to be limited in length, wide in cross section, and the associated external components may be placed as physically close as possible to the signal terminals 502, 504.

For a paralleled array of power devices 302 such as transistors, particularly MOSFETs, the timing and magnitude of the gate currents must be balanced to result in consistent turn-on and turn-off conditions. The power module 100 may utilize individual ballasting resistors $R_{G1}$, $R_{G2}$, $R_{G3}$ that may be placed in close proximity to the gate of the power devices 302, only separated by the gate wire bond. These components are of a low resistance and aid in buffering a current flowing to each individual power device 302. These components act to decouple the gates of the power devices 302, preventing oscillations and helping to ensure an equalized turn on signal for the paralleled power devices 302. A singular external resistor RDRIVER may be utilized and connected to these paralleled resistors $R_{G1}$, $R_{G2}$, $R_{G3}$ for controlling the turn on speed of the effective switch position 104.

The gate resistors $R_{G1}$, $R_{G2}$, $R_{G3}$ may be a surface mount package, an integrated thick film layer, printed thick film, a wire bondable chip, or the like depending on the application.

Figure 18:
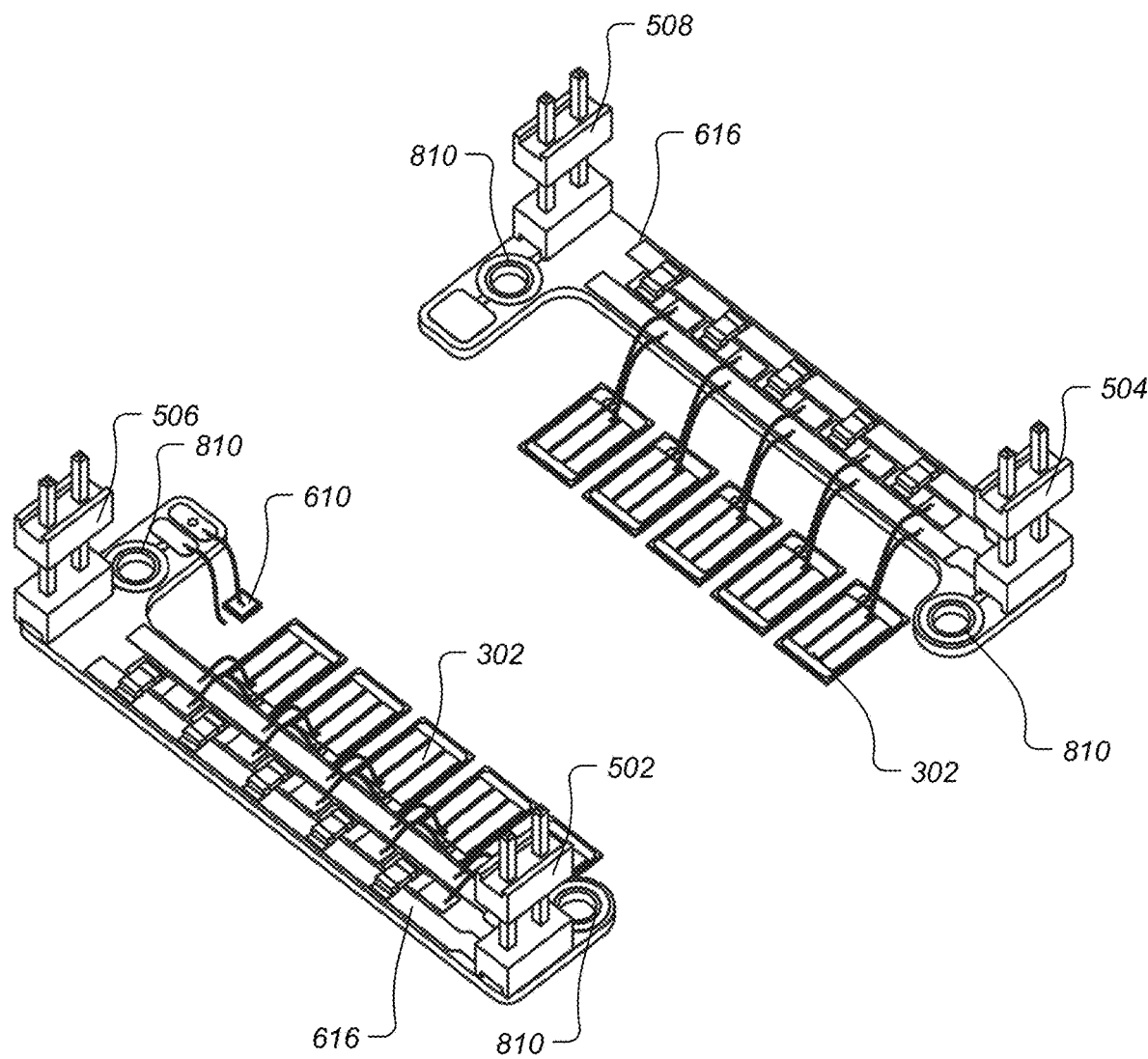
FIG. 18 illustrates a perspective view of the effective gate switching loop according to an aspect of the disclosure.
Figure 19:
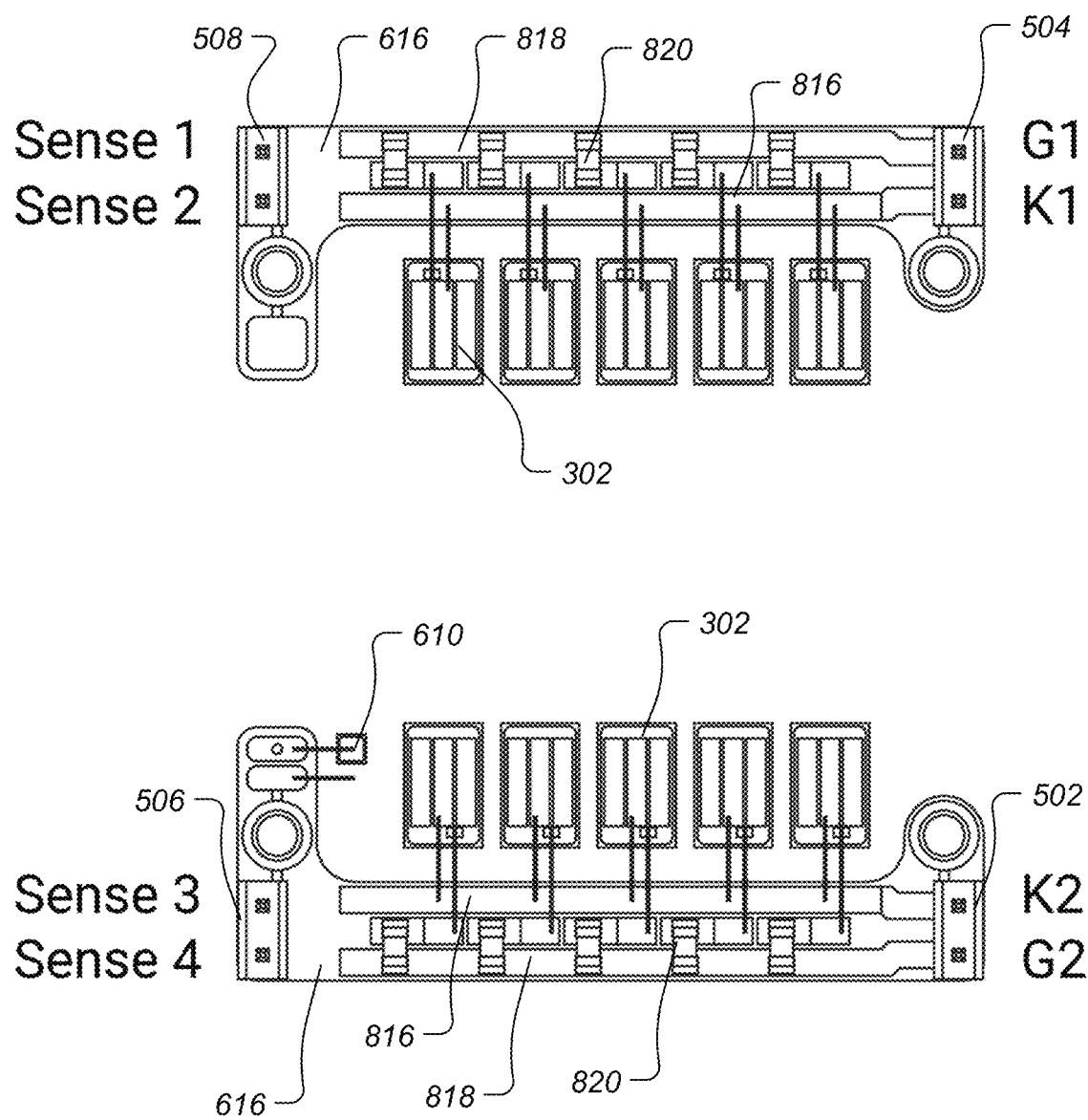
FIG. 19 illustrates a top view of the effective gate switching loop according to an aspect of the disclosure.

FIG. 18 illustrates a perspective view of the effective gate switching loop according to an aspect of the disclosure; and FIG. 19 illustrates a top view of the effective gate switching loop according to an aspect of the disclosure. The signal substrate or signal interconnection assembly 616 may have rails 816, 818 connecting to the gate and source kelvin connector terminals 502, 504 on the edge of the board of the signal interconnection assembly 616. The upper rail 818 may connect to gate wire bond pads through individual gate resistors 820, while the lower rail 816 may directly wire bond to the source pad of the power device 302. This may be considered a true kelvin connection, as the source kelvin bond is not in the current path of the power source bonds. A kelvin connection may be important for clean and efficient control, reducing the influence of the high drain to source current on the signal loop.

FIG. 18 and FIG. 19 further illustrate optional signal connections 506, 508 on the left hand side of the signal interconnection assembly 616. These connections may be used for temperature measurement or other forms of internal sensing. In some aspects, the internal sensing may include diagnostic sensing that includes diagnostic signals that may be generated from diagnostic sensors that may include strain gauges sensing vibration, sensors sensing humidity, and the like. Moreover, the diagnostic sensors may sense any environmental or device characteristic. In one aspect, the temperature sensor 610 may be placed on the low side position. Of course, other locations and arrangements for the temperature sensor 610 are contemplated as well. In one aspect, a wire bond may be placed on the upper pad next to the drain trace (e.g., next to a power device 302) for overcurrent measurement (also referred to as desaturation protection in the case of IGBTs). Of course, other locations and arrangements for overcurrent measurement are contemplated as well. In some aspects, an overcurrent sensor or desaturation sensor may sense the voltage drop as determined by connections to the drain of the power devices 302. In some aspects, current can also be sensed by voltage drop across the power devices 302.

This implementation of this signal loop or the signal interconnection assembly 616 may ensure quality control and measurements across any combination of paralleled power devices 302 in the switch position 104. Standard PCB board-to-board connectors may allow for a straightforward connection to external gate driver and control circuitry.

This gate distribution network, as shown, may be implemented with a PCB. It may also be formed as a thick film circuit directly on the primary power substrate 630, directly on the base plate 602, or the like. This has the benefit of reducing the part count of the power module 100 as well as the option to print the gate resistors 820. The gate resistors 820 may be much smaller than the size of the surface mount parts on a PCB, as there may be no need for solder terminals and the gate resistors 820 may be actively cooled from the cold plate, minimizing thermal sizing constraints of the component.

Figure 20:
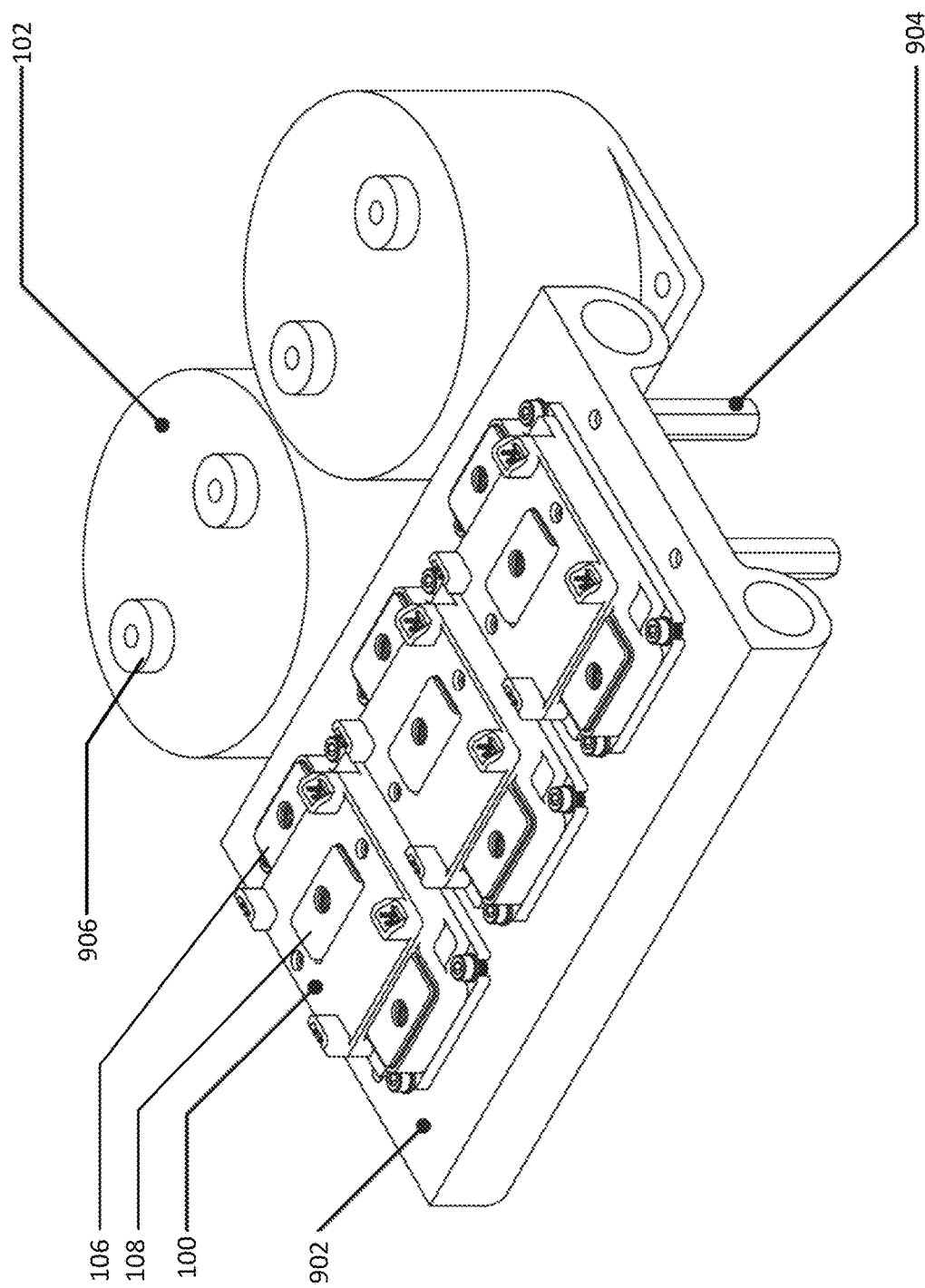
FIG. 20 illustrates a partial exemplary implementation that includes a power module according to aspects of the disclosure.

FIG. 20 illustrates a partial exemplary implementation that includes a power module according to aspects of the disclosure. In this regard, FIG. 20 is a representative exemplary structure implementing the power module 100 of the disclosure in a high performance system. This general approach applies to many other configurations and topologies, serving as a useful example of how to utilize the power module 100 in a converter. This specific example is for a three phase motor drive. In this aspect, there are three power modules 100.

The disclosed power modules 100 may be configured in an array of half-bridge phase legs (three, as illustrated). Additional power modules 100 may be included in parallel to increase the current as needed for the application.

The FIG. 20 implementation may further include a cold plate 902. The cold plate 902 may be high performance liquid cold plate, heat sink, or the like, serving to transfer waste heat away from the power modules 100 to another source (liquid, air, etc.).

The FIG. 20 implementation may further include the DC link capacitors 102. The DC link capacitors 102 may be implemented as filtering capacitors interfacing a source of DC power and the power module 100. In one aspect, the DC link capacitors 102 may be implemented as a single capacitor. In another aspect, the DC link capacitors 102 may be implemented as multiple components forming a 'bank' of capacitors, depending on the power demands of the load and/or the particular application.

The FIG. 20 implementation may further include cold plate standoffs 904. The cold plate standoffs 904 may provide structural support to the cold plate 902. The cold plate standoffs 904 may be configured as shown, elevating and placing the power module 100 terminals 106, 108 in-plane with capacitor contacts 906. In this aspect, flat buss bars with no bends can interconnect the components. For higher power density or for different types of capacitors, the height of the cold plate standoffs 904 may be adjusted to best utilize the form factor available for the elements of the converter. This may have a corresponding tradeoff of increasing the electrical loop length as transition bends could be necessary, and will depend on system specific requirements.

Figure 21:
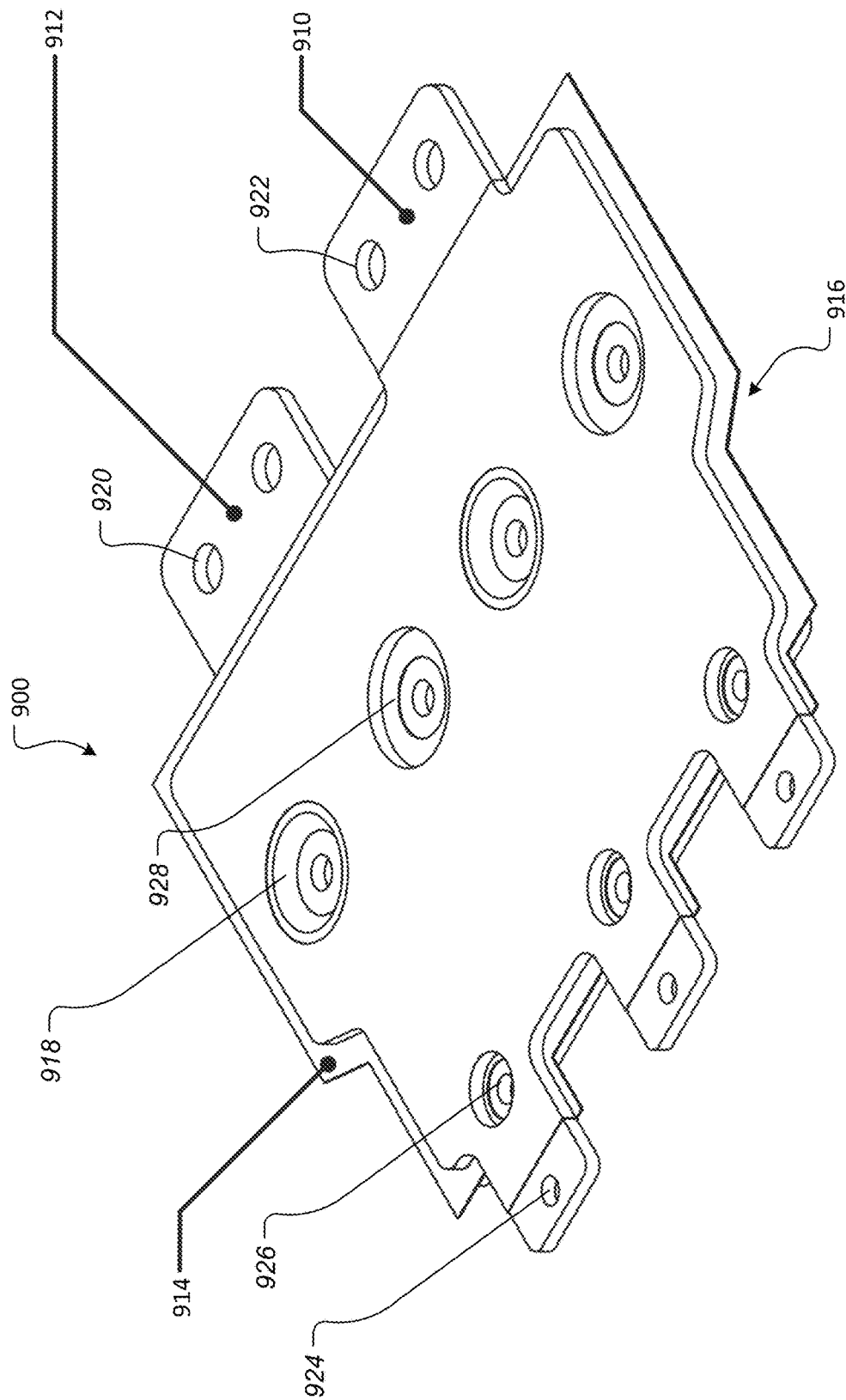
FIG. 21 illustrates an exemplary laminated buss bar according to the disclosure.
Figure 22:
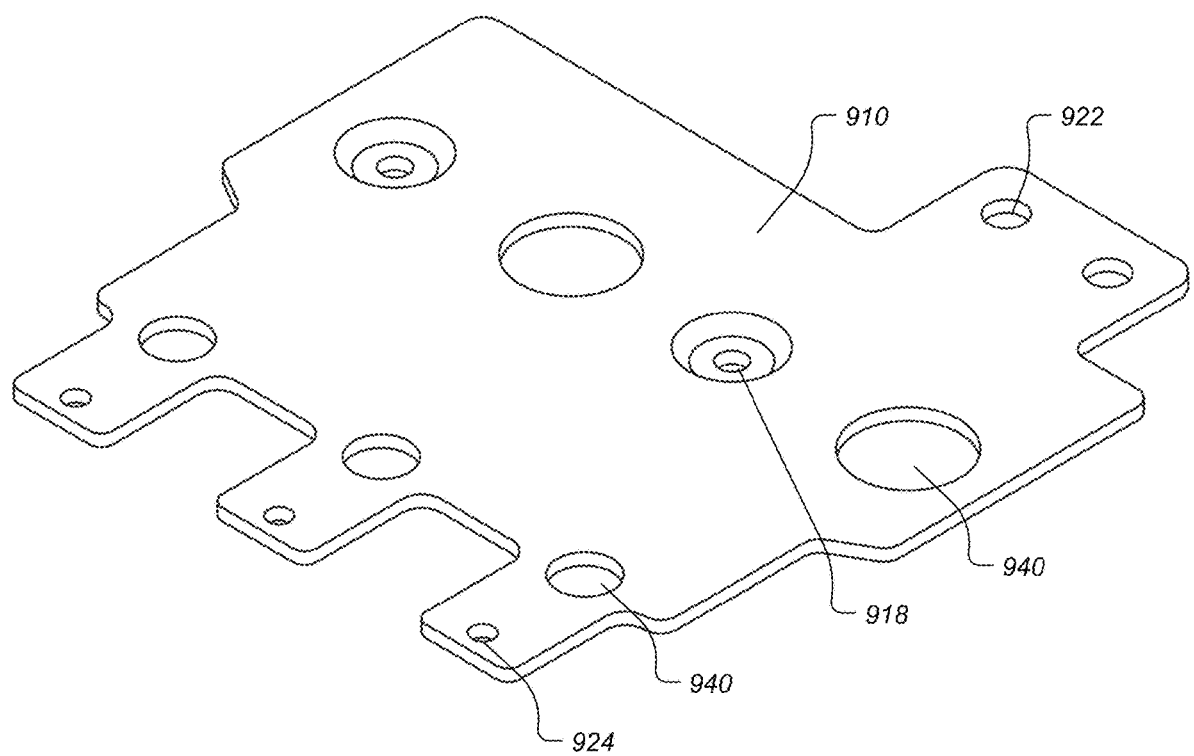
FIG. 22 illustrates one portion of the exemplary laminated buss bar according to FIG. 21.
Figure 23:
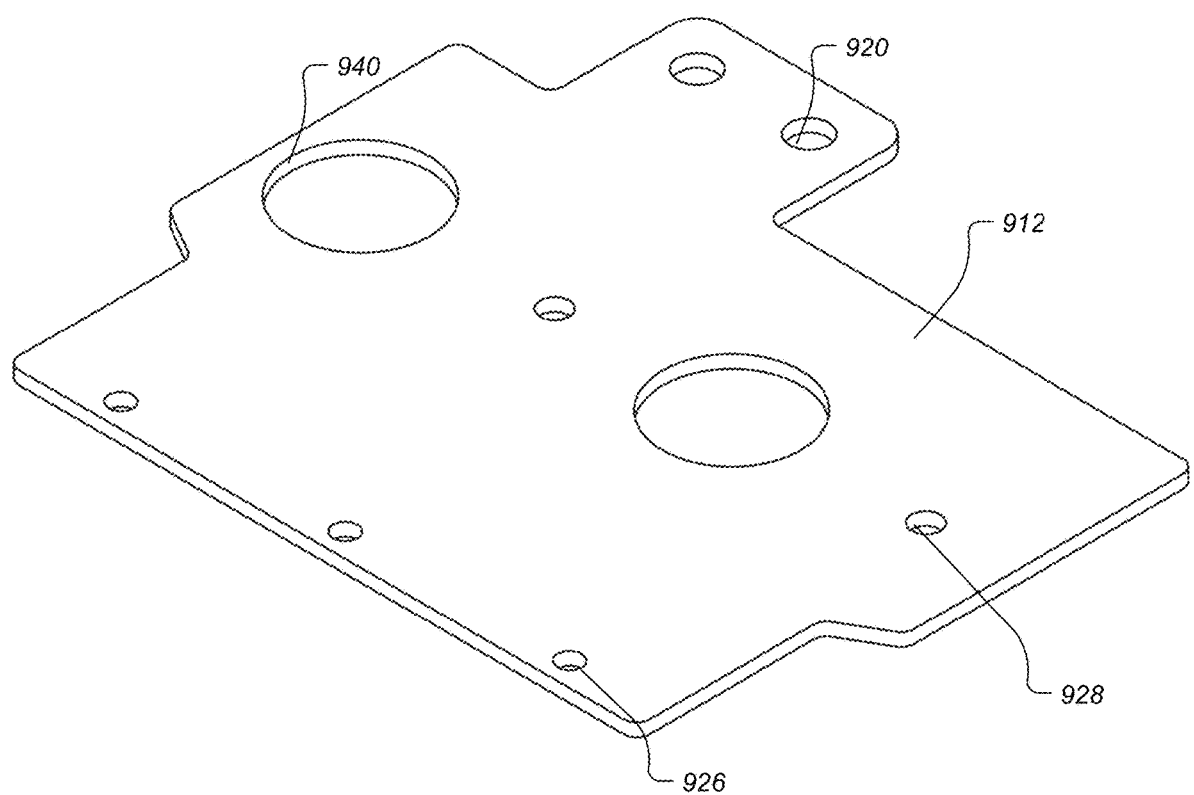
FIG. 23 illustrates another portion of the exemplary laminated buss bar according to FIG. 21.

FIG. 21 illustrates an exemplary laminated buss bar according to the disclosure; FIG. 22 illustrates one portion of the exemplary laminated buss bar according to FIG. 21; and FIG. 23 illustrates another portion of the exemplary laminated buss bar according to FIG. 21. The power terminal layout may be designed to facilitate simple and effective buss bar interconnection. To minimize inductance between the DC link capacitors 102 and the terminals 106, 108 of the power module 100, buss bars 900 may have thick conductors 910, 912 and the thick conductors 910, 912 of the buss bars 900 may overlap. The thick conductors 910, 912 may be separated by a thin dielectric film 914. Current travels through each sheet of the thick conductors 910, 912 in opposing directions, acting to greatly reduce the effective inductance between the power devices 302 and the filtering DC link capacitors 102. The upper layers of the thick conductor 910 may be embossed to form co-planar contacts 918 at the mating surface to the DC link capacitors 102 eliminating the need for washers or spacers, which can interfere with electrical performance.

An example laminated buss bar 900, matching the system level layout presented above may include one or more of a conductor V+ plane 912, a conductor V− plane 910, and a dielectric film 914.

The conductor V+ plane 912 may connect the V+ terminal 106 of the power module 100 through contacts 926 to the V+ terminal of the DC link capacitor(s) 102 through contacts 928, as well as having terminals 920 for external connection.

The conductor V− plane 910 may connect the V− terminal 108 of the power module 100 through contacts 924 to the V− terminal of the DC link capacitor(s) 102 through contacts 918, as well as having terminals for external connection 922. The contacts 918, 924, 926, 928 and the terminals 920, 922 may each be implemented with a fastener aperture configured to receive a fastener to form an electrical connection. Other electrical connection implementations are contemplated as well. The conductors 910, 912 may include apertures 940. The apertures 940 in one of the conductors 910, 912 allow for access to the contacts in another one of the conductors 910, 912.

The dielectric film 914 may be implemented as a thin electrical insulator placed between the overlapping metal layers of the conductors 910, 912. The dielectric film 914 may provide dielectric insulation according to electrical safety standards. The dielectric film 914 may be kept as thin as possible to minimize inductance. A film may also cover the tops and bottoms of the laminated buss bar 900 in all areas that do not require an electrical connection. The edges 916 of the laminated buss bar 900 may be sealed through a variety of methods, including a pinch seal lamination, epoxy seal, a dielectric insert, or the like, depending on geometry and available space. In some aspects, the dielectric film 914 material may be adhered to the laminated buss bar 900 with an acrylic adhesive. In some aspects, the laminated buss bar 900 may include a pinch seal with a polymer material. In some aspects, the laminated buss bar 900 may be subsequently subjected to pressure, heat, and time to form the laminate.

In some aspects, the buss bar 900 and the conductors 910, 912 have a generally planar construction. More specifically, the buss bar 900 may have a generally flat upper surface and a generally flat lower surface as shown in FIG. 15. In some aspects, the thickness of one of the conductors 910, 912 along with the dielectric film 914 defines the offset distance 702 illustrated in FIG. 13. In one aspect, the thickness of one of the conductors 910, 912 along with the dielectric film 914 may be 0.5 mm to 10 mm, which corresponds to the offset distance 702. In one aspect, the thickness of one of the conductors 910, 912 along with the dielectric film 914 may be 1 mm to 2 mm, which corresponds to the offset distance 702. In one aspect, the thickness of one of the conductors 910, 912 along with the dielectric film 914 may be 0.5 mm to 1 mm, which corresponds to the offset distance 702. In one aspect, the thickness of one of the conductors 910, 912 along with the dielectric film 914 may be 2 mm to 3 mm, which corresponds to the offset distance 702. In one aspect, the thickness of one of the conductors 910, 912 along with the dielectric film 914 may be 3 mm to 4 mm, which corresponds to the offset distance 702. In one aspect, the thickness of one of the conductors 910, 912 along with the dielectric film 914 may be 4 mm to 5 mm, which corresponds to the offset distance 702. In one aspect, the thickness of one of the conductors 910, 912 along with the dielectric film 914 may be 5 mm to 6 mm, which corresponds to the offset distance 702. In one aspect, the thickness of one of the conductors 910, 912 along with the dielectric film 914 may be 6 mm to 7 mm, which corresponds to the offset distance 702. In one aspect, the thickness of one of the conductors 910, 912 along with the dielectric film 914 may be 7 mm to 8 mm, which corresponds to the offset distance 702. In one aspect, the thickness of one of the conductors 910, 912 along with the dielectric film 914 may be 8 mm to 9 mm, which corresponds to the offset distance 702. In one aspect, the thickness of one of the conductors 910, 912 along with the dielectric film 914 may be 9 mm to 10 mm, which corresponds to the offset distance 702.

Figure 24:
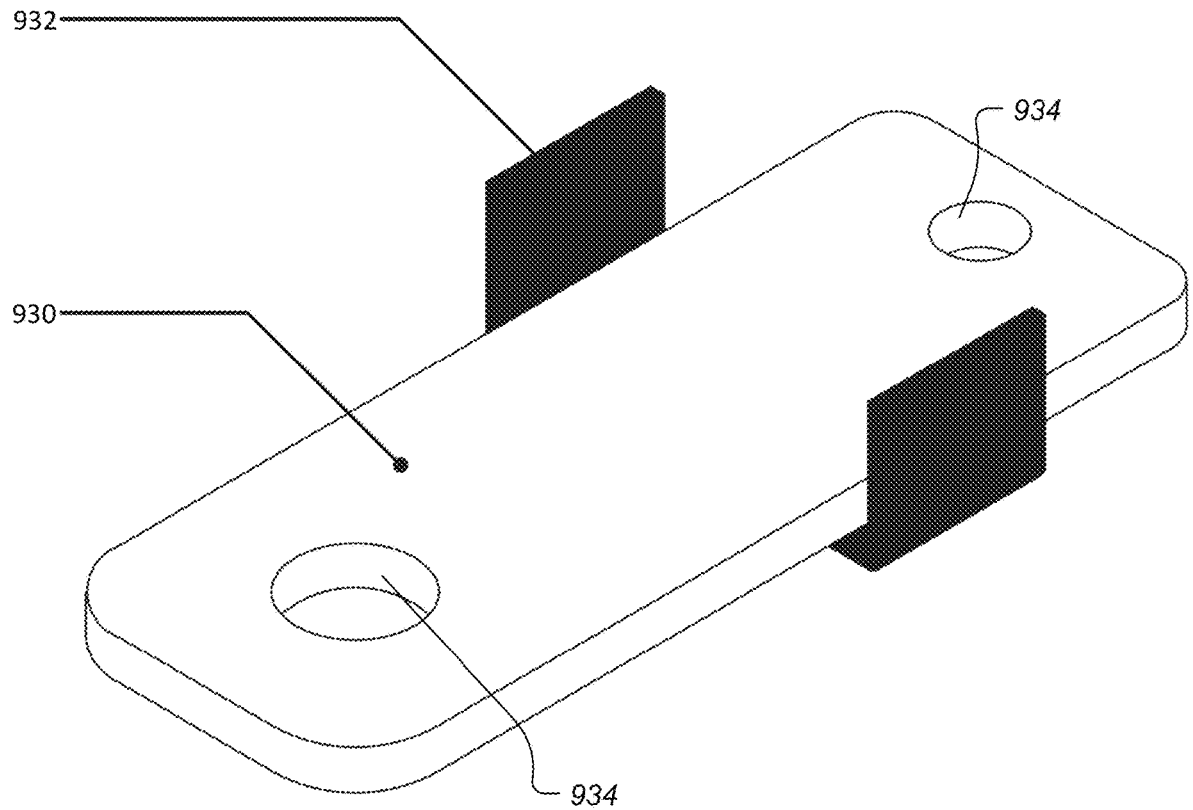
FIG. 24 illustrates a phase output buss bar according to the disclosure.

FIG. 24 illustrates a phase output buss bar according to the disclosure. For a three phase motor drive, as in this example, the phase outputs 930 may not require lamination or overlapping to minimize inductance. This is due to the fact that the phase output buss bars 930 are driving inductive loads, which limits the need to reduce inductance on the output paths. Accordingly, the phase output buss bars 930 may be standalone elements and may be much less complex than the laminated DC link structure. The phase output buss bars 930 may include apertures 934 for receiving a fastener to form an electrical connection.

It is highly desirable to measure the output current from each phase. This can be performed through a number of methods, such as adding in a low resistance series resistor (called a shunt) and measuring the voltage drop across it, including a sensor that measures the magnetic field generated by the current and providing a proportional signal to a controller, or the like. FIG. 24 illustrates one of the output buss bars 930 for this system as well as a configuration to improve measurement accuracy by adding a ferrous shield 932 to focus the magnetic field in a region where the sensor may be located.

The phase output buss bar 930 or conductor may be configured to provide transitions from the phase output terminal 110 of each power module 100 to an external terminal connection. The form and arrangement of the phase output buss bar 930 or conductor may vary and depend on the specific topology or arrangement of the power modules 100.

The ferrous shield 932 or magnetic field concentrator may be configured to focus the magnetic field generated by current flow in a target region where a sensor may be placed. This may not be required for operation but is a highly advantageous arrangement to extract output current measurements in most converter systems.

Figure 25:
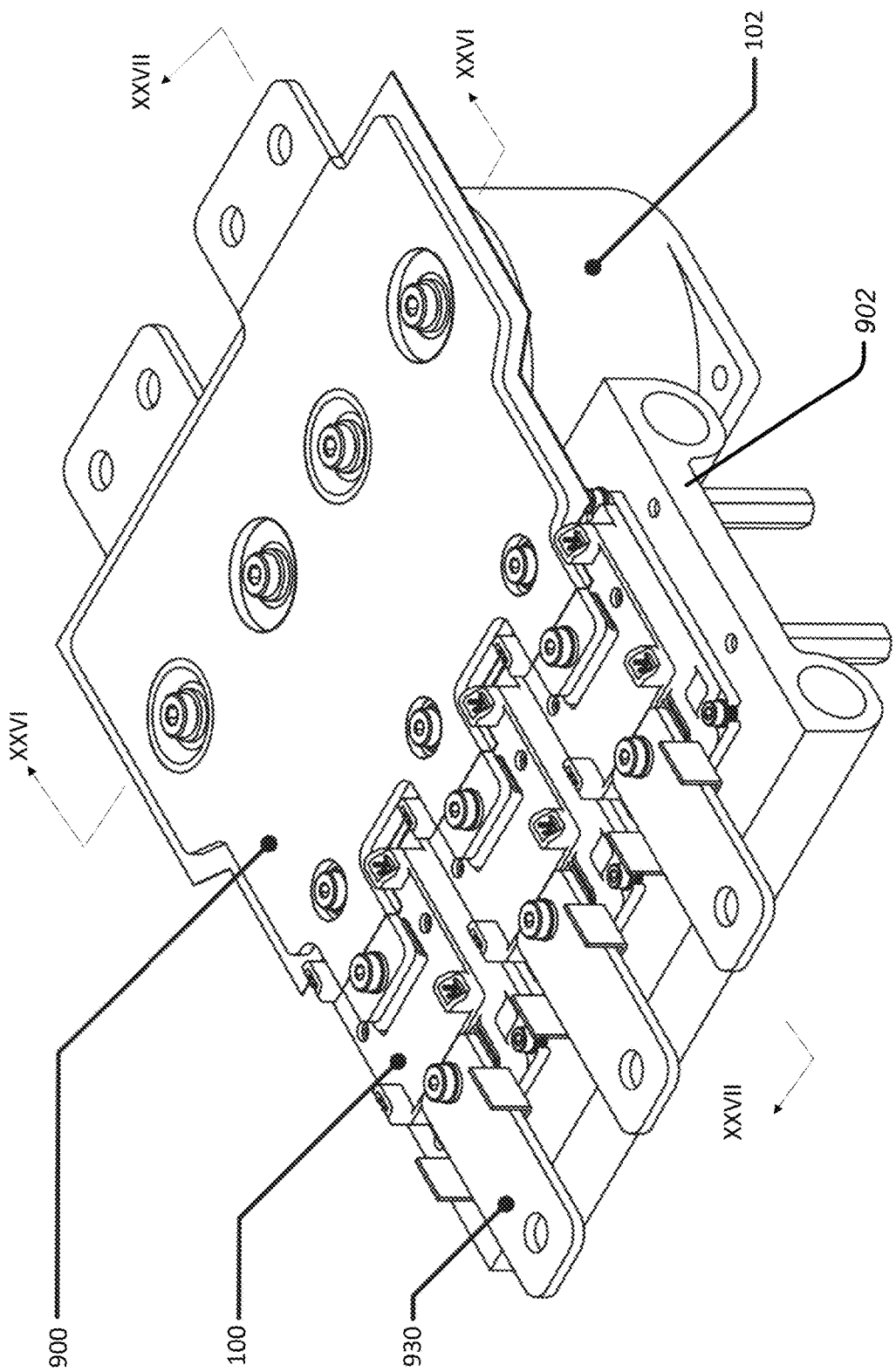
FIG. 25 illustrates a perspective view an exemplary implementation that includes a power module and laminated buss bar according to aspects of the disclosure.
Figure 26:
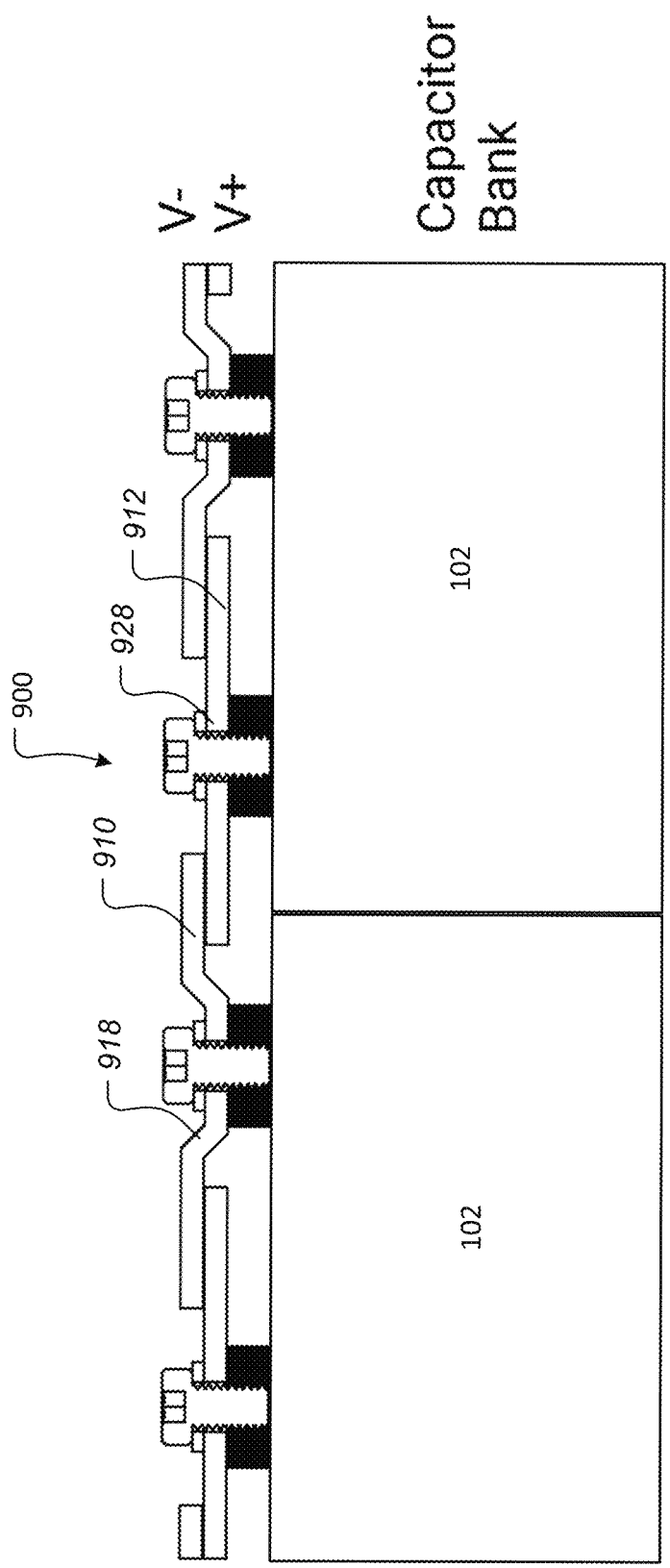
FIG. 26 illustrates a first cross-sectional view of an exemplary implementation that includes a power module and laminated buss bar according to FIG. 25.
Figure 27:
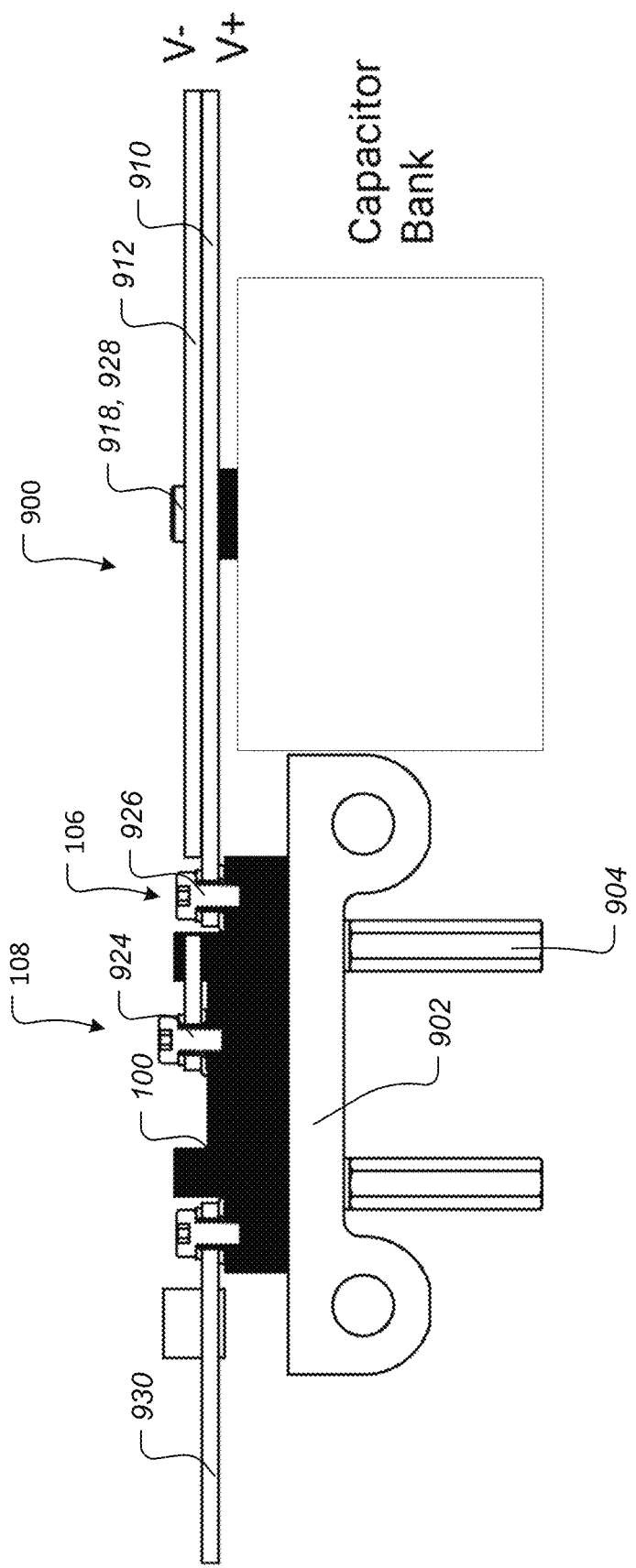
FIG. 27 illustrates a second cross-sectional view of an exemplary implementation that includes a power module and laminated buss bar according to FIG. 25.

FIG. 25 illustrates a perspective view an exemplary implementation that includes a power module and laminated buss bar according to aspects of the disclosure; FIG. 26 illustrates a first cross-sectional view of an exemplary implementation that includes a power module and laminated buss bar according to FIG. 25; and FIG. 27 illustrates a second cross-sectional view of an exemplary implementation that includes a power module and laminated buss bar according to FIG. 25. FIGS. 25-27 illustrate the motor drive system layout with the laminated buss bar 900 structures described above. As shown in FIGS. 25-27, the system may include the power module 100 array, cold plate 902 assembly, the DC link capacitor 102, the DC link laminated buss bar 900 assembly, and the output contact buss bars 930.

A cross-section of the terminals of the DC link capacitors is illustrated in FIG. 26. FIG. 26 illustrates the embossed co-planar connections 918 featured in the buss bars 900, as well as the high degree of metal lamination in every feasible location. The only separation between the plates 910, 912 may be the minimum area required for the sheet metal fabrication processes (emboss tools, work holding, tolerances, etc.) and for dielectric isolation 914 (edge seals, creepage, clearance).

The cross section across the power module 100 shown in FIG. 27 illustrates the optimized overlapping critical loop from the bank of the DC link capacitors 102 to the terminals 106, 108 of the power module 100. This reinforces the concept discussed in FIG. 15 with actual representative components and physical design restraints.

In all, this low inductance, high current interconnection structure may be necessary for and enabled by the disclosed power module design. Together, they form an effective and highly integrated low inductance path between the bank of the DC link capacitors 102 and the switch positions 104. This structure allows for efficient, stable, and very high frequency switching of the power devices 302 such as wide band gap semiconductors.

Figure 28:
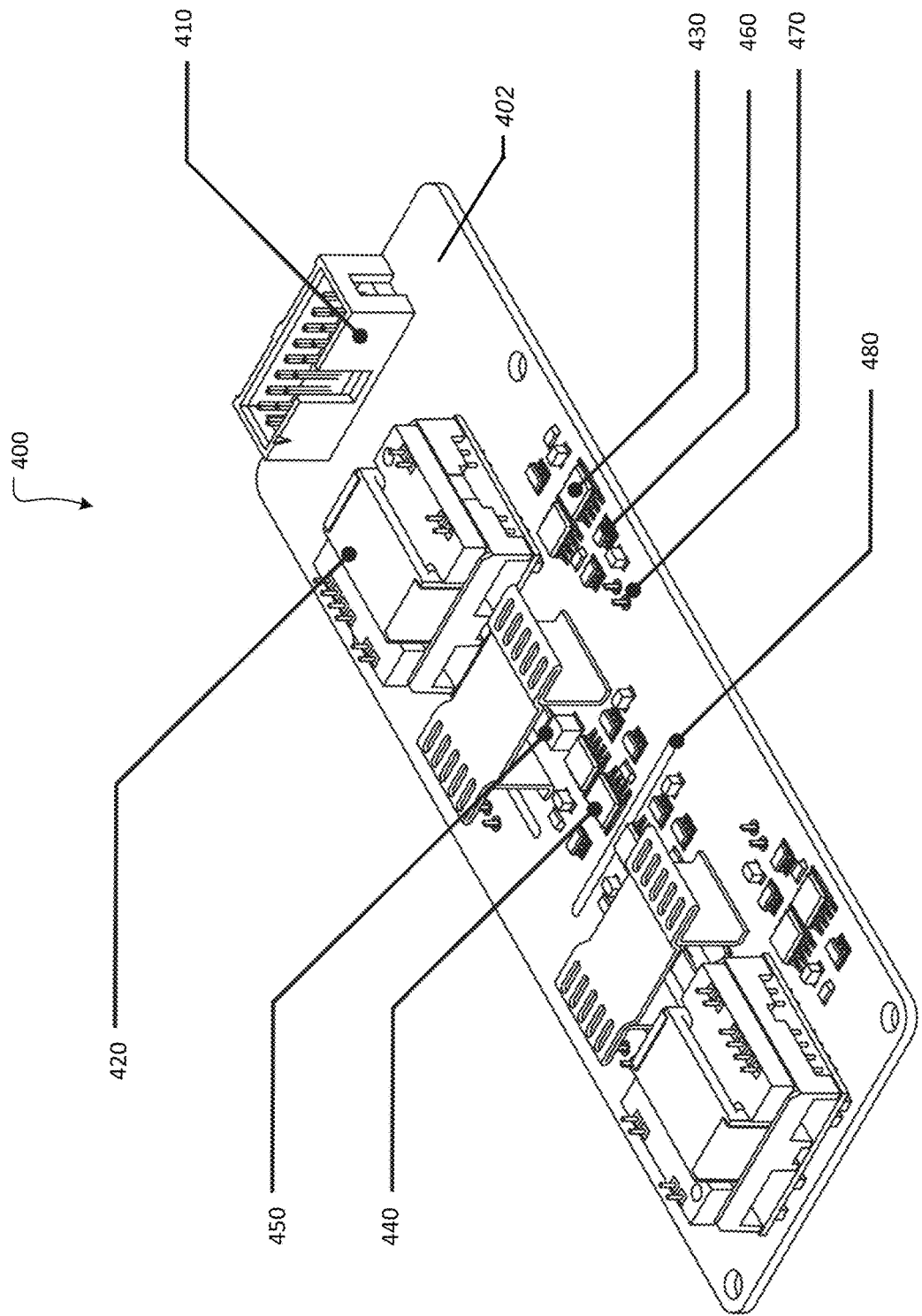
FIG. 28 and FIG. 29 illustrate an exemplary single module gate driver according to the disclosure.

FIG. 28 illustrates an exemplary single module gate driver according to the disclosure. The gate driver acts as a power amplifier delivering drive current to the switch positions 104 while providing voltage isolation between a controller and high voltage power stages. Isolation may also be maintained between driver blocks between switch positions 104. For high frequency switching, the output stage of the drivers may be physically located close to the switch positions 104.

Additional features may be included for safety, such as under voltage, over voltage, and over current protection. A gate driver circuit may be configured to ensure the power module 100 is always functioning in a safe operating region and will shut down carefully in the event of a failure.

With this power module design, the gate drivers may be seated directly above the laminated power bussing 900. They may be formed as a single PCB and racked up or scaled in the same modular fashion as the power modules 100. Alternatively, the drivers may also be integrated on a single PCB across an array of power modules 100, saving size but increasing complexity due to the multiple high voltage nodes on the board. The output stage of the drivers may be located directly next to the board to board connector making contact with the module signal pins.

An example single module gate driver 400 is presented in FIG. 28. The single module gate driver 400 elements may be duplicated for each switch position 104. The arrangement and specific layout of each block may be system dependent and are configured in this drawing as a generalized example.

The single module gate driver 400 elements may include one or more of control signal connector 410, isolated power supply 420, signal isolation and conditioning component 430, amplifier stage 440, bulk gate resistor and local current filter 450, sensors and protection components 460, power module signal connector 470, and creepage extension slots 480. The single module gate driver 400 may be arranged on a printed circuit board (PCB 402).

The control signal connector 410 may be configured to interface the controller and the gate driver such that the differential control and sensor signals may be transferred between the two through a cable, board to board connector, or similar mechanism.

The isolated power supply 420 may be implemented as a DC-DC converter providing the required positive and negative voltages for turn-on and turn-off of the power devices 302. The isolated power supply 420 may be high enough power to source the current needed by the power devices 302. Isolation between the control and power stages may be a vital function of this block.

The signal isolation and conditioning component 430 may include circuitry to provide isolation of the control signals between the low voltage control and the high voltage power, as well as conditioning the control signals for the amplifier stage 440 of the driver.

The amplifier stage 440 may be formed of discrete or integrated components. The amplifier stage 440 may transform the isolated low power control signals into the currents and voltages required by the switch position 104 to operate. This should be as physically close to the module signal terminals as possible for clean switching.

The bulk gate resistor and local current filter 450 may be the final stage before transition to the output pins, the bulk gate resistor and local current filter 450 and may be used to tune the turn-on and turn-off times of the switch position 104 to match the needs of a particular system. These may be a single set of passive elements, or as part of a network with different resistance values for turn-on and turn-off if different switching characteristics are desired. A local filter may also be used to ensure a quality source of current is maintained during switching events.

The sensors and protection components 460 may include circuitry, which may include under and over voltage protections, over current protections, temperature sensing, and mechanisms for a safe shut down in the event of a failure.

The power module signal connector 470 may be located on the underside of the PCB 402. The power module signal connector 470 may interface the gate driver and the power module 100, providing a direct connection to the gate distribution network internal to the power module 100. This may be typically facilitated with a board to board connector, a direct solder connection, or the like. A wire to board connection is also possible, but may need the driver to be physically close to the power module 100.

The creepage extension slots 480 may be configured to improve voltage isolation between driver stages, allowing for a more compact packing of the components. Voltage isolation is an increasing challenge as the size of high voltage power modules continues to shrink. Cutting a slot in the PCB 402 may be one option to increase the voltage creepage distance without adding board size. Other options include local potting of critical nodes and fully covering the entire assembly with a conformal dielectric coating. More specifically, the various components of the power module 100 including the PCB 402 may include discrete and/or local potting of one or more components; and the various components of the power module 100 including the PCB 402 may include conformal dielectric coating on one or more components, the entire PCB 402, and/or other assemblies of the power module 100.

Figure 29:
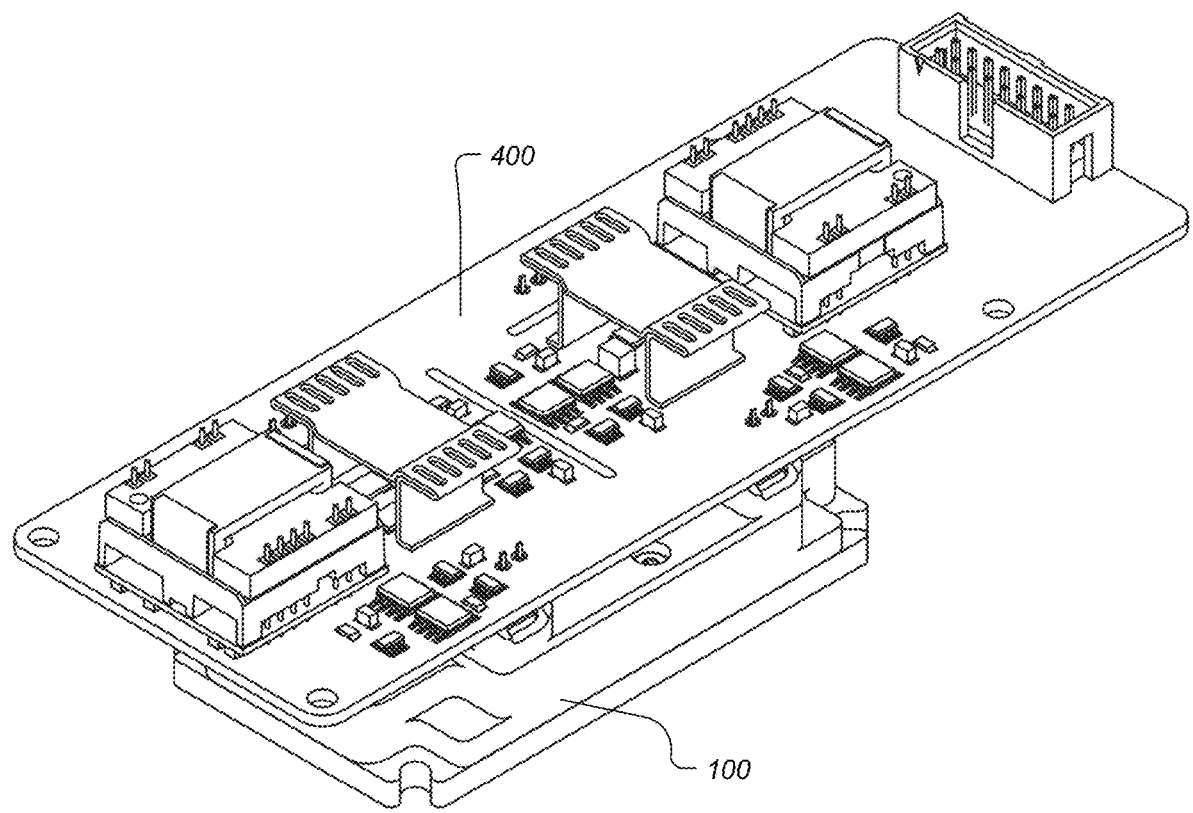

When integrated together as shown in FIG. 29, the gate driver 400 and power module 100 form a compact single unit with an optimized low inductance signal flow from the control source, through isolation, amplified, and then distributed through the gate resistor network directly to the gates of the paralleled power devices 302.

Figure 30:
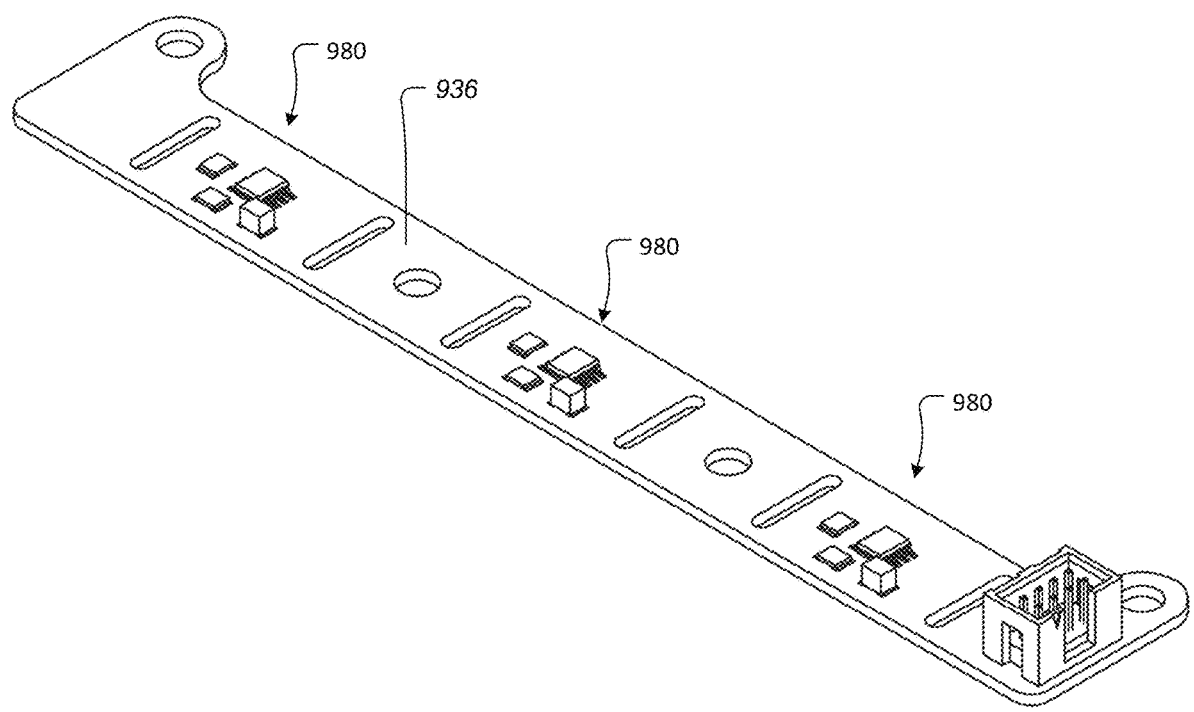
FIG. 30 illustrates a current sensing component according to aspects of the disclosure.
Figure 31:
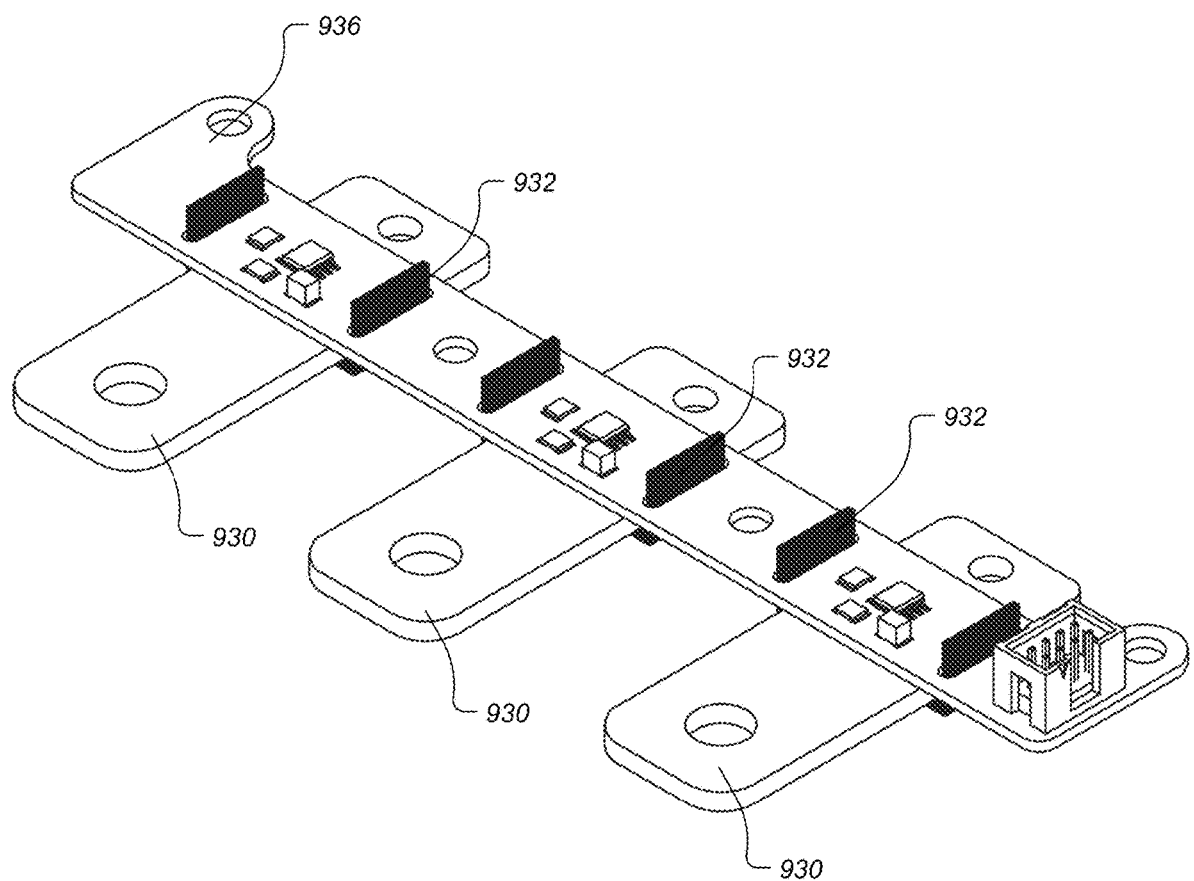
FIG. 31 illustrates a current sensing component arranged with phase output buss bars according to FIG. 30.

FIG. 30 illustrates a current sensing component according to aspects of the disclosure; and FIG. 31 illustrates a current sensing component arranged with phase output buss bars according to FIG. 30. There are multiple methods to sense current. In one aspect of the disclosure illustrated in FIGS. 30 and 31, sensors 980 such as a non-contact magnetic sensors may be utilized. The sensors 980 may be utilized with a ferrous shield 932 to focus the magnetic field. The sensors 980 may utilize a small sensor chip placed in this region which produces a proportional signal to the output current. An example of the sensors on a single PCB 936 for all three phases is illustrated in FIG. 30, and the full output buss bar structure with the magnetic shields is illustrated in FIG. 31.

Figure 32:
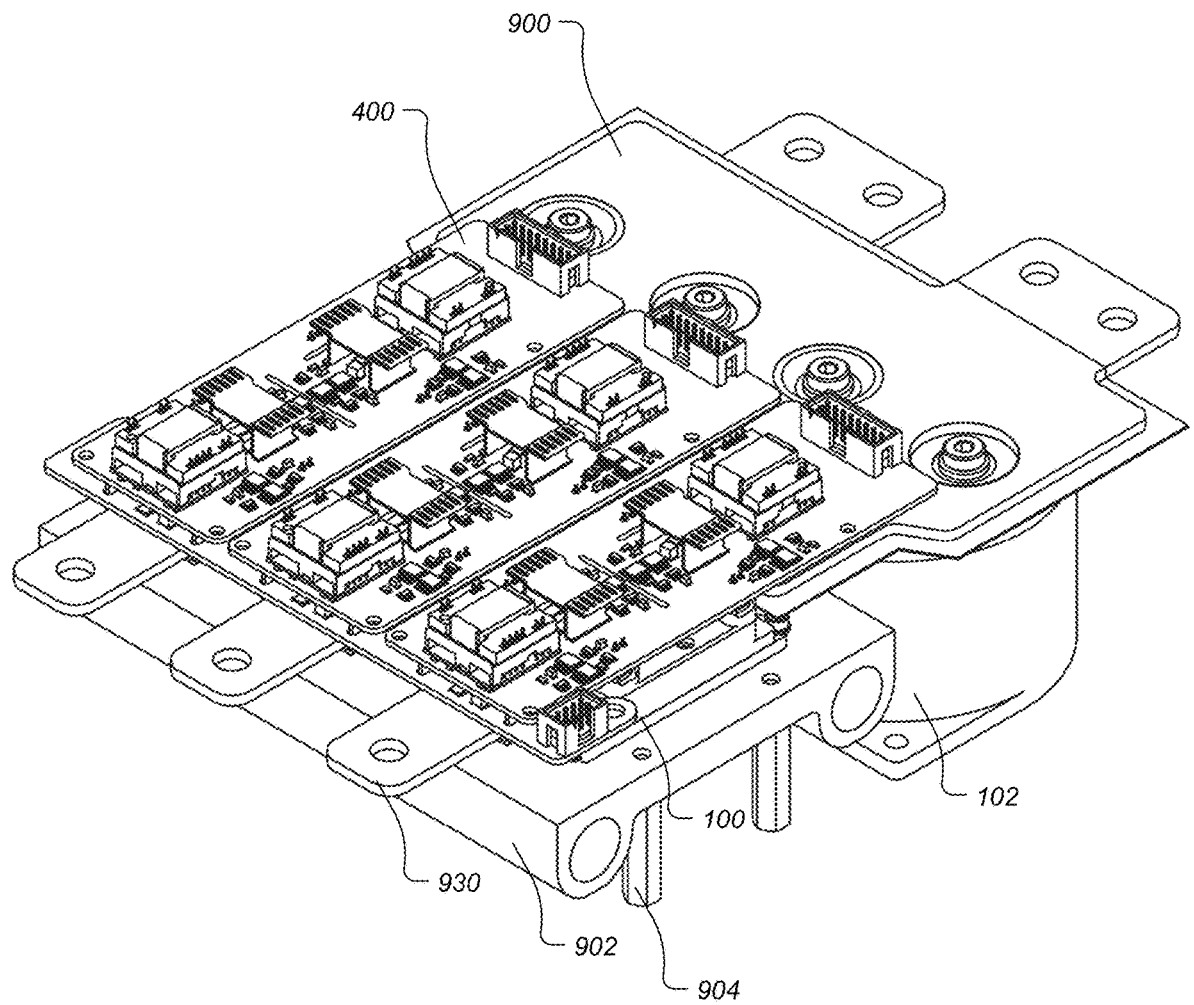
FIG. 32 illustrates an exemplary three phase motor drive power according to an aspect of the disclosure.

FIG. 32 illustrates an exemplary three phase motor drive power stack-up according to an aspect of the disclosure. In particular, FIG. 32 illustrates an exemplary three phase motor drive power stack-up with all of functional components described previously. The FIG. 32 system is highly integrated and heavily optimized for peak electrical performance. Additional features such as voltage sensing of the capacitor bank and EMI shielding enclosures are contemplated and would integrate well within this high performance core.

Figure 33:
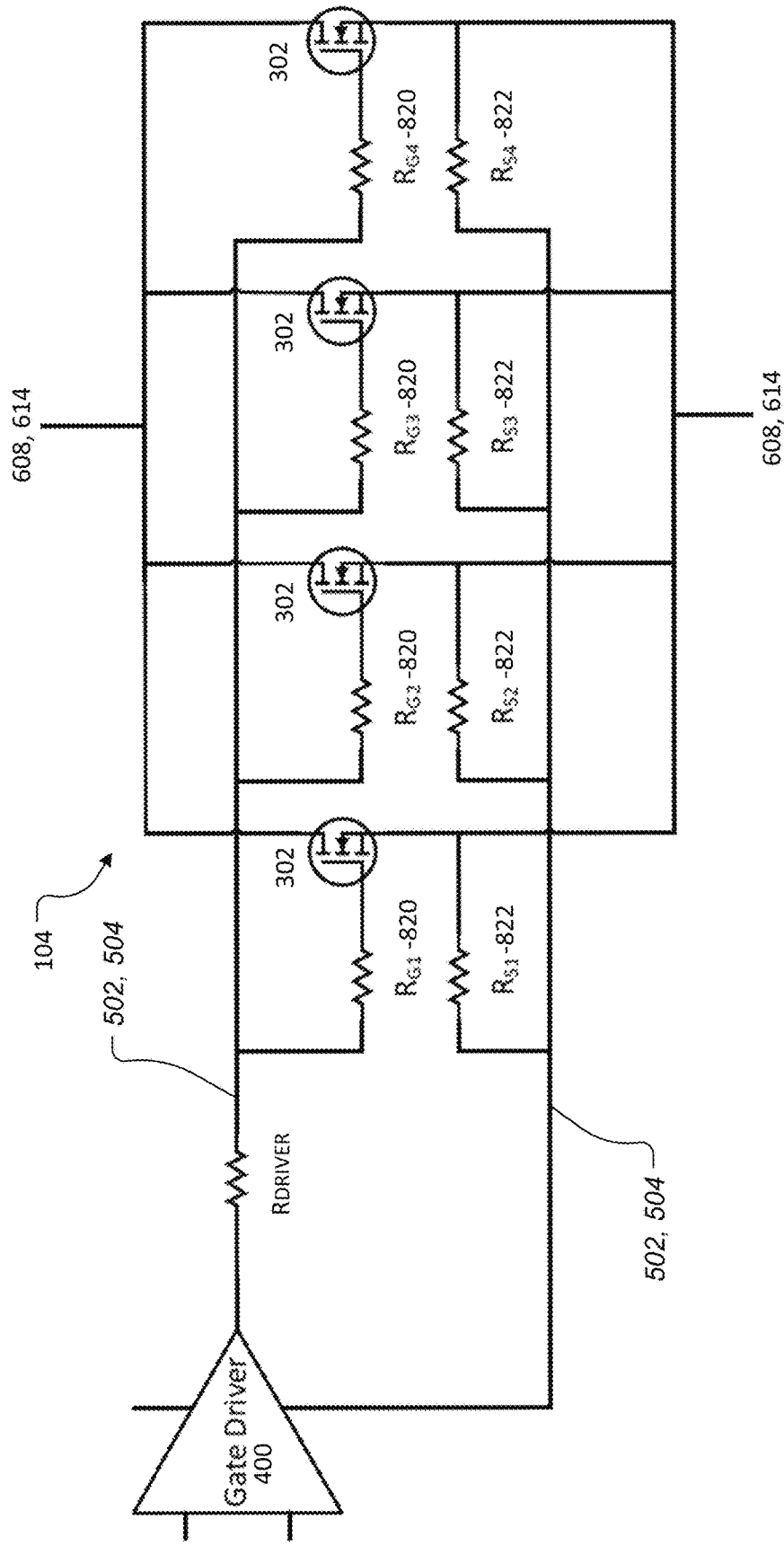
FIG. 33 schematically illustrates a plurality of power devices in parallel according to aspects of the disclosure.

FIG. 33 schematically illustrates a plurality of power devices in parallel according to aspects of the disclosure. In particular, FIG. 33 shows four power devices 302. This number of the power devices 302 is merely exemplary and for ease of illustration and understanding. The power module 100 of the disclosure may include any number of the power devices 302.

The gate control and sense signals factor prominently into switching performance of the power module 100 and may be of particular importance in a paralleled switch position 104. The signal loops may be optimized in the power module 100 for high performance, robustness, and uniform current sharing. In some aspects, a multilayer printed circuit board (PCB) for the signal loop may be utilized. In these aspects, parallel planes may be used for flux cancellation and further inductance reduction. Hence, the wide, short paths can double back on themselves to cancel out the magnetic field. This helps provide the best signal loop possible given the geometrical constraints of the power module 100. Similar to the power loops, the paths may be configured to be limited in length, wide in cross section, and the associated external components may be placed as physically close as possible to the signal terminals 502, 504.

For a paralleled array of power devices 302 such as transistors, particularly MOSFETs, the timing and magnitude of the gate currents must be balanced to result in consistent turn-on and turn-off conditions. The power module 100 may utilize individual ballasting resistors 820 ($R_{G1}$, $R_{G2}$, $R_{G3}$, $R_{G4}$) that may be placed in close proximity to the gate of the power devices 302, only separated by the gate wire bond. The individual ballasting resistors 820 ($R_{G1}$, $R_{G2}$, $R_{G3}$, $R_{G4}$) may be of low resistance and aid in buffering a current flowing to each individual power device 302. The individual ballasting resistors 820 ($R_{G1}$, $R_{G2}$, $R_{G3}$, $R_{G4}$) act to decouple the gates of the power devices 302, preventing oscillations and helping to ensure an equalized turn on signal for the paralleled power devices 302. A singular external resistor RDRIVER may be utilized and connected to these paralleled resistors 820 ($R_{G1}$, $R_{G2}$, $R_{G3}$, $R_{G4}$) for controlling the turn on speed of the effective switch position 104. In one aspect, a ballasting resistor 820 may be associated with each power device 302. In one aspect, an individual ballasting resistor 820 may be associated with each individual power device 302.

In additional aspects, the power module 100 may utilize individual ballasting source Kelvin resistors 822 ($R_{S1}$, $R_{S2}$, $R_{S3}$, $R_{S4}$) that may be placed in close proximity to the source Kelvin connection of the power devices 302. In one aspect, the source Kelvin resistors 822 ($R_{S1}$, $R_{S2}$, $R_{S3}$, $R_{S4}$) may only be separated by the source Kelvin wire bond. In one aspect, a source Kelvin resistor 822 may be associated with each power device 302. In one aspect, an individual source Kelvin resistor 822 may be associated with each individual power device 302. The source Kelvin resistors 822 ($R_{S1}$, $R_{S2}$, $R_{S3}$, $R_{S4}$) may be of a low resistance and aid in buffering a current flowing to the source Kelvin connection of each of the individual power device 302. The source Kelvin resistors 822 ($R_{S1}$, $R_{S2}$, $R_{S3}$, $R_{S4}$) may act to decouple the source Kelvin connections of the power devices 302, preventing oscillations and helping to ensure an equalized signal for the paralleled power devices 302. In particular aspects, the source Kelvin resistors 822 ($R_{S1}$, $R_{S2}$, $R_{S3}$, $R_{S4}$) may be configured and implemented to address any mismatch of the individual power devices 302, a layout of the individual power devices 302, and the like.

In particular aspects, the source Kelvin resistors 822 ($R_{S1}$, $R_{S2}$, $R_{S3}$, $R_{S4}$) may be configured and implemented to prevent or reduce feedback oscillation between the individual power devices 302, dampen feedback oscillation between the individual power devices 302, decouple the source Kelvin signals between the individual power devices 302, inhibit current flowing between the source Kelvin signals for the individual power devices 302, equalize current flowing between the source Kelvin signals for the individual power devices 302, force current flowing through the individual power devices 302 to flow through a current path, and the like. Moreover, the source Kelvin resistors 822 ($R_{S1}$, $R_{S2}$, $R_{S3}$, $R_{S4}$) may reduce signaling inductance, ensure gate operation of the power devices 302 is not slowed, minimize gate/source over-voltage in the power devices 302, and the like.

The source Kelvin resistors 822 ($R_{S1}$, $R_{S2}$, $R_{S3}$, $R_{S4}$) may be a surface mount package, an integrated thick film layer, printed thick film, a wire bondable chip, a "natural" resistance path (material/structure interface that inherently adds resistance), or the like depending on the application. In one or more aspects, the resistance value of the source Kelvin resistors 822 ($R_{S1}$, $R_{S2}$, $R_{S3}$, $R_{S4}$) and the resistors 820 ($R_{G1}$, $R_{G2}$, $R_{G3}$, $R_{G4}$) may be equivalent. In one or more aspects, the resistance value of the source Kelvin resistors 822 ($R_{S1}$, $R_{S2}$, $R_{S3}$, $R_{S4}$) and the resistors 820 ($R_{G1}$, $R_{G2}$, $R_{G3}$, $R_{G4}$) may be different. In one or more aspects, the resistance value of the source Kelvin resistors 822 ($R_{S1}$, $R_{S2}$, $R_{S3}$, $R_{S4}$) may be in the range of 0.5 ohms-1.5 ohms. In one or more aspects, the resistance value of the source Kelvin resistors 822 ($R_{S1}$, $R_{S2}$, $R_{S3}$, $R_{S4}$) may be in the range of 0.5 ohms-2 ohms. In one or more aspects, the resistance value of the source Kelvin resistors 822 ($R_{S1}$, $R_{S2}$, $R_{S3}$, $R_{S4}$) may be in the range of 0.5 ohms-5 ohms. In one or more aspects, the resistance value of the source Kelvin resistors 822 ($R_{S1}$, $R_{S2}$, $R_{S3}$, $R_{S4}$) may be in the range of 0.5 ohms-20 ohms. In one or more aspects, the resistance value of the resistors 820 ($R_{G1}$, $R_{G2}$, $R_{G3}$, $R_{G4}$) may be in the range of 1 ohms-20 ohms. In one or more aspects, the resistance value of the resistors 820 ($R_{G1}$, $R_{G2}$, $R_{G3}$, $R_{G4}$) may be in the range of 1 ohms-5 ohms. In one or more aspects, the resistance value of the resistors 820 ($R_{G1}$, $R_{G2}$, $R_{G3}$, $R_{G4}$) may be in the range of 1 ohms-10 ohms. In one or more aspects, the resistance value of the resistors 820 ($R_{G1}$, $R_{G2}$, $R_{G3}$, $R_{G4}$) may be in the range of 1.5 ohms-6 ohms.

Figure 34:
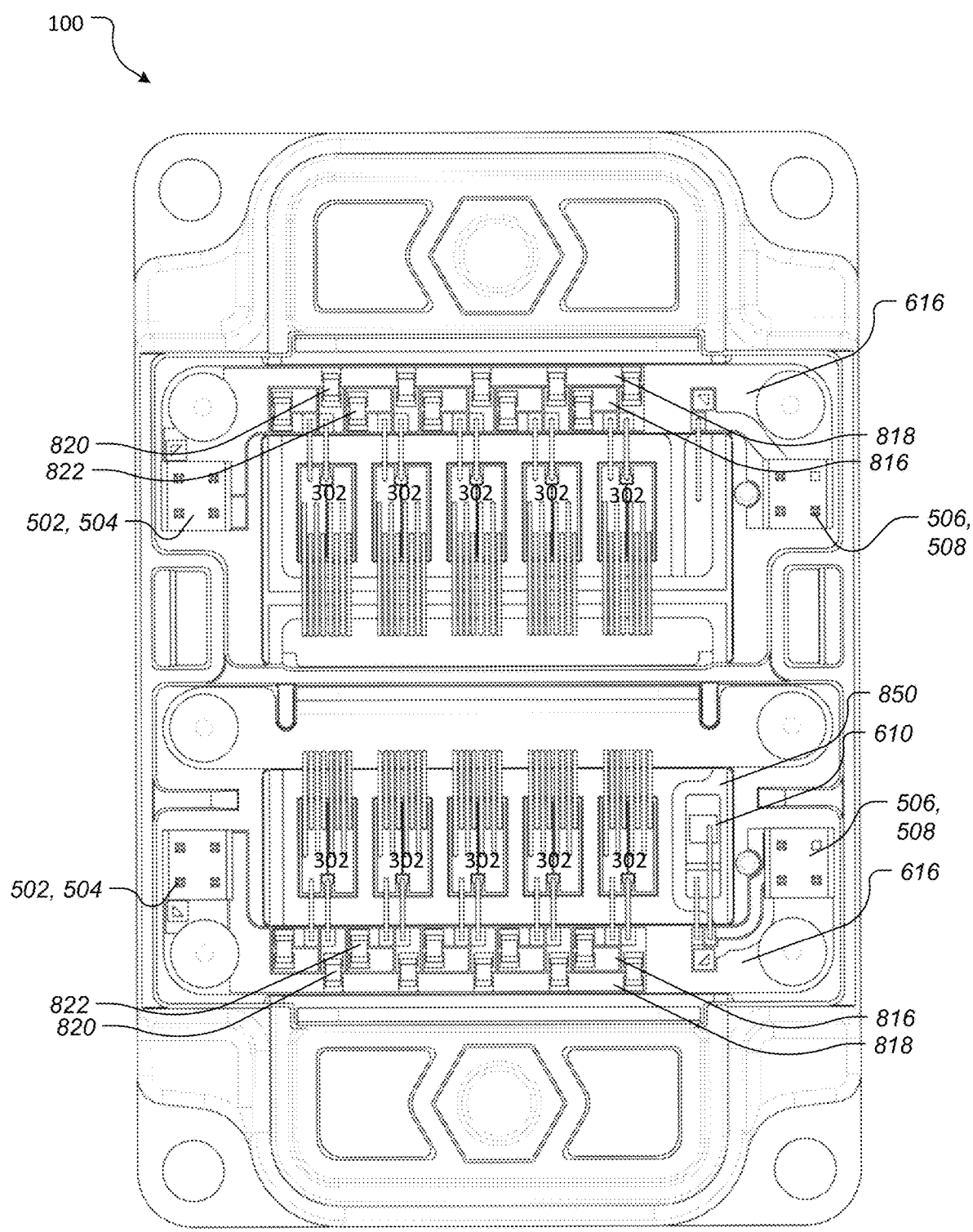
FIG. 34 illustrates a top view of the effective gate switching loop and a power module according to an aspect of the disclosure.

FIG. 34 illustrates a top view of the effective gate switching loop and a power module according to an aspect of the disclosure. In particular, FIG. 34 illustrates that the signal substrate or signal interconnection assembly 616 may have rails 816, 818 connecting to the gate and source kelvin connector terminals 502, 504 on the edge of the board of the signal interconnection assembly 616. The rail 818 may connect to gate wire bond pads through individual gate resistors 820 (resistors $R_{G1}$, $R_{G2}$, ... $R_{GN}$), while the rail 816 may connect through individual resistors 822 (resistors $R_{S1}$, $R_{S2}$, $R_{S3}$, ... $R_{SN}$) to the source pad of the power device 302. This may be considered a true kelvin connection, as the source kelvin bond is not in the current path of the power source bonds. A kelvin connection may be important for clean and efficient control, reducing the influence of the high drain to source current on the signal loop.

FIG. 34 further illustrates optional signal connections 506, 508 on the signal interconnection assembly 616. The connections 506, 508 may be used for temperature measurement or other forms of internal sensing. In some aspects, the internal sensing may include diagnostic sensing that includes diagnostic signals that may be generated from diagnostic sensors that may include strain gauges sensing vibration, sensors sensing humidity, and the like. Moreover, the diagnostic sensors may sense any environmental or device characteristic.

In one aspect, the sensor may be a temperature sensor 610 that may be placed on the power substrate 606 or the base plate 602. In one aspect, the power substrate 606 or the base plate 602 may have a metal surface and/or conductive surface supporting the power devices 302. In one aspect, a portion 850 of the surface of the power substrate 606 or the base plate 602 may be different from the surface supporting the power devices 302. In one aspect, the portion 850 may be a portion having the metal surface and/or conductive surface removed, etched, nonexistent, or the like. In one aspect, the temperature sensor 610 may be placed on the power substrate 606 or the base plate 602 in an area where a metal surface of the power substrate 606 or the base plate 602 has been removed or is nonexistent. In these aspects, the temperature sensor 610 may be isolated and provide a more accurate temperature reading. Of course, other locations and arrangements for the temperature sensor 610 are contemplated as well.

This implementation of this signal loop or the signal interconnection assembly 616 may ensure quality control and measurements across any combination of paralleled power devices 302 in the switch position 104. Standard PCB board-to-board connectors may allow for a straightforward connection to external gate driver and control circuitry.

This gate distribution network, as shown, may be implemented with a PCB. It may also be formed as a thick film circuit directly on the primary power substrate 630, directly on the base plate 602, or the like. This has the benefit of reducing the part count of the power module 100 as well as the option to print the resistors 820, 822. In aspects, a thick film or deposited and patterned metal implementation may be utilized on the housing sidewalls 612, and/or the housing lid 618 itself. The resistors 820, 822 may be much smaller than the size of the surface mount parts on a PCB, as there may be no need for solder terminals and the resistors 820, 822 may be actively cooled from the cold plate, minimizing thermal sizing constraints of the component.

Figure 35:
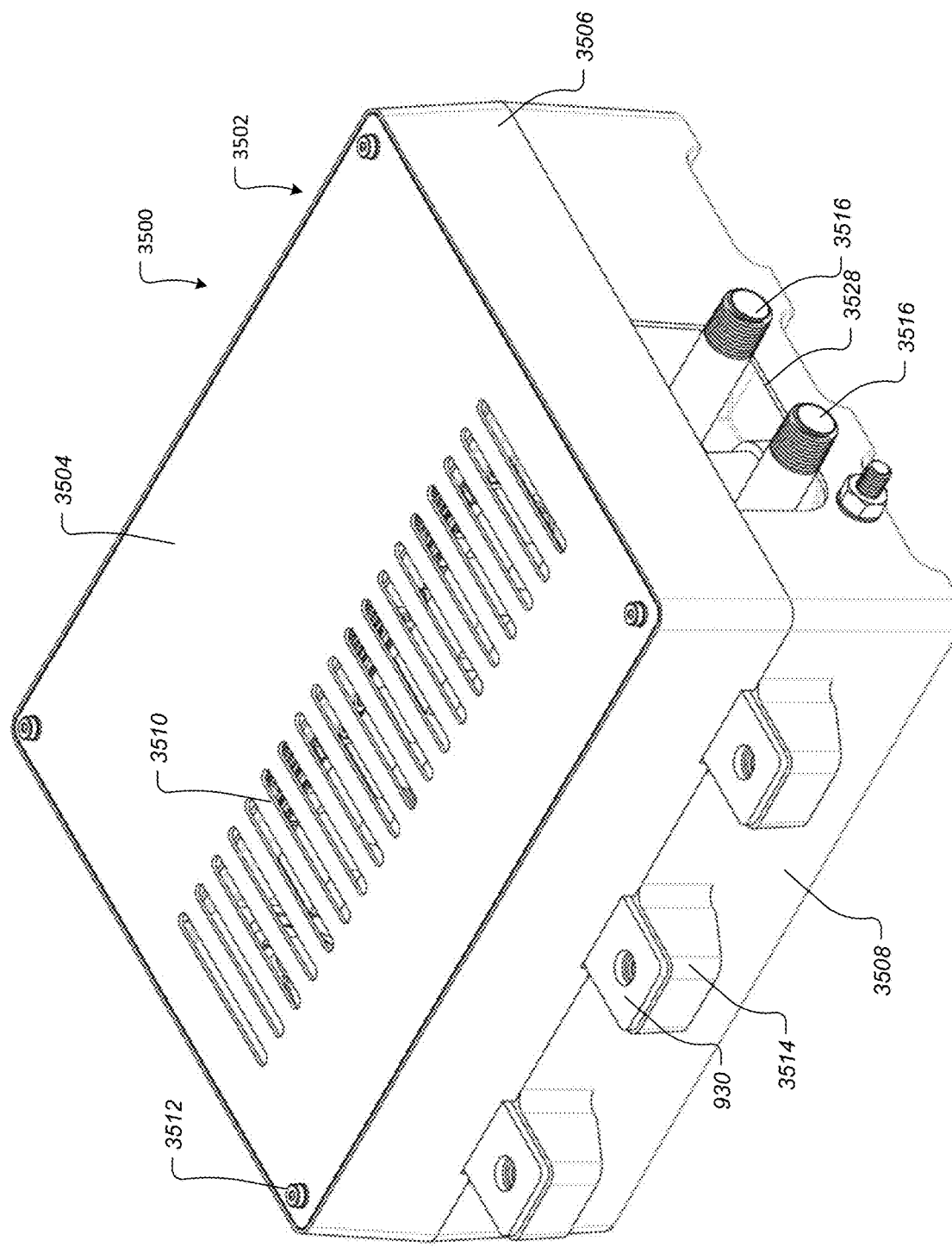
FIG. 35 illustrates a perspective view of a configuration that includes power modules and a housing in accordance with an aspect of the disclosure.
Figure 36:
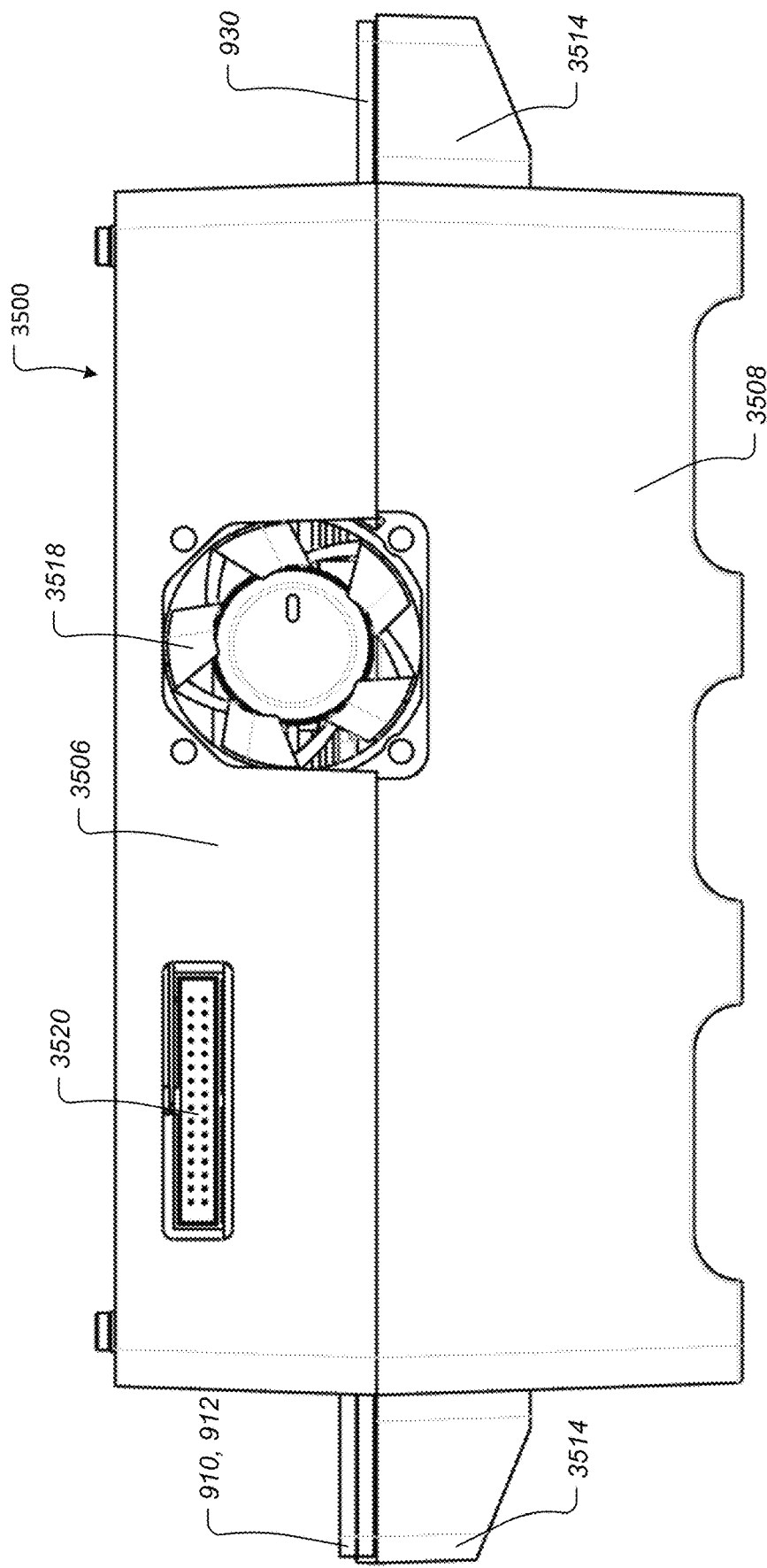
FIG. 36 illustrates a side view of the configuration of FIG. 35.
Figure 37:
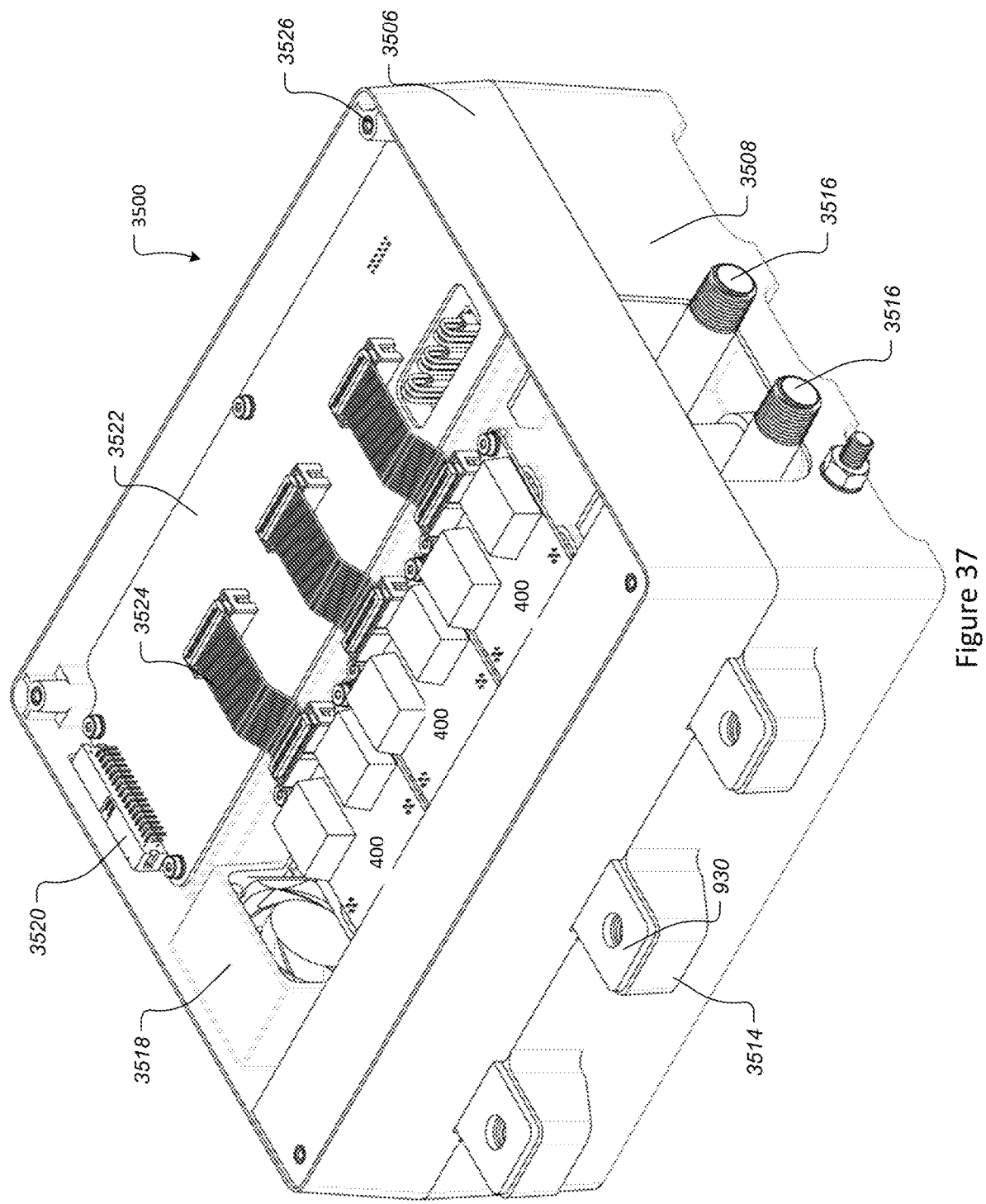
FIG. 37 illustrates a partial perspective view of the configuration of FIG. 35.
Figure 38:
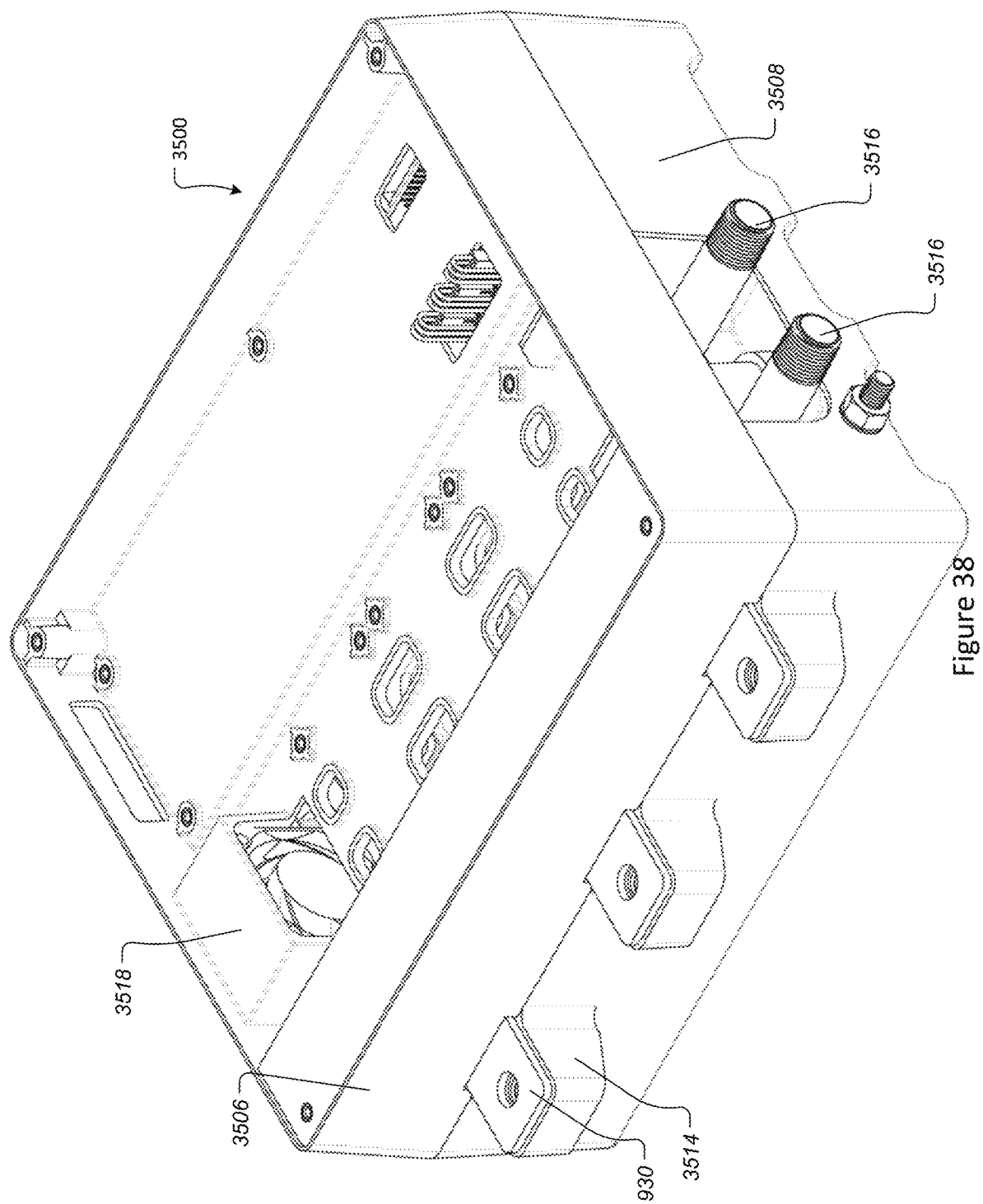
FIG. 38 illustrates another partial perspective view of the configuration of FIG. 35.
Figure 39:
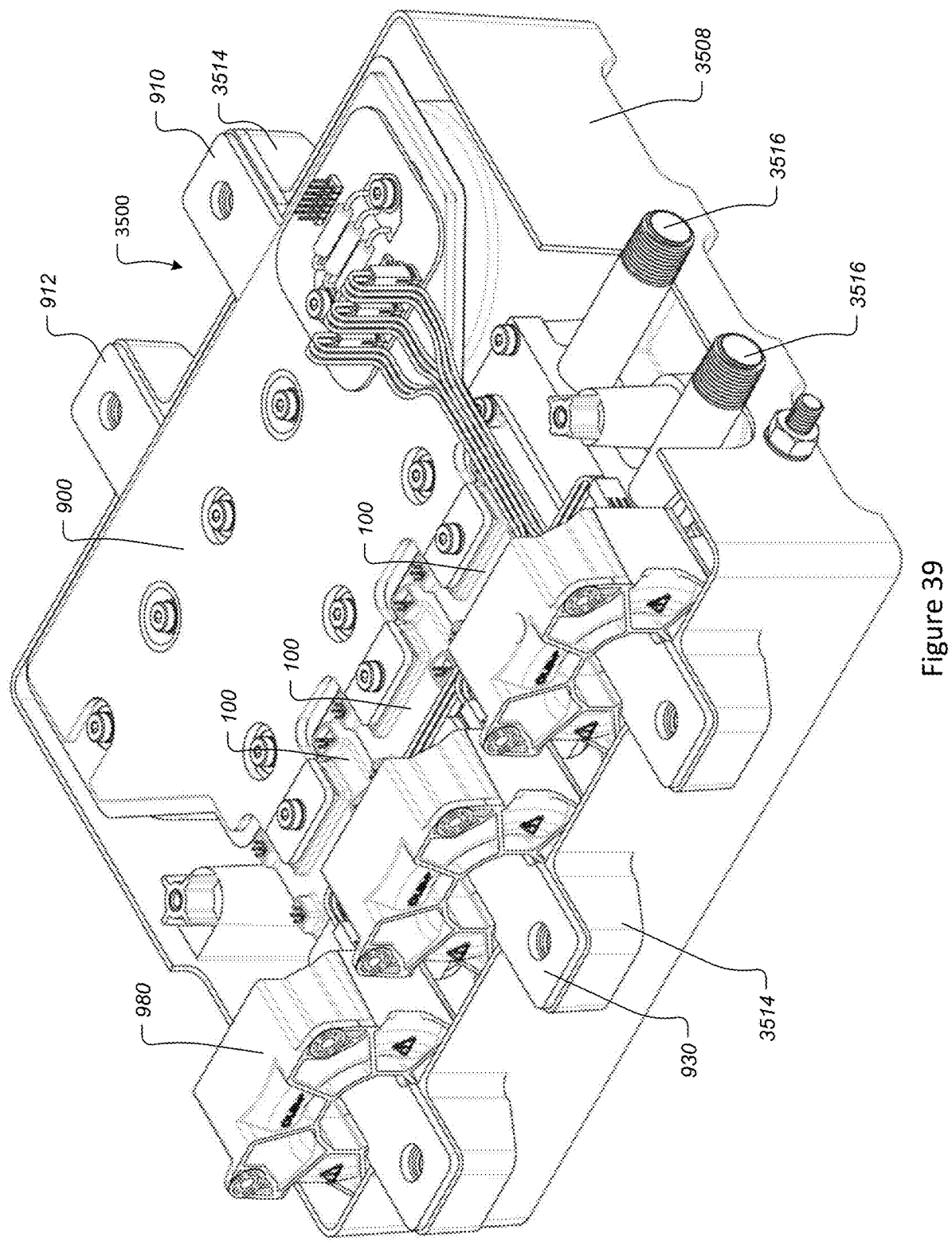
FIG. 39 illustrates another partial perspective view of the configuration of FIG. 35.
Figure 40:
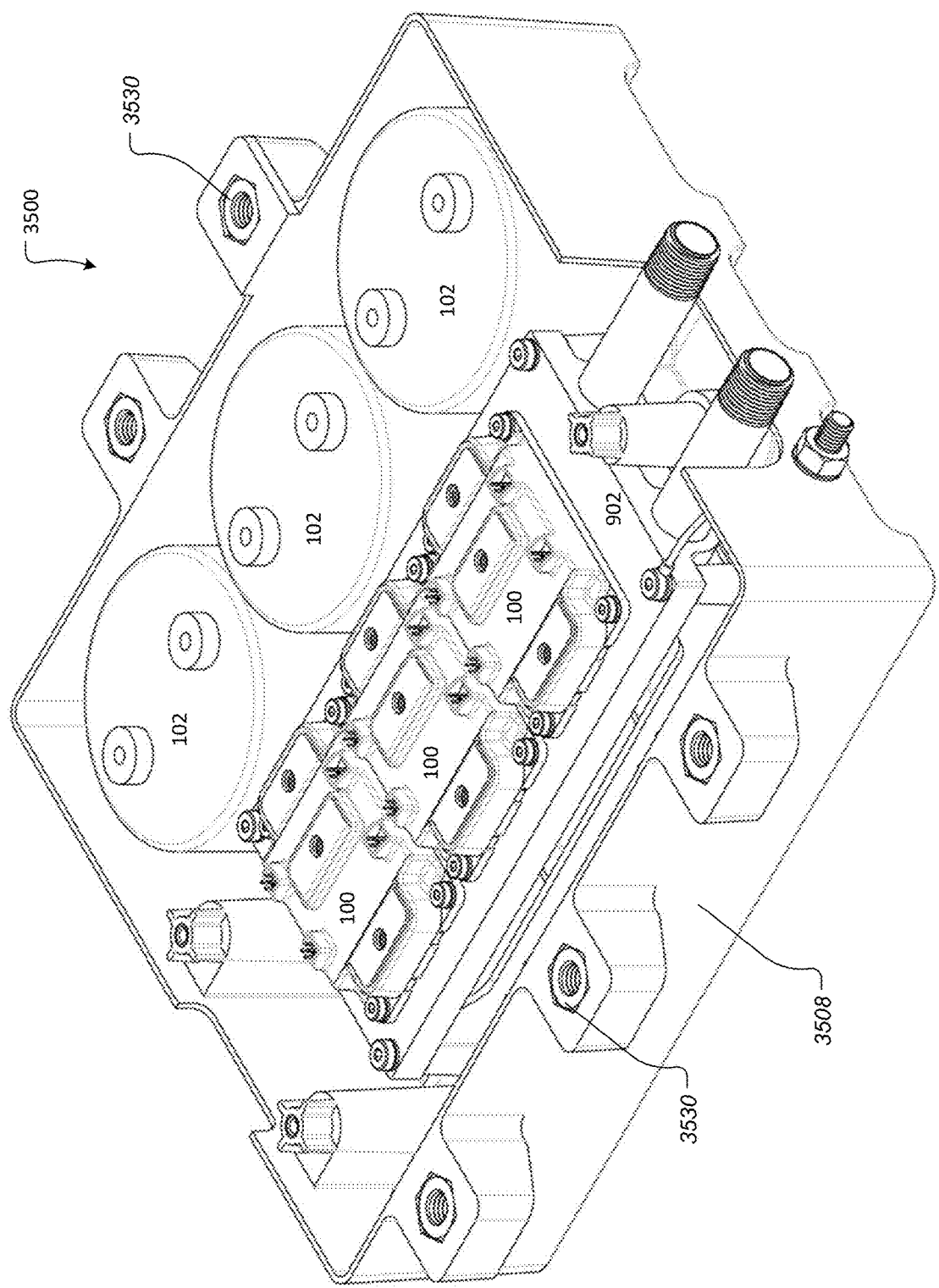
FIG. 40 illustrates another partial perspective view of the configuration of FIG. 35.
Figure 41:
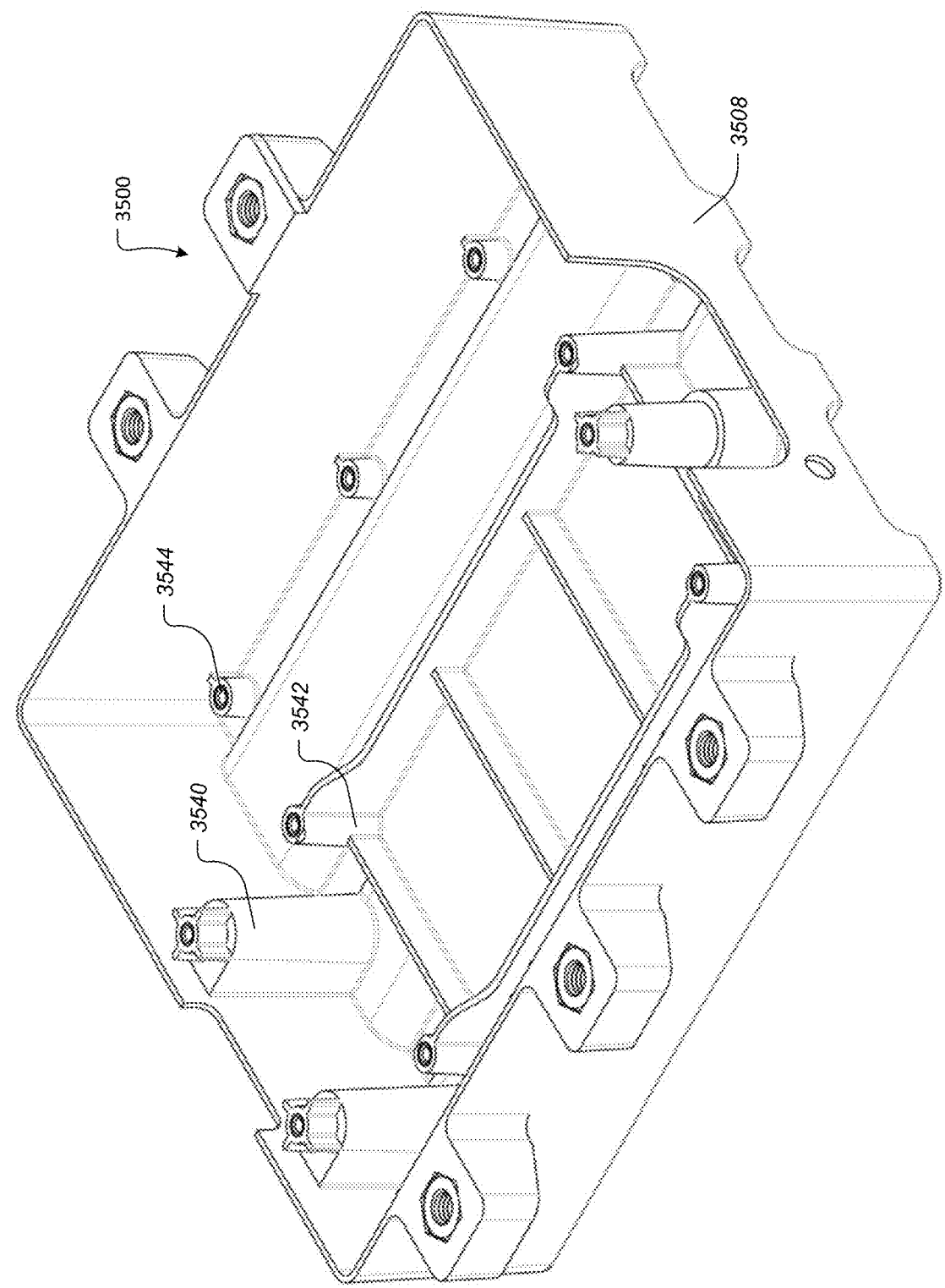
FIG. 41 illustrates another partial perspective view of the configuration of FIG. 35.

FIG. 35 illustrates a perspective view of a configuration that includes power modules and a housing in accordance with an aspect of the disclosure; FIG. 36 illustrates a side view of the configuration of FIG. 35; FIG. 37 illustrates a partial perspective view of the configuration of FIG. 35; FIG. 38 illustrates another partial perspective view of the configuration of FIG. 35; FIG. 39 illustrates another partial perspective view of the configuration of FIG. 35; FIG. 40 illustrates another partial perspective view of the configuration of FIG. 35; and FIG. 41 illustrates another partial perspective view of the configuration of FIG. 35.

In particular, FIGS. 35-40 illustrate a configuration 3500 that may be utilized to implement one or more of the power modules 100, the buss bars 900, the driver 400, a controller for the power modules 100 and the driver 400, the capacitors 102, the sensors 980, and the like. In one aspect, the configuration 3500 may utilize one or more of the power modules 100, the buss bars 900, the driver 400, a controller for the power modules 100 and the driver 400, the capacitors 102, the sensors 980, and the like as described herein. In one aspect, the configuration 3500 may utilize one or more other types of power modules, buss bars, drivers, a controller for the power modules and the driver, capacitors, sensors, and the like.

In one aspect, the configuration 3500 may be implemented in a wide variety of power topologies, including half-bridge, full-bridge, three phase, booster, chopper, DC-DC converters, and like arrangements and/or topologies. In the aspect shown in FIGS. 35-40, the configuration 3500 is illustrated as implementing a three-phase topology.

With particular reference to FIG. 35, the configuration 3500 may include a housing 3502. The housing 3502 may include a top portion 3504, a middle portion 3506, and a bottom portion 3508. However, the housing 3502 may be implemented in fewer or greater number of housing portions. In one aspect, the housing 3502 may be constructed of a synthetic material, a plastic material, a metallic material, or the like. In one aspect, the housing 3502 may be constructed of a plastic material. In one aspect, the housing 3502 may be constructed of a plastic material that may be injection molded.

With further reference to FIG. 35, in one aspect the top portion 3504 may be mechanically fastened to the configuration 3500 with mechanical fasteners 3512. In other aspects, the top portion 3504 may be fastened to the configuration 3500 utilizing other assemblies and/or configurations. In one aspect, the top portion 3504 may include cooling slots 3510 to allow air within the configuration 3500 to flow therethrough for cooling purposes.

With further reference to FIG. 35, in one aspect, the middle portion 3506 may be arranged between the top portion 3504 and the bottom portion 3508. The bottom portion 3508 may be configured to receive the top portion 3504 and the middle portion 3506 to provide an enclosure of the various components of the configuration 3500. In one aspect, the middle portion 3506 and/or the bottom portion 3508 may be further configured to allow the phase outputs 930 to extend therethrough. In other aspects implementing other topologies, the middle portion 3506 and/or the bottom portion 3508 may be further configured to allow the other types of outputs to extend therethrough.

With further reference to FIG. 35, in one aspect the bottom portion 3508 may support the middle portion 3506. In one aspect, the bottom portion 3508 may include supports 3514 to support the phase outputs 930. In another aspect, the bottom portion 3508 may include supports 3514 to support other types of outputs when implementing other topologies.

In one or more aspects, the bottom portion 3508 may further include an aperture 3528 configured to allow fluid connections 3516 to a cold plate 902 to extend therefrom. In one aspect, the fluid connections 3516 may receive a fluid source and/or deliver fluid for cooling purposes in association with the cold plate 902.

With reference to FIG. 36, in one aspect the configuration 3500 may include the conductors 910, 912. In one aspect, the conductors 910, 912 may be arranged on an opposite side of the configuration 3500 to that of the phase outputs 930. In one aspect, the conductors 910, 912 may be arranged on an opposite side of the configuration 3500 to that of the other types of outputs for other types of topologies.

In one aspect, the configuration 3500 may include a cooling fan 3518. The cooling fan 3518 may be configured to move air through the housing 3502 of the configuration 3500 for cooling the various components of the configuration 3500. In one aspect, the cooling fan 3518 may be positioned in an opening on the side of the configuration 3500 such that the cooling fan 3518 moves air through the opening and likewise moves air through the cooling slots 3510 illustrated in FIG. 35.

In one aspect, the configuration 3500 may include an electrical interface 3520. In one aspect, the electrical interface 3520 may connect and exchange data with one or more of the power modules 100, the buss bars 900, the driver 400, the controller for the power modules 100 and the driver 400, the capacitors 102, the sensors 980, and the like. In one aspect, the data may be control signals, sensor signals, drive signals, signals to load, remove, or modify software, and the like. In one aspect, the electrical interface 3520 (or other connectors along this wall) may alternatively or additionally provide low voltage (12-24 V) power for the controller and drivers 400. In a particular aspect, the configuration 3500 may be configured to be connected to a power source at the conductors 910, 912, be fully operated, controlled, and analyzed through the electrical interface 3520, and provide output from the phase outputs 930.

With reference to FIG. 37, the configuration 3500 is shown with the top portion 3504 removed for ease of illustration and understanding. In one aspect, as shown by FIG. 37, the middle portion 3506 may include portions 3526 for receiving the mechanical fasteners 3512. FIG. 37 further illustrates the controller 3522, the drivers 400, and the wired connections 3524 between the controller 3522 and the drivers 400.

With reference to FIG. 38, the configuration 3500 is shown with the controller 3522, the drivers 400, and the wired connections 3524 removed from the middle portion 3506 for ease of illustration and understanding. In particular, FIG. 38 illustrates a surface for supporting the controller 3522, the drivers 400, the wired connections 3524, and the like.

FIG. 39 illustrates the configuration 3500 with the middle portion 3506 removed for ease of illustration and understanding. In particular, FIG. 39 illustrates the arrangement configuration of the buss bars 900, the power modules 100, the cold plate 902, and the sensors 980. In particular, FIG. 39 illustrates the arrangement and configuration of the buss bars 900, the power modules 100, the cold plate 902, and the sensors 980 supported by the bottom portion 3508.

FIG. 40 illustrates the configuration 3500 with the middle portion 3506 and the buss bars 900 removed for ease of illustration and understanding. As shown in FIG. 40, the arrangement of the power modules 100, the cold plate 902, and the sensors 980 is shown for the configuration 3500. In particular, FIG. 40 illustrates components 3530 for securing attachment of input and output connections to the phase outputs 930 and the conductors 910. In one aspect, the components 3530 for securing attachment may be a mechanical fastener. In one aspect, the mechanical fastener may be a female threaded component configured to receive the corresponding threaded male component. In one aspect, mechanical fastener may be a hex nut.

FIG. 41 illustrates the configuration 3500 with the middle portion 3506, the buss bars 900, the power modules 100, the cold plate 902, and the sensors 980 removed for ease of illustration and understanding. As shown in FIG. 41, the bottom portion 3508 of the configuration 3500 may include structures 3540 for connecting to the middle portion 3506. As shown in FIG. 41, the bottom portion 3508 of the configuration 3500 may include structures 3542 for holding at least the power modules 100 and the cold plate 902. As shown in FIG. 41, the bottom portion 3508 of the configuration 3500 may include structures 3544 for at least holding the capacitors 102. In some aspects, the structures may be ribs, reinforcement portions, mechanical fastener receiving portions, and the like.

In one aspect, the configuration 3500 may be implemented as an evaluation system, an evaluation kit, a test system, or the like. This implementation being defined broadly as an evaluation kit for brevity. In a particular aspect, the evaluation kit implementation of the configuration 3500 may be configured to be connected to a power source at the conductors 910, 912, be fully operated, controlled, and analyzed through the electrical interface 3520, and provide output from the phase outputs 930. In this regard, a user may implement the evaluation kit implementation of the configuration 3500 in order to perform tests, mockups, and the like prior to implementing and manufacturing a system implementing the power module 100 of the disclosure. In one aspect, a user may implement the evaluation kit implementation of the configuration 3500 in order to perform tests, mockups, and the like with respect to a particular application of the power module 100. In one aspect, the application may be a power system, a motor system, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, and electric vehicles (EVs), a converter, and the like.

Figure 42:
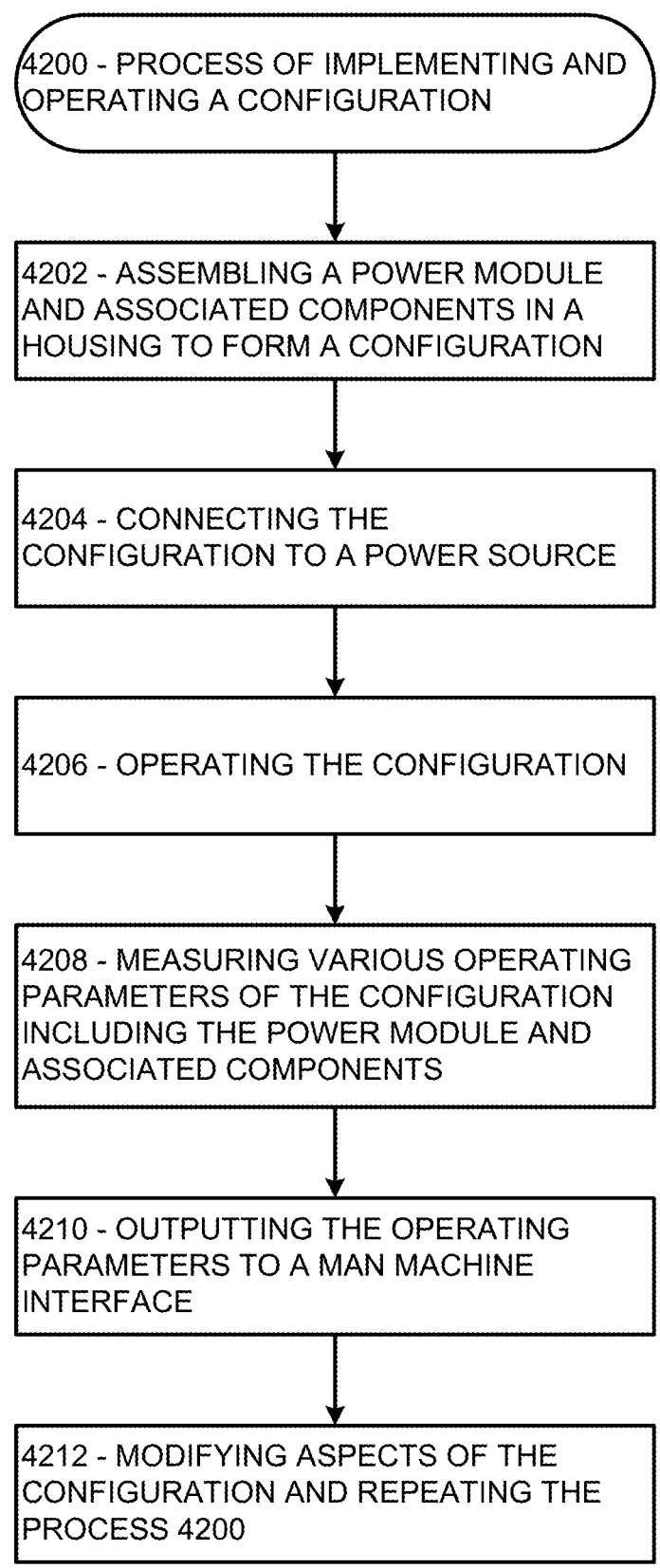
FIG. 42 illustrates a process of implementing and operating a configuration that includes a power module.

FIG. 42 illustrates a process of implementing and operating a configuration that includes a power module. In particular, FIG. 42 illustrates a process 4200 of implementing and operating a configuration. In one aspect, the process 4200 may be implemented utilizing the configuration 3500 disclosed herein.

The process 4200 may further include assembling a power module 100 and associated components in a housing 3502 to form a configuration 3500 as illustrated in box 4202. In one aspect, the configuration 3500 may be assembled to include one or more of the power modules 100, the buss bars 900, the driver 400, a controller for the power modules 100 and the driver 400, the capacitors 102, the sensors 980, and the like. In one aspect, the configuration 3500 may be assembled with one or more of the power modules 100, the buss bars 900, the driver 400, a controller for the power modules 100 and the driver 400, the capacitors 102, the sensors 980, and the like as described herein. In one aspect, the configuration 3500 may be assembled to include one or more other types of power modules, buss bars, drivers, a controller for the power modules and the driver, capacitors, sensors, and the like.

The process 4200 may further include connecting the configuration to a power source 4204. In one aspect, the conductors 910, 912 of the configuration 3500 may be connected to a power source. In one aspect, the conductors 910, 912 of the configuration 3500 may be connected to a DC power source.

The process 4200 may further include operating 4206 the configuration 3500. In one aspect, the configuration 3500 may be operated such that one or more of the power modules 100, the buss bars 900, the driver 400, a controller for the power modules 100 and the driver 400, the capacitors 102, the sensors 980, and the like provide output. In one aspect, the configuration 3500 may be programmed to implement the aspect of operating 4206 the configuration 3500. In one aspect, the controller of the configuration 3500 may be programmed to implement the aspect of operating the configuration 3500. In one aspect, the driver 400 of the configuration 3500 may be programmed to implement the aspect of operating the configuration.

The process 4200 may further include measuring various operating parameters 4208 of the configuration 3500 including the power module 100 and associated components. In one aspect, the configuration 3500 may be operated such that the various internal sensors output sensor data. In one aspect, the configuration 3500 may be operated and connected to external sensors that output sensor data such as oscilloscopes, computer systems, and the like. In one aspect, the various sensor data may be collected by a computer system. The computer system may include a processor, memory, operating system, and the like. In one or more aspects, the output sensor data may be based on and/or include switching losses, temperatures, inductances, switching speed, overshoot, waveform analysis, and the like related to the power module 100 or other components implemented by the configuration 3500. In one aspect, measuring various operating parameters 4208 of the configuration 3500 may be with respect to a particular application of the power module 100. In one aspect, the application may be a power system, a motor system, an automotive motor system, a charging system, an automotive charging system, a vehicle system, an industrial motor drive, an embedded motor drive, an uninterruptible power supply, an AC-DC power supply, a welder power supply, military systems, an inverter for wind turbines, solar power panels, tidal power plants, and electric vehicles (EVs), a converter, and the like.

The process 4200 may further include outputting 4210 the operating parameters to a man machine interface. In one aspect, the operating parameters may be analyzed by the computer system. In one aspect, the computer system may analyze the operating parameters including the sensor data to generate an output. In one aspect, the output may be provided to a man machine interface. In one aspect, the man machine interface may include one or more of a display, a print out, an analysis file, and the like.

The process 4200 may further include modifying aspects of the configuration 4212 and repeating the process 4200. In one aspect, the configuration 3500 may be modified to include additional components consistent with the disclosure. In one aspect, the configuration 3500 may be modified to include fewer components consistent with the disclosure. In one aspect, the controller program of the configuration 3500 may be modified. In one aspect, the driver 400 program of the configuration 3500 may be modified. In one aspect, operating voltages or currents for the configuration 3500 may be modified.

In one or more aspects, the power module 100 of the disclosure may be configured to operate with various performance characteristics. However, the performance characteristics may not necessarily be limited to the particular implementations and aspects set forth in the disclosure. The various performance characteristics are described below as well as exemplary details of an exemplary construction and implementation that may provide in part the performance characteristics. However, the various performance characteristics should not be limited to the particular disclosed aspects of the power module 100. In certain aspects, the various performance characteristics and exemplary construction implementations may be associated with lower voltage implementations. In one aspect, lower voltage implementations may be defined to include implementations operating less than 3.4 Kv. In one aspect, lower voltage implementations may be defined to include implementations operating less than 3.3 Kv. In one aspect, lower voltage implementations may be defined to include implementations operating less than 3.0 Kv. In one aspect, the lower voltage implementations include implementations operating in a range of 100 v-3400 v, 100 v-3300 v, 100 v-3000 v, 100 v-2500 v, 100 v-2000 v, and 100 v-1700 v. In one aspect, higher voltage implementations may be defined to include implementations operating greater than 3.4 Kv. In one aspect, higher voltage implementations may be defined to include implementations operating greater than 3.3 Kv. In one aspect, higher voltage implementations may be defined to include implementations operating greater than 3.0 Kv. In one aspect, the higher voltage implementations include implementations operating in a range of 3400 v-5000 v, 3300 v-5000 v, 3000 v-5000 v, 3400 v-10000 v, 3300 v-10000 v, 3000 v-10000 v. In this regard, aspects of the disclosure implementing lower voltage implementations as defined herein may be distinguished from higher voltage implementations as defined herein. For example, in some aspects lower voltage implementations may be distinguished from higher voltage implementations based on one or more of the following: a spacing between conductors and/or terminals of the power module 100, configurations of power loops within the power module 100, a fundamental layout of the power module 100, a current carrying capacity and/or current carrying capabilities of the power module 100, a substrate thickness of the power module 100, a terminal layout of the power module 100, thermal performance of the power module 100, configurations for addressing creepage issues of the power module 100, configurations for addressing clearance issues of the power module 100, insulation configurations of the power module 100, bus bar configurations of the power module 100, and/or the like. In this regard, at least one or more of the above noted aspects may distinguish the low-voltage implementation from the high-voltage implementation.

In one or more aspects, the power module 100 of the disclosure may be configured to operate with the following parasitic stray inductance. In one aspect, a total stray inductance value of the critical power switch in loop 114 illustrated in FIG. 1B of the power module 100 may be less than 12 (nH). In one aspect, a total stray inductance value of the critical power switch in loop 114 illustrated in FIG. 1B of the power module 100 may be less than 11 (nH). In one aspect, a total stray inductance value of the critical power switch in loop 114 illustrated in FIG. 1B of the power module 100 may be less than 7 (nH). In one aspect, a total stray inductance value of the critical power switch in loop 114 illustrated in FIG. 1B of the power module 100 may be less than 4 (nH). In one aspect, a total stray inductance value of the critical power switch in loop 114 illustrated in FIG. 1B of the power module 100 may be less than 3 (nH).

In one aspect, a total stray inductance value of the critical power switch in loop 114 illustrated in FIG. 1B of the power module 100 may have a range of 12 (nH) to 2 (nH), 10 (nH) to 2 (nH), and 4 (nH) to 2 (nH).

In one aspect, a total stray inductance value of the critical power switch in loop 114 illustrated in FIG. 1B of the power module 100 may be less than 4 (nH) for a power module 100 having particular loop lengths and/or cross-sectional areas. In one aspect, a total stray inductance value of the critical power switch in loop 114 illustrated in FIG. 1B of the power module 100 may be less than 8 (nH) for a power module 100 having particular loop lengths and/or cross-sectional areas. In one aspect, a total stray inductance value of the critical power switch in loop 114 illustrated in FIG. 1B of the power module 100 may be less than 12 (nH) for a power module 100 having particular loop lengths and/or cross-sectional areas. In one aspect, a total stray inductance value of the critical power switch in loop 114 illustrated in FIG. 1B of the power module 100 may have a range of 4 (nH) to 2 (nH) for a power module 100 having particular loop lengths and/or cross-sectional areas. In one aspect, a total stray inductance value of the critical power switch in loop 114 illustrated in FIG. 1B of the power module 100 may have a range of 8 (nH) to 4 (nH) for a power module 100 having particular loop lengths and/or cross-sectional areas. In one aspect, a total stray inductance value of the critical power switch in loop 114 illustrated in FIG. 1B of the power module 100 may have a range of 12 (nH) to 8 (nH) for a power module 100 having particular loop lengths and/or cross-sectional areas.

In one or more aspects, the power module 100 of the disclosure may be configured to operate with the following switching speed.

In one aspect, the switching speed of the power module 100 may be less than 100 (A/ns) di/dt. In one aspect, the switching speed of the power module 100 may be less than 90 (A/ns) di/dt. In one aspect, the switching speed of the power module 100 may be less than 80 (A/ns) di/dt. In one aspect, the switching speed of the power module 100 may be less than 50 (A/ns) di/dt. In one aspect, the switching speed of the power module 100 may be less than 35 (A/ns) di/dt.

In one aspect, the switching speed of the power module 100 may have a range of 30 to 100 (A/ns) di/dt. In one aspect, the switching speed of the power module 100 may have a range of 30 to 70 (A/ns) di/dt. In one aspect, the switching speed of the power module 100 may have a range of 40 to 90 (A/ns) di/dt. In one aspect, the switching speed of the power module 100 may have a range of 30 to 40 (A/ns) di/dt.

In one aspect, the switching speed of the power module 100 may be less than 120 (V/ns) dv/dt. In one aspect, the switching speed of the power module 100 may be less than 100 (V/ns) dv/dt. In one aspect, the switching speed of the power module 100 may have a range of 20 (V/ns) dv/dt to 100 (V/ns) dv/dt. In one aspect, the switching speed of the power module 100 may have a range of 40 (V/ns) dv/dt to 100 (V/ns) dv/dt. In one aspect, the switching speed of the power module 100 may have a range of 60 (V/ns) dv/dt to 100 (V/ns) dv/dt. In one aspect, the switching speed of the power module 100 may have a range of 80 (V/ns) dv/dt to 100 (V/ns) dv/dt. In one aspect, the switching speed of the power module 100 may have a range of 60 (V/ns) dv/dt to 80 (V/ns) dv/dt. In one aspect, the switching speed of the power module 100 may have a range of 40 (V/ns) dv/dt to 60 (V/ns) dv/dt. In one aspect, the switching speed of the power module 100 may have a range of 20 (V/ns) dv/dt to 40 (V/ns) dv/dt. In one aspect, the switching speed of the power module 100 may have a range of 60 (V/ns) to 80 (V/ns), 40 (V/ns) to 60 (V/ns), 20 (V/ns) to 40 (V/ns).

In one or more aspects, the power module 100 of the disclosure may be configured to operate with the following switching losses.

In one aspect, the switching losses of the power module 100 may be less than 0.5 (mJ/A) milli-joules per amp. In one aspect, the switching losses of the power module 100 may be less than 0.4 (mJ/A) milli-joules per amp. In one aspect, the switching losses of the power module 100 may be less than 0.25 (mJ/A) milli-joules per amp. In one aspect, the switching losses of the power module 100 may have a range of 0.5 (mJ/A) milli-joules per amp to 0.25 (mJ/A) milli-joules per amp. In one aspect, the switching losses of the power module 100 may have a range of 0.25 (mJ/A) milli-joules per amp to 0.4 (mJ/A) milli-joules per amp.

In aspects of the disclosure, the power module 100 width and length may be scalable such that the power module 100 may be configured wider (more power devices 302, less inductance) or smaller (smaller size, lower cost). The following table shows a various range implementations, including a minimum practical width and maximum expected size (roughly a square footprint). The power device utilization may be defined as a percentage calculated by a ratio of the power device area to the total power module area. In one aspect, the area utilized in this disclosure is calculated by multiplying width times length. In this regard, the width may be defined along an axis extending across the power module 100 as illustrated in FIG. 11; and the length may be defined along an axis perpendicular to the width as illustrated in FIG. 11. The table below provides a particular set of non-limiting specifications.

|  | # of Devices (Per Position) | Width (mm) | Length (mm) | Height (mm) | Area (cm²) | Volume (cm³) | Device Utilization (%) |
| --- | --- | --- | --- | --- | --- | --- | --- |
| Aspect 1 | 3 | 42.0 | 74.0 | 15.75 | 31.1 | 49.0 | 6.1 |
| Aspect 2 | 5 | 53.0 | 80.0 | 15.75 | 42.4 | 66.8 | 7.5 |
| Aspect 3 | 10 | 80.5 | 80.0 | 15.75 | 64.4 | 101.4 | 9.8 |

In one aspect of the disclosure, the power module 100 may have a power device utilization area in the range of 7-10%. In one aspect of the disclosure, the power module 100 may have a power device utilization area in the range of 6-8%. In one aspect of the disclosure, the power module 100 may have a power device utilization area in the range of 5-7%.

In various aspects, the power module 100 height may also scalable. In this case, the power module 100 may be configured to be as thin as possible to minimize inductance. The height may be set based on (A) the creepage and clearance specifications required for 1700 V operation, (B) the height of the wire bonds, and (C) the type of encapsulation material used. For a lower range voltage module (650 V), some design changes may be made to reduce the height. Conversely, the power module 100 may be made taller for higher range voltage devices. In various aspects, the height as utilized in this disclosure is defined as being perpendicular to the width and the length. With reference to FIG. 4A, an exemplary height of the power module 100 is illustrated. The height of the power module may be in the range of 7 mm to 30 mm, 9 mm to 11 mm, 11 mm to 13 mm, 13 mm to 15 mm, 15 mm to 17 mm, 17 mm to 19 mm, 19 mm to 21 mm, 21 mm to 23 mm, and 23 mm to 27 mm. The table below provides a particular set of non-limiting specifications.

|  | Max. Voltage (V) | Height (mm) |
| --- | --- | --- |
| Aspect 1 | 650 | 10.00 |
| Aspect 2 | 1700 | 15.75 |
| Aspect 3 | 3300 | 25.00 |

Power Contact Parameters

The power contacts or terminals 106, 108, 110 may be configured and constructed to be wide and to fill the maximum percentage of the power module 100 with as possible given practical voltage creepage/clearance limitations. The width ratio compares the width of the contact or terminals 106, 108, 110 relative to the power module 100 width. In one aspect, the power module 100 width may be a width of the base plate 602. In one aspect, the power module 100 width may be a width of the one or more power substrates 606. In one aspect, the power module 100 width may be a width between the housing sidewalls 612. In one aspect, the power module 100 width may be a width of the housing lid 618. The length ratio takes the contact length of all three contacts or terminals 106, 108, 110 and compares it to the total power module 100 length. In one aspect, the power module 100 length may be a length of the base plate 602. In one aspect, the power module 100 length may be a length of the one or more power substrates 606. In one aspect, the power module 100 length may be a length between the housing sidewalls 612. In one aspect, the power module 100 length may be a length of the housing lid 618. The area ratio compares the total contact area to the total power module 100 area. In one aspect, the power module 100 area may be an area of the base plate 602. In one aspect, the power module 100 area may be an area of the one or more power substrates 606. In one aspect, the power module 100 area may be an area between the housing sidewalls 612. In one aspect, the power module 100 area may be an area of the housing lid 618. The base ratio compares the total contact base width to the power module 100 width. This assumes a solder fillet around the perimeter of the base. In one aspect, the power module 100 width may be a width of the base plate 602. In one aspect, the power module 100 width may be a width of the one or more power substrates 606. In one aspect, the power module 100 width may be a width between the housing sidewalls 612. In one aspect, the power module 100 width may be a width of the housing lid 618. The table below provides a particular set of non-limiting specifications.

|  | # of Devices (Per Position) | Tab Width (mm) | Tab Length (mm) | Thickness (mm) | Tab Area (mm²) | Section Area (mm²) | Width Ratio (%) | Length Ratio (%) | Area Ratio (%) | Base Ratio (%) |
|---|---|---|---|---|---|---|---|---|---|---|
| Aspect 1 | 3 | 18.5 | 12.5 | 1 | 231.3 | 18.5 | 44.0 | 50.7 | 22.3 | 75.7 |
| Aspect 2 | 5 | 29.5 | 12.5 | 1 | 368.8 | 29.5 | 55.7 | 46.9 | 26.1 | 84.7 |
| Aspect 3 | 10 | 57.0 | 12.5 | 1 | 712.5 | 57.0 | 70.8 | 46.9 | 33.2 | 92.1 |

In one aspect, the power module 100 may have a terminal area ratio of greater than 20%. In one aspect, the power module 100 may have a terminal area ratio of greater than 25%. In one aspect, the power module 100 may have a terminal area ratio of greater than 30%. In one aspect, the power module 100 may have a terminal area ratio in a range of 20% to 25%. In one aspect, the power module 100 may have a terminal area ratio in a range of 25% to 30%. In one aspect, the power module 100 may have a terminal area ratio in a range of 30% to 35%.

In one aspect, the power module 100 may have a base ratio in a range of 70% to 80%. In one aspect, the power module 100 may have a base ratio in a range of 80% to 90%. In one aspect, the power module 100 may have a base ratio in a range of 90% to 95%.

In various aspects, the base 636 may be configured to 'feather' or 'digitate' the feet of the contact. In some aspects, the split feet of the base 636 may provide more room for solder to fillet around the sides of the connector, adding strength in multiple directions and axes. The split base 636 may break up the stress and may improve reliability.

The vertical offset 702 of the V+ and V− power contacts may be used to minimize the total loop inductance of a system by reducing a need for bends or offsets in the external bus bar 900. In some aspects, the reduced bus bar 900 complexity may also reduce cost. In one aspect, the vertical offset 702 may be 3.25 mm (3 mm for the metal thickness and 0.25 mm for the laminated isolation). In other aspects, the vertical offset 702 may have the following practical ranges 2 mm-3 mm, 3 mm-4 mm, 4 mm-5 mm, and 5 mm-6 mm. The table below provides a particular set of non-limiting specifications.

| Bus Bar Thickness (mm) | Isolation Thickness (mm) |
|---|---|
| 2 | 0.125 |
| 3 | 0.25 |
| 4 | 0.375 |
| 5 | 0.5 |

Substrate Parameters

The power substrate 606 may also be configured to be wide and as full of power devices 302 as possible. Aspects of the disclosure include a high device area/substrate area utilization. The power device 302 spacing may be determined by heat spreading, thermal performance, processing design rules for optimal manufacturability, and the like. The power device ratio compares the active device area in comparison to the total power substrate 606 width. In this regard, the width may be defined along an axis extending through a plurality of power devices 302 as illustrated in FIG. 11. A portion of the power substrate 606 width may be used for the overcurrent and temperature sensor 610. In some aspects, the power device ratio percentage number may be increased without those features. In one aspect, the power module 100 may have an active device area of greater than 60%. In one aspect, the power module 100 may have an active device area of greater than 65%. In one aspect, the power module 100 may have an active device area of greater than 70%. In one aspect, the power module 100 may have an active device area of 60% to 65%. In one aspect, the power module 100 may have an active device area of 65% to 70%. In one aspect, the power module 100 may have an active device area of 70% to 75%. The table below provides a particular set of non-limiting specifications.

|  | # of Devices (Per Position) | Trace Width (mm) | Trace Length (mm) | Thickness (mm) | Section Area (mm²) | Device Ratio (%) |
|---|---|---|---|---|---|---|
| Aspect 1 | 3 | 20.5 | 16.5 | 0.2 | 4.10 | 63.8 |
| Aspect 2 | 5 | 31.5 | 22.5 | 0.2 | 6.30 | 69.2 |
| Aspect 3 | 10 | 59.0 | 22.5 | 0.2 | 11.80 | 73.9 |

In some aspects, the power substrate 606 metal thickness may be configured as follows. In various aspects, the thickness of the metal maybe a tradeoff with thermal performance, package resistance, cost, and the like. In one aspect, the power substrate 606 metal thickness may be less than 0.5 mm. In one aspect, the power substrate 606 metal thickness may be less than 0.3 mm. In one aspect, the power substrate 606 metal thickness may be 0.2 mm. In one aspect, the power substrate 606 metal thickness may be in the range of 0.1 mm to 0.6 mm, 0.2 mm to 0.3 mm, 0.3 mm to 0.4 mm, 0.4 mm to 0.5 mm, and 0.5 mm to 0.6 mm.

Wire Bond Parameters

The power wire bonds 628 may be any of the diameters listed in the table below. In one aspect, 12 mil (0.30 mm) diameter aluminum bonds may be utilized. In one aspect, a diameter of the bond bonds may be 0.15 mm to 0.25 mm, 0.2 mm to 0.3 mm, 0.25 mm to 0.35 mm, 0.35 mm to 0.45 mm, and 0.45 mm to 0.55 mm. In other aspects, larger diameter aluminum bonds as well as large diameter copper bonds may be utilized. In further aspects, soldered copper tabs may be utilized for the maximum current capability. In one aspect, a diameter of the power wire bonds 628 may be in the range 0.15 mm to 0.6 mm. In one aspect, a diameter of the power wire bonds 628 may be in the range 0.19 mm to 0.52 mm. In one aspect, a diameter of the power wire bonds 628 may be in the range 0.2 mm to 0.51 mm. The table below provides a particular set of non-limiting specifications.

| Diameter | |
|---|---|
| (mil) | (mm) |
| 8 | 0.20 |
| 10 | 0.25 |
| 12 | 0.30 |
| 15 | 0.38 |
| 20 | 0.51 |

In one aspect, the power wire bonds 628 may include aluminum wire bonds, aluminum ribbon bonds, copper wire bonds, copper ribbon bonds, copper soldered, copper sintered tabs, and the like as illustrated in the table below.

| Material | Implementation |
|---|---|
| Aluminum | Wire |
| Aluminum | Ribbon |
| Copper | Wire |
| Copper | Ribbon |
| Copper | Soldered/Sintered Tab |

In particular aspects, the wire bond 628 may be configured to have loop geometry as listed in the table below. In various aspects, the loop geometry may be configured to be as low profile and as short as possible to minimize resistance. The bond length is determined by the placement of the die of the power device 302 and the power module 100 configuration. In one aspect, the wire bond length may have a range 4 mm to 12 mm. In one aspect, the wire bond length may have a range 5 mm to 11 mm. In one aspect, the wire bond loop height may have a range 0.5 mm to 3 mm. In one aspect, the wire bond loop height may have a range 1 mm to 2.5 mm. The table below provides a particular set of non-limiting specifications.

| | Bond Length (mm) | Loop Height (mm) |
|---|---|---|
| Aspect 1 | 5.5 | 1.2 |
| Aspect 2 | 10.0 | 2.0 |

In one aspect, the configuration may utilize an increased or maximum number of bonds 628 per power device 302. The number of bonds 628 may depend on the size of the die, the pad area, and the bond diameter. The table below provides a particular set of non-limiting specifications. In particular, the values listed below are for differing size implementations of MOSFETs.

| | Bonds Per Power Device (#) |
|---|---|
| Aspect 1 | 4 |
| Aspect 2 | 10 |

In one aspect, each power device 302 may be implemented to have 3 to 12 bonds 628. In one aspect, each power device 302 may be implemented to have 4 to 10 bonds 628. In one aspect, each power device 302 may be implemented to have more than 4 bonds 628. In one aspect, each power device 302 may be implemented to have more than 6 bonds 628. In one aspect, each power device 302 may be implemented to have more than 8 bonds 628. In one aspect, each power device 302 may be implemented to have more than 10 bonds 628.

Inductance & Switching Parameters

The inductance of the power module 100 may be determined by the total loop length, cross sectional area, flux cancellation, and the like. In various aspects, the power module 100 may be configured to minimize the inductance by configuring the power module 100 to have a low profile, using wide power contacts, and achieving some flux cancellation in the power module 100 as the loop folds back over itself. The width of the power module 100 may have a large influence on the inductance as well.

The table below is based on a particular implementation of the power module 100 and provides inductance and other simulation results to determine the inductance of the other configurations. The lowest inductance configuration assumes that the power module 100 may be configured thinner as well (i.e. the 650 V thickness listed previously). The dV/dt maximum is not a limitation for the power module 100.

The di/dt value was calculated to be a theoretical maximum assuming a 1200 V device and an 800 V bus. This may result in a maximum of 400 V of possible overshoot. In this regard, the calculations have assumed a 2 nH bus loop inductance, which is added in series with the power module 100. Assuming this, in one aspect the fastest the power module 100 may switch is listed in the table below.

In one or more aspects, loss has been determined from testing a particular implementation using very aggressive switching. In one aspect, the loss may have a range 0.25 to 0.050 mJ/A, 0.25 to 0.040 mJ/A, and 0.25 to 0.035 mJ/A. The table below provides a particular set of non-limiting specifications.

| | # of Devices (Per Position) | Inductance (nH) | dV/dt max (V/ns) | di/dt max (A/ns) | Loss (mJ/A) |
|---|---|---|---|---|---|
| Aspect 1 | 3 | 10.0 | <100* | 33.33 | |
| Aspect 2 | 5 | 6.7 | <100* | 45.98 | 0.3 |
| Aspect 3 | 10 | 3.2 | <100* | 76.92 | |
| Aspect 4 | 10 | 2.5 | <100* | 88.89 | |

In aspect 1, a total stray inductance value of the power module 100 may have a range of 9 (nH) to 11 (nH). In aspect 2, a total stray inductance value of the power module 100 may have a range of 6 (nH) to 7 (nH). In aspect 3, a total stray inductance value of the power module 100 may have a range of 3 (nH) to 4 (nH). In aspect 4, a total stray inductance value of the power module 100 may have a range of 2 (nH) to 3 (nH).

FIGS. 43-58 illustrate a power module according to an aspect of the disclosure.

In this regard, due to the high current density of the power devices 302 and other components, a thermal performance of the power module 100 of FIGS. 43-58 may be configured for maximizing heat flux, reducing system size, reducing cost, and the like. In particular, the power module 100 illustrated in FIGS. 43-58 may include any one or more of the aspects as disclosed herein. Moreover, the power module 100 of FIGS. 43-58 may be further configured for direct cooling for maximizing heat flux, reducing system size, reducing cost, and the like. Additionally, implementing direct cooling with the power module 100 may remove or eliminate a thermal interface between the power module 100 and a cold plate or heat sink, as well as any material or structures arranged between a cold plate top surface and the cooling fluid. In this regard, prior art implementations included a thermal interface material (TIM) arranged in the interface between a power module and the cold plate, and utilization of the TIM could have issues with application to the surfaces, aging, pump-out, and the like. By directly cooling the base plate 602 surface of the power module 100, a greater amount of heat flux can be processed in the power module 100 and associated structure.

In one aspect, the power module 100 may include a plurality of pin fins 642. In one aspect, the plurality of pin fins 642 may be configured for transferring heat from one or more components of the power module 100. In one aspect, the plurality of pin fins 642 may be configured for cooling of one or more components of the power module 100. In one aspect, the plurality of pin fins 642 may be configured for direct cooling of one or more components of the power module 100. In one aspect, the plurality of pin fins 642 may be configured for direct cooling of one or more components of the power module 100 in conjunction with a cold plate 902. In one aspect, the plurality of pin fins 642 may be configured for allowing coolant to pass through the pin fins 642.

In one aspect, the base plate 602 may include the plurality of the pin fins 642. In one aspect, the plurality of pin fins 642 may be arranged on a surface of the base plate 602. In one aspect, the plurality of pin fins 642 may be arranged on a bottom surface of the base plate 602. In one aspect, the plurality of pin fins 642 may be arranged on a bottom surface of the base plate 602 on a side of the base plate 602 opposite the housing sidewalls 612.

In one aspect, the plurality of pin fins 642 may form channels parallel to an axis 654. In one aspect, the plurality of pin fins 642 may form channels parallel to an axis 656. In one aspect, the plurality of pin fins 642 may form channels that are staggered or angled with respect to the axis 654. In one aspect, the plurality of pin fins 642 may form channels that are staggered or angled with respect to the axis 656.

The arrangement of the plurality of pin fins 642 and the channels arranged between the plurality of pin fins 642 may be configured to increase or encourage movement of the coolant about the plurality of pin fins 642, heat transfer from the plurality of pin fins 642 to the coolant, a reduction of a surface layer and/or a barrier layer adjacent the plurality of pin fins 642 to increase heat transfer, and the like.

Figure 46:
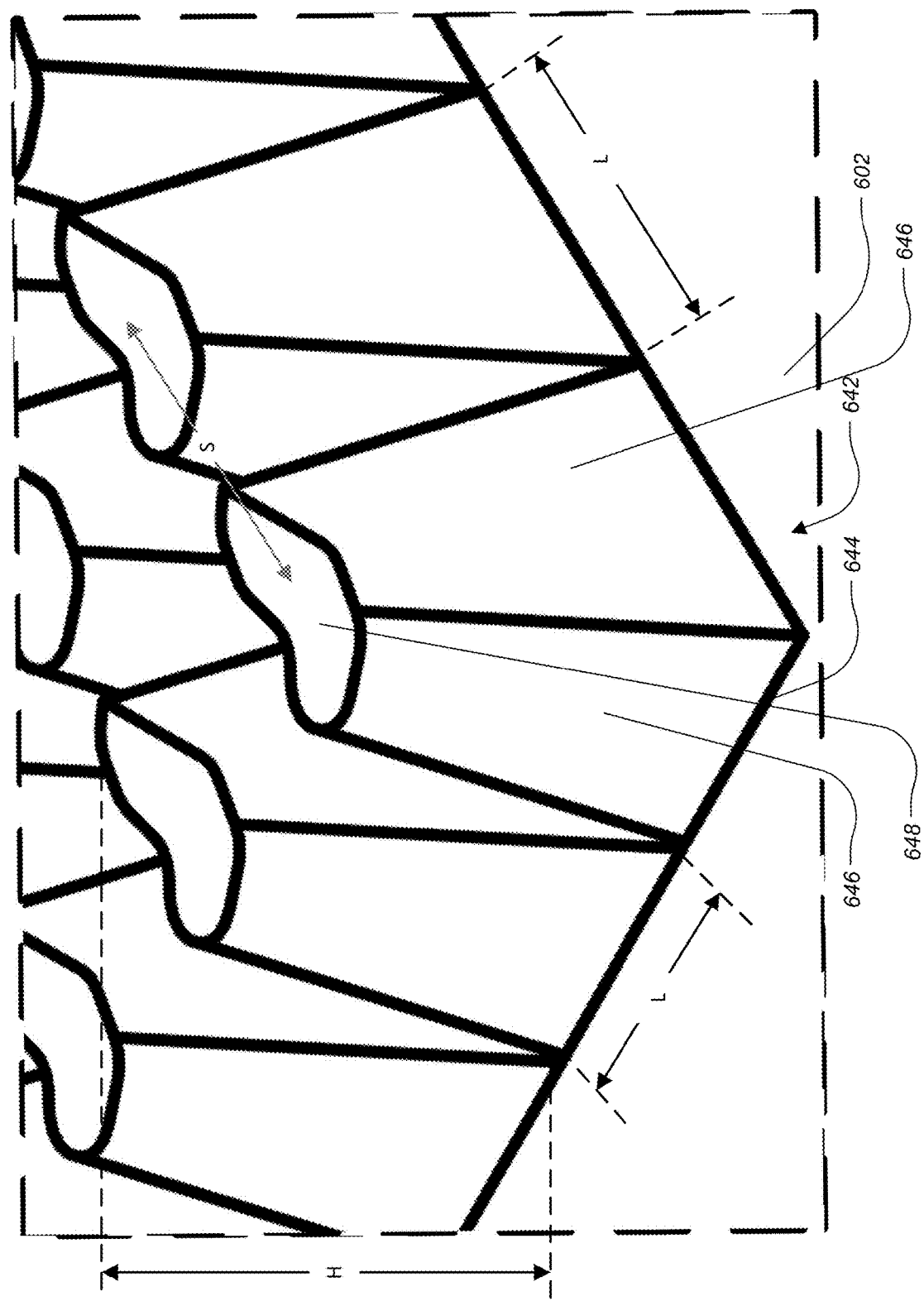
FIG. 46 illustrates a partial perspective bottom side view of a power module according to FIG. 43.
Figure 50:
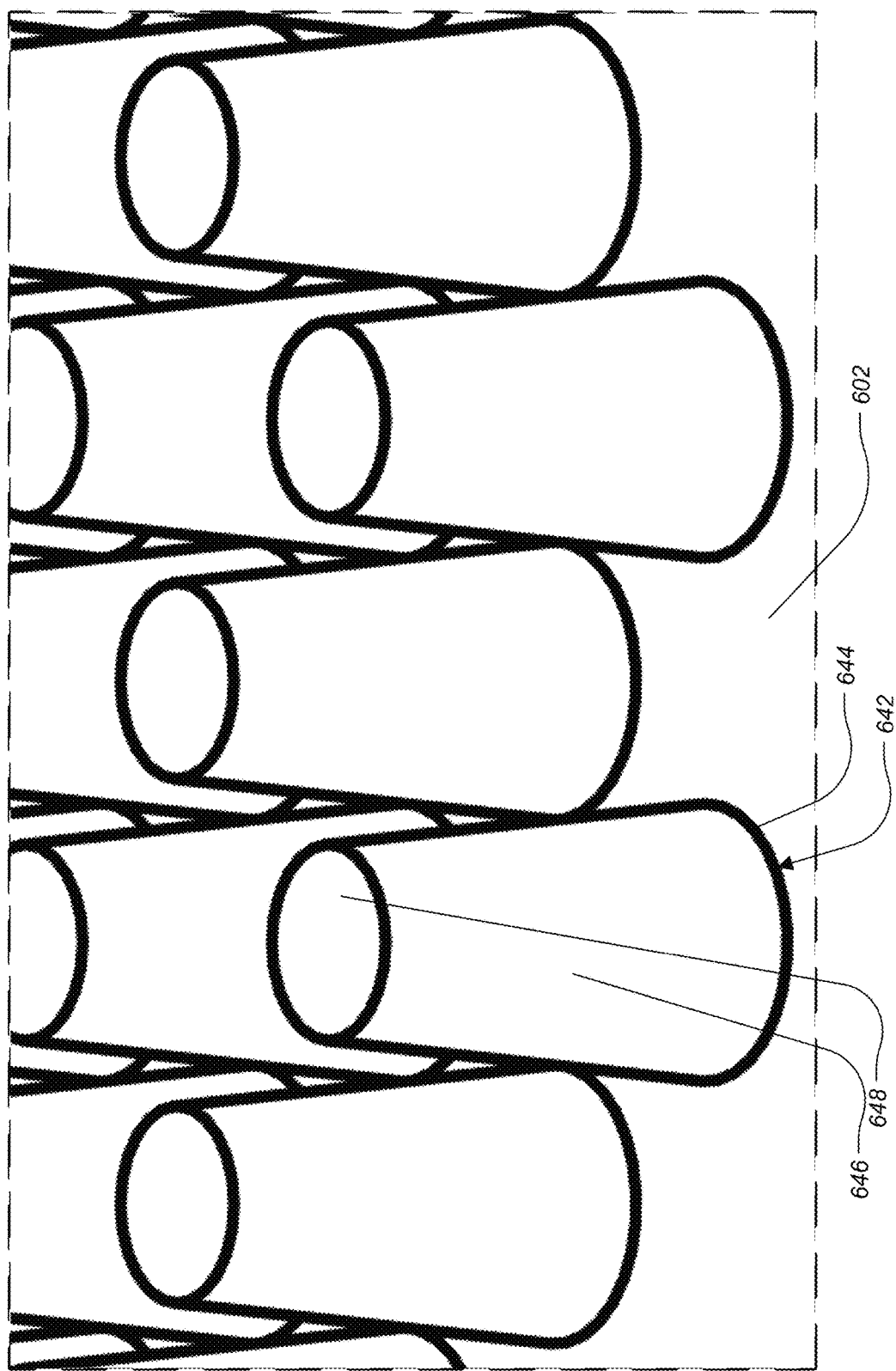
FIG. 50 illustrates a partial perspective bottom side view of a power module according to FIG. 47.
Figure 54:
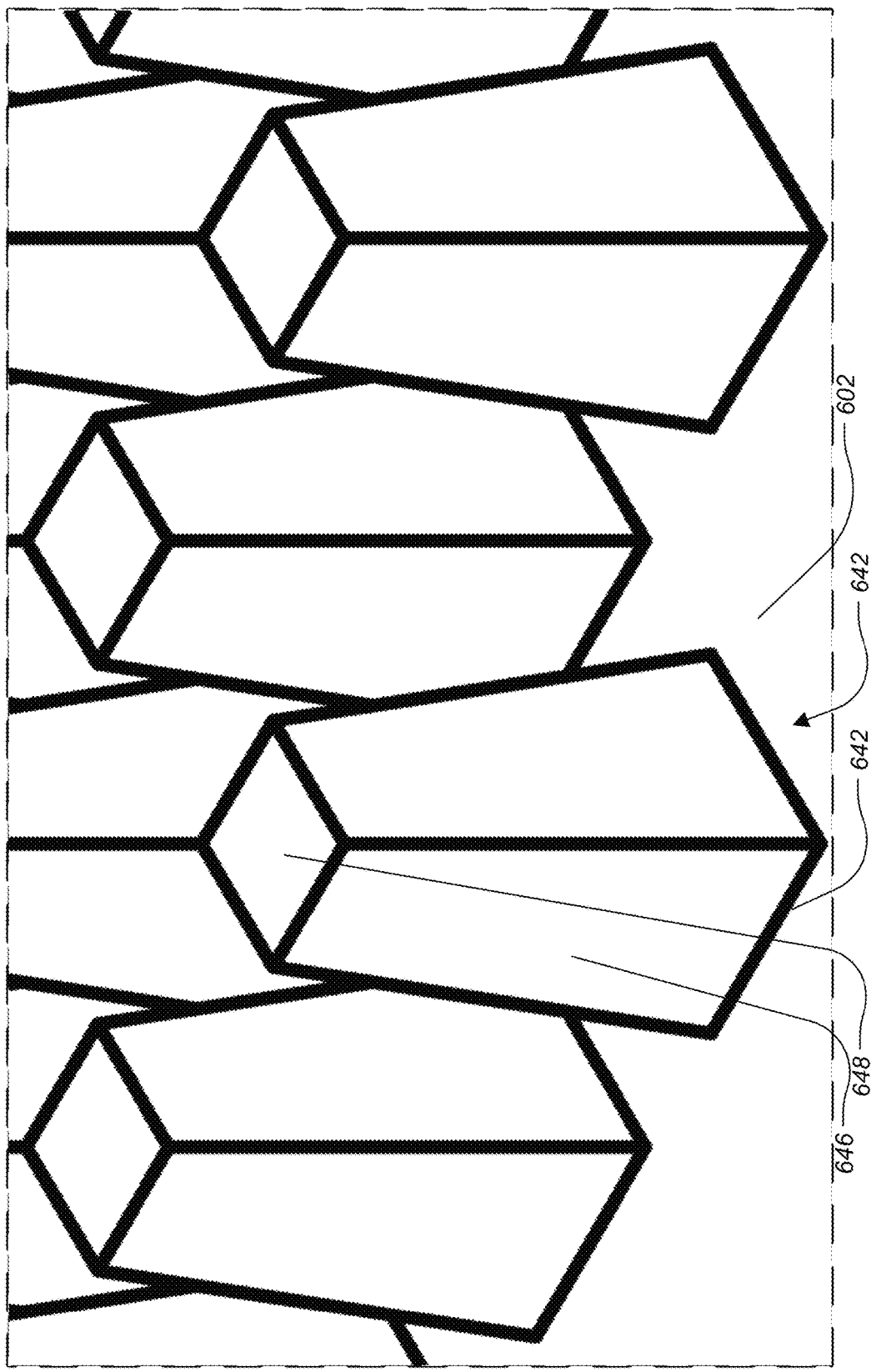
FIG. 54 illustrates a partial perspective bottom side view of a power module according to FIG. 51.

With reference to FIG. 46, FIG. 50, and FIG. 54, each of the pin fins 642 may be formed integral with the base plate 602. In other aspects, each of the pin fins 642 may be attached to the base plate 602 by welding, adhesive, soldering, brazing, or the like. In one aspect, each of the pin fins 642 may include a base portion 644 connected to the base plate 602.

In one aspect, the pin fins 642 may be formed from the same material as the base plate 602. In one aspect, the pin fins 642 may be formed from the same material as the base plate 602 in order to save weight. In one aspect, the pin fins 642 may be formed from a material that is different from the material of the base plate 602. In one aspect, the pin fins 642 may be formed from a metallic material. In one aspect, the pin fins 642 may include copper. In one aspect, the pin fins 642 may be formed of copper.

In one aspect, each of the pin fins 642 may include one or more surfaces 646 extending from the base portion 644. In one aspect, each of the pin fins 642 may have a terminating surface 648. In one aspect, the terminating surface may be flat, contoured, non-flat, pointed, curved, or the like. In one aspect, the one or more surfaces 646 may taper as they extend to the terminating surface 648. In one aspect, the one or more surfaces 646 may be perpendicular to a surface of the base plate 602 as they extend to the terminating surface 648.

In one aspect, each of the pin fins 642 may have a cross-sectional shape with respect to a plane that is parallel to a surface of the base plate 602. In this regard, the pin fins 642 may have a square cross-sectional shape, a rectangular cross-sectional shape, a circular cross-sectional shape, a contoured cross-sectional shape, an oval cross-sectional shape, a symmetric cross-sectional shape (along one or more axes), an asymmetric cross-sectional shape (along one or more axes), an airfoil shaped cross-sectional shape, a wing shaped cross-sectional shape, or the like. Moreover, the pin fins 642 may have a first one of the above-noted shapes, a plurality of the above-noted shapes, or the like. However, the pin fins 642 can be implemented with any shaped structure on the base plate 602 of the power module 100.

In one aspect, the terminating surface 648 may have a cross-sectional shape with respect to a plane that is parallel to a surface of the base plate 602. In this regard, the terminating surface 648 may have a square cross-sectional shape, a rectangular cross-sectional shape, a circular cross-sectional shape, a contoured cross-sectional shape, an oval cross-sectional shape, a symmetric cross-sectional shape (along one or more axes), an asymmetric cross-sectional shape (along one or more axes), an airfoil shaped cross-sectional shape, a wing shaped cross-sectional shape, or the like.

In one aspect, the base portion 644 may have a cross-sectional shape with respect to a plane that is parallel to a surface of the base plate 602. In this regard, the base portion 644 may have a square cross-sectional shape, a rectangular cross-sectional shape, a circular cross-sectional shape, a contoured cross-sectional shape, an oval cross-sectional shape, a symmetric cross-sectional shape (along one or more axes), an asymmetric cross-sectional shape (along one or more axes), an airfoil shaped cross-sectional shape, a wing shaped cross-sectional shape, or the like.

In one aspect, the base portion 644 may have a cross-sectional shape that is the same as the cross-sectional shape of the terminating surface 648. In one aspect, the base portion 644 may have a cross-sectional shape and size that is the same as the terminating surface 648. In one aspect, the base portion 644 may have a cross-sectional shape that is the same as the terminating surface 648 and a size that is different. In one aspect, the base portion 644 may have a cross-sectional shape that is different from the cross-sectional shape of the terminating surface 648.

In one aspect, the pin fins 642 may be formed utilizing one or more operations, including machining, forging, molding, stamping, deforming, and the like operations to form a fin pattern of the pin fins 642 as illustrated in the drawings; and the pin fins 642 may be attached using welding, adhesive, soldering, brazing, or the like. However, the pin fins 642 may be formed utilizing any manufacturing method and/or technology known to one of ordinary skill in the art for creating fin and pin surfaces on the base plate 602.

In one aspect, with reference to FIG. 46, a diameter or length L of the pin fins 642 defined parallel to a surface of the base plate 602 along the base portion 644 may be 1 mm-8 mm, 1 mm-2 mm, 2 mm-3 mm, 3 mm-4 mm, 4 mm-5 mm, 5 mm-6 mm, 6 mm-7 mm, or 7 mm-8 mm. These dimensions may be equally applicable to all configurations the pin fins 642 disclosed herein.

In one aspect, with reference to FIG. 46, a height H of the pin fins 642 defined perpendicular to a surface of the base plate 602 from the base portion 644 to the terminating surface 648 may be 1 mm-12 mm, 2 mm-10 mm, 4 mm-8 mm, 1 mm-2 mm, 2 mm-3 mm, 3 mm-4 mm, 4 mm-5 mm, 5 mm-6 mm, 6 mm-7 mm, 7 mm-8 mm, 8 mm-9 mm, 9 mm-10 mm, 10 mm-11 mm, or 11 mm-12 mm. These dimensions may be equally applicable to all configurations the pin fins 642 disclosed herein.

In one aspect, with reference to FIG. 46, a pin to pin spacing S of the pin fins 642 may be defined by a center axis of adjacent ones of the pin fins 642 perpendicular to the base plate 602 and the spacing S may be 2 mm-12 mm, 4 mm-10 mm, 2 mm-3 mm, 3 mm-4 mm, 4 mm-5 mm, 5 mm-6 mm, 6 mm-7 mm, 7 mm-8 mm, 8 mm-9 mm, 9 mm-10 mm, 10 mm-11 mm, or 11 mm-12 mm. These dimensions may be equally applicable to all configurations the pin fins 642 disclosed herein.

Figure 43:
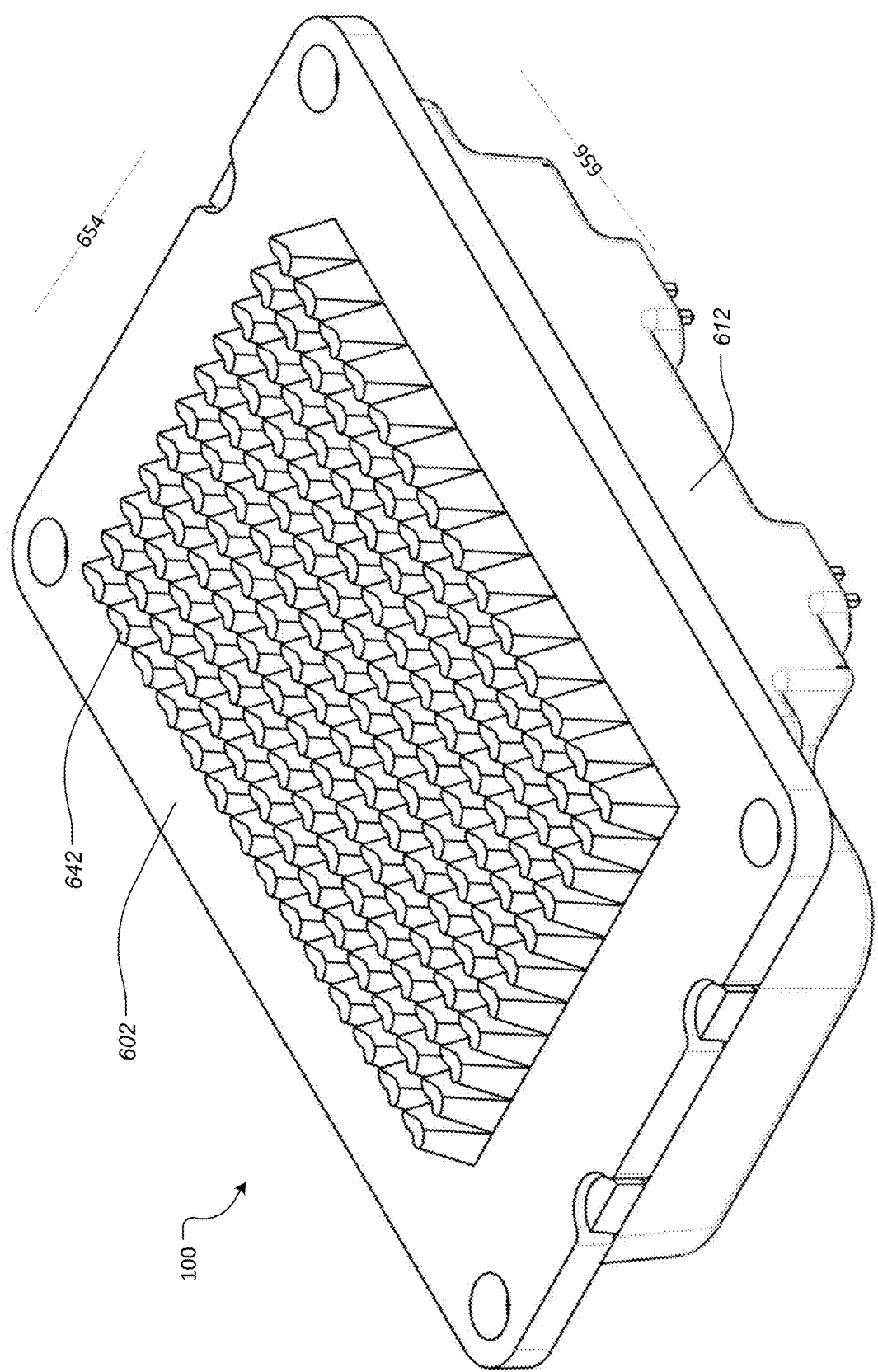
FIG. 43 illustrates a perspective bottom side view of a power module according to an aspect of the disclosure.
Figure 44:
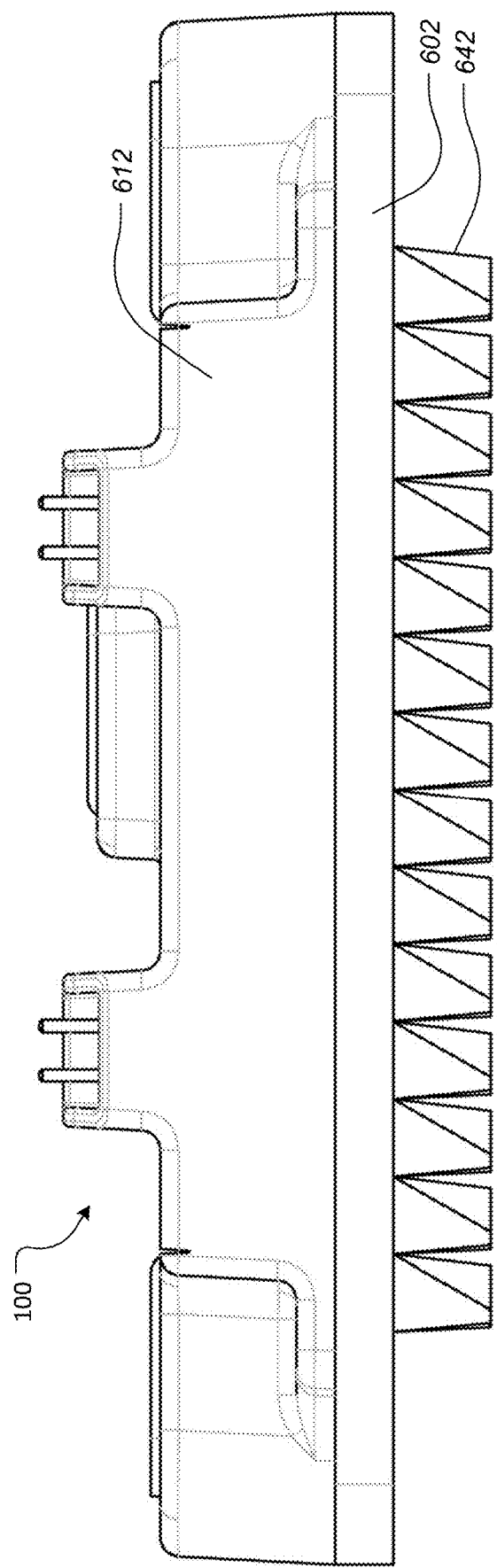
FIG. 44 illustrates a side view of a power module according to FIG. 43.
Figure 45:
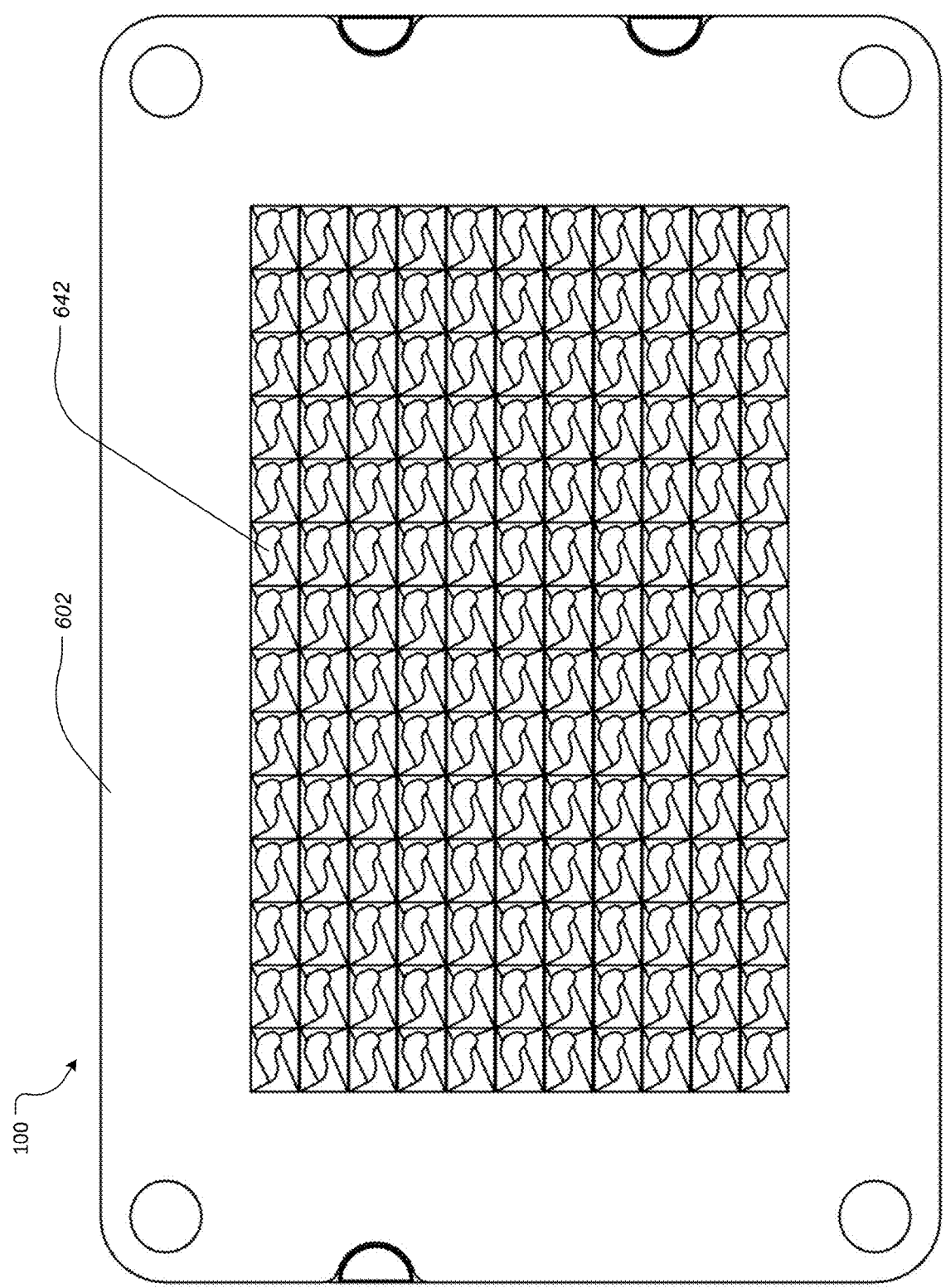
FIG. 45 illustrates a bottom side view of a power module according to FIG. 43.

FIG. 43 illustrates a perspective bottom side view of a power module according to an aspect of the disclosure; FIG. 44 illustrates a side view of a power module according to FIG. 43; FIG. 45 illustrates a bottom side view of a power module according to FIG. 43; and FIG. 46 illustrates a partial perspective bottom side view of a power module according to FIG. 43.

With reference to FIGS. 43-46, each of the pin fins 642 may include one or more surfaces 646 extending from the base portion 644. In one aspect, the pin fins 642 may have a terminating surface 648. In one aspect, the terminating surface may be contoured, non-flat, or the like. In one aspect, the one or more surfaces 646 may taper as they extend to the terminating surface 648.

In one aspect, the terminating surface 648 may have a cross-sectional shape with respect to a plane that is parallel to a surface of the base plate 602. In this regard, the terminating surface 648 may have an asymmetric cross-sectional shape, an airfoil shaped cross-sectional shape, a wing shaped cross-sectional shape, or the like.

In one aspect, the base portion 644 may have a cross-sectional shape with respect to a plane that is parallel to a surface of the base plate 602. In this regard, the base portion 644 may have a square cross-sectional shape, a rectangular cross-sectional shape, or the like.

In one aspect, the plurality of pin fins 642 may form channels parallel to an axis 654. In one aspect, the plurality of pin fins 642 may form channels parallel to an axis 656.

Figure 47:
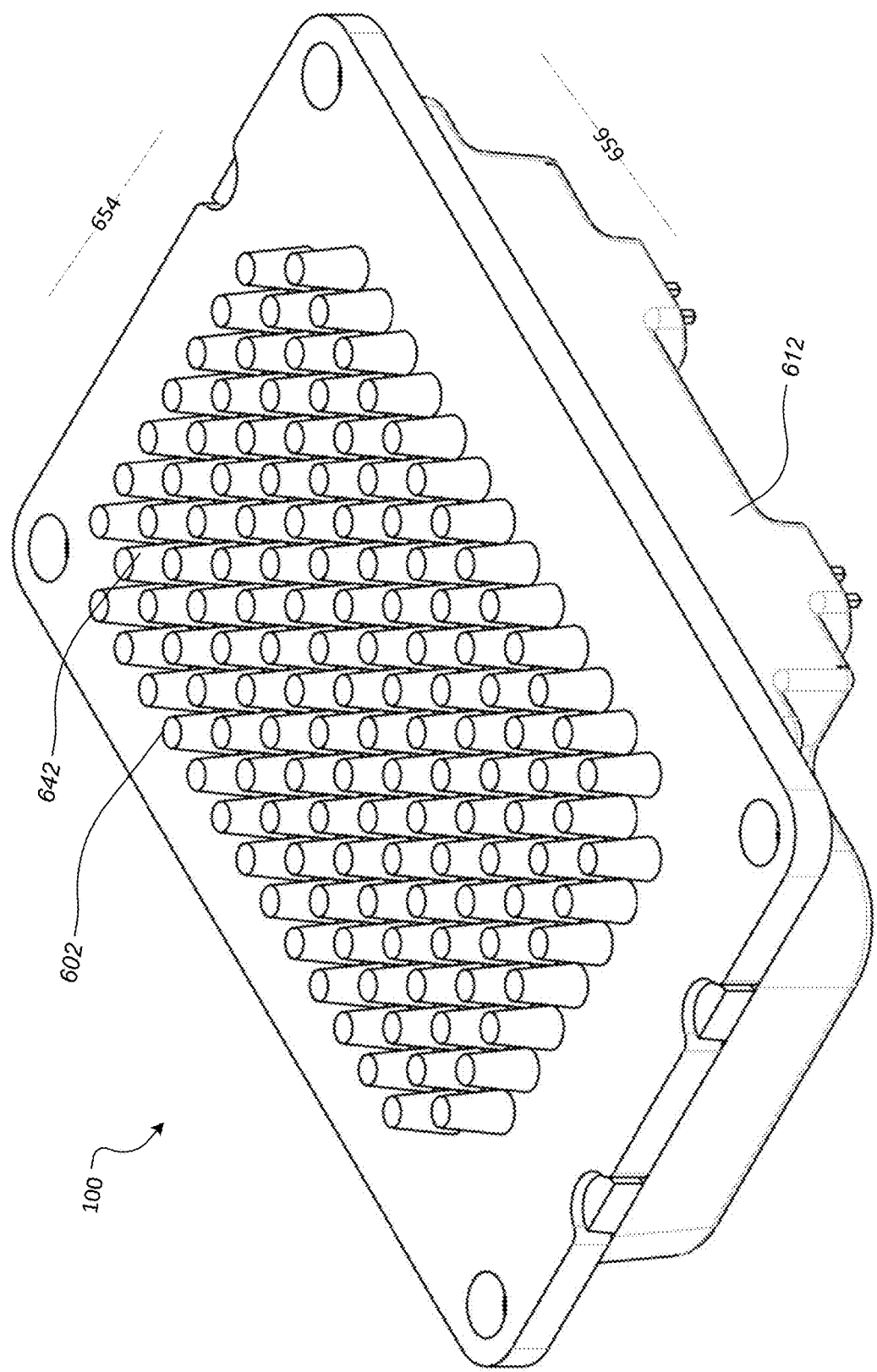
FIG. 47 illustrates a perspective bottom side view of a power module according to an aspect of the disclosure.
Figure 48:
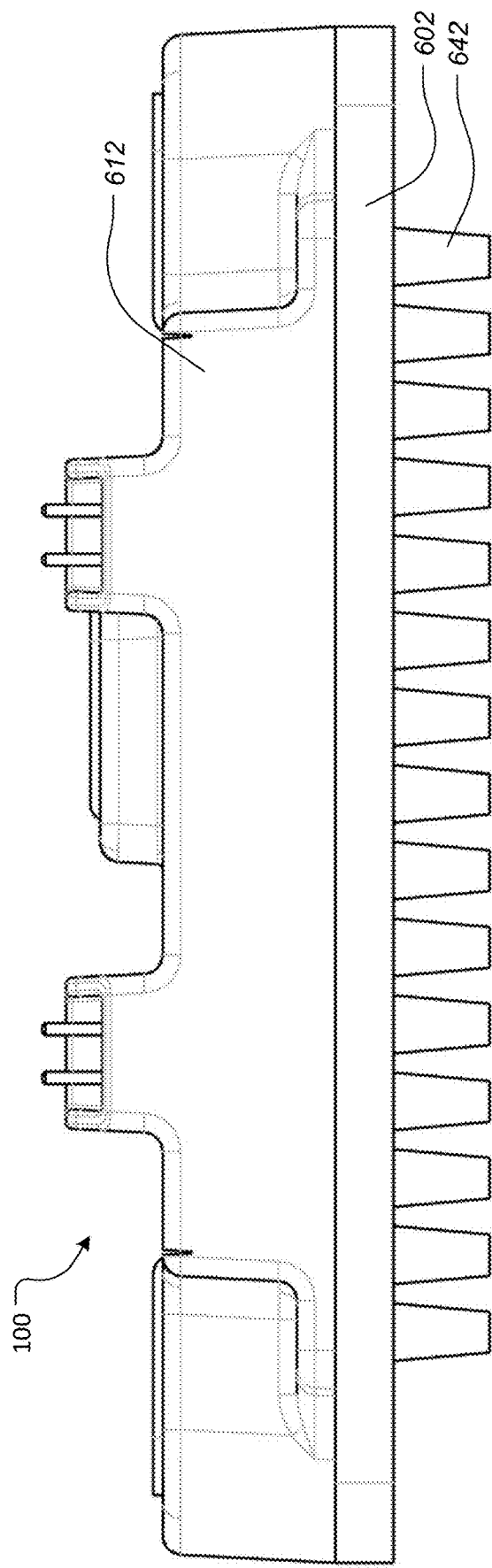
FIG. 48 illustrates a side view of a power module according to FIG. 47.
Figure 49:
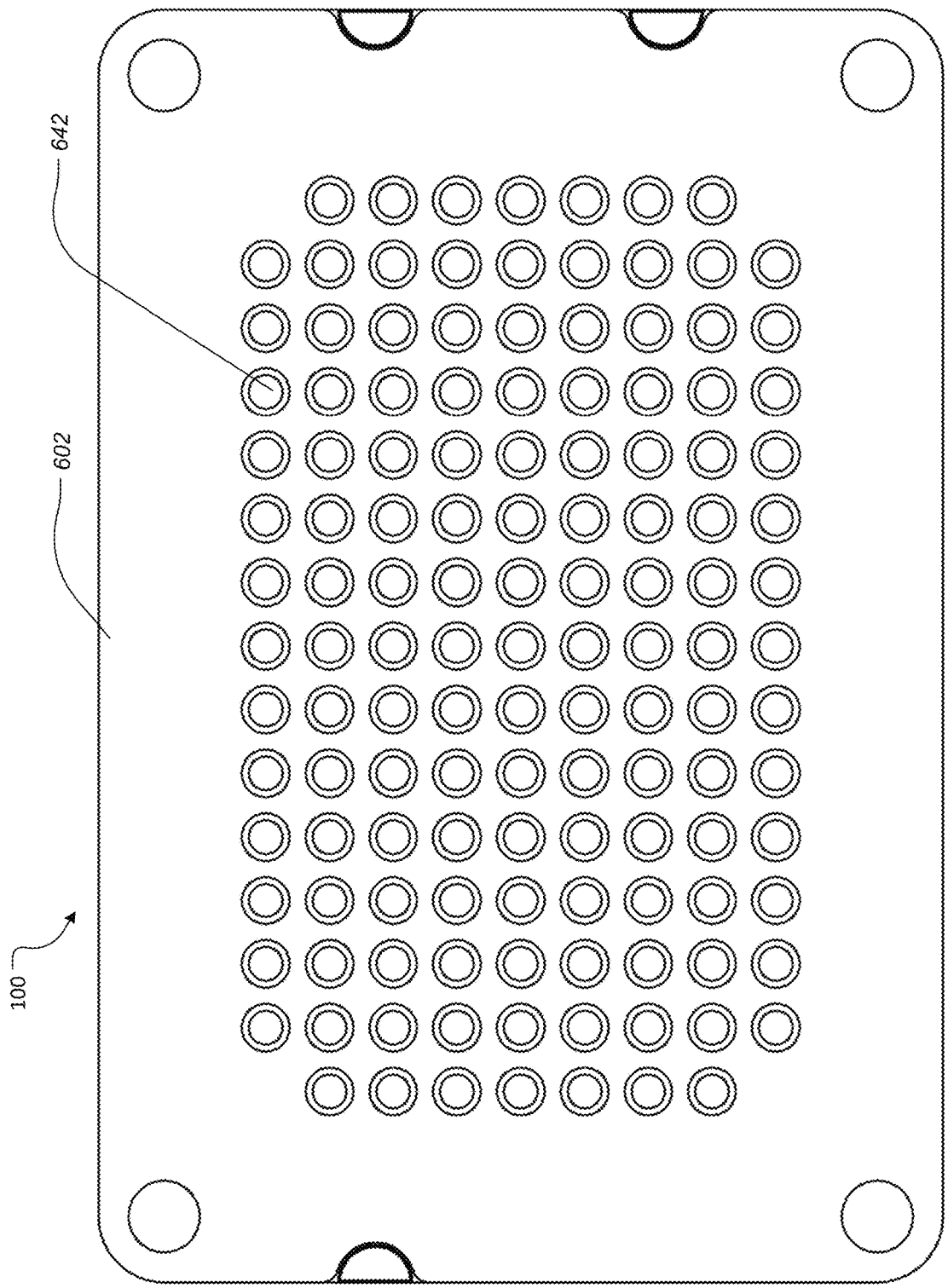
FIG. 49 illustrates a bottom side view of a power module according to FIG. 47.

FIG. 47 illustrates a perspective bottom side view of a power module according to an aspect of the disclosure; FIG. 48 illustrates a side view of a power module according to FIG. 47; FIG. 49 illustrates a bottom side view of a power module according to FIG. 47; and FIG. 50 illustrates a partial perspective bottom side view of a power module according to FIG. 47.

With reference to FIGS. 47-50, each of the pin fins 642 may include one or more surfaces 646 extending from the base portion 644. In one aspect, each of the pin fins 642 may have a terminating surface 648. In one aspect, the terminating surface may be flat or the like. In one aspect, the one or more surfaces 646 may taper as they extend to the terminating surface 648.

In one aspect, the terminating surface 648 may have a cross-sectional shape with respect to a plane that is parallel to a surface of the base plate 602. In this regard, the terminating surface 648 may have a circular cross-sectional shape, a contoured cross-sectional shape, an oval cross-sectional shape, a symmetric cross-sectional shape, or the like.

In one aspect, the base portion 644 may have a cross-sectional shape with respect to a plane that is parallel to a surface of the base plate 602. In this regard, the base portion 644 may have a circular cross-sectional shape, a contoured cross-sectional shape, an oval cross-sectional shape, a symmetric cross-sectional shape, or the like.

In one aspect, the base portion 644 may have a cross-sectional shape that is the same as the cross-sectional shape of the terminating surface 648. In one aspect, the base portion 644 may have a cross-sectional shape that is the same as the terminating surface 648 and a size that is different.

In one aspect, the plurality of pin fins 642 may form channels parallel to an axis 654. In one aspect, the plurality of pin fins 642 may form channels parallel to an axis 656. In one aspect, the base portions 644 of adjacent ones of pin fins 642 may converge, join, connect, meet, or the like.

Figure 51:
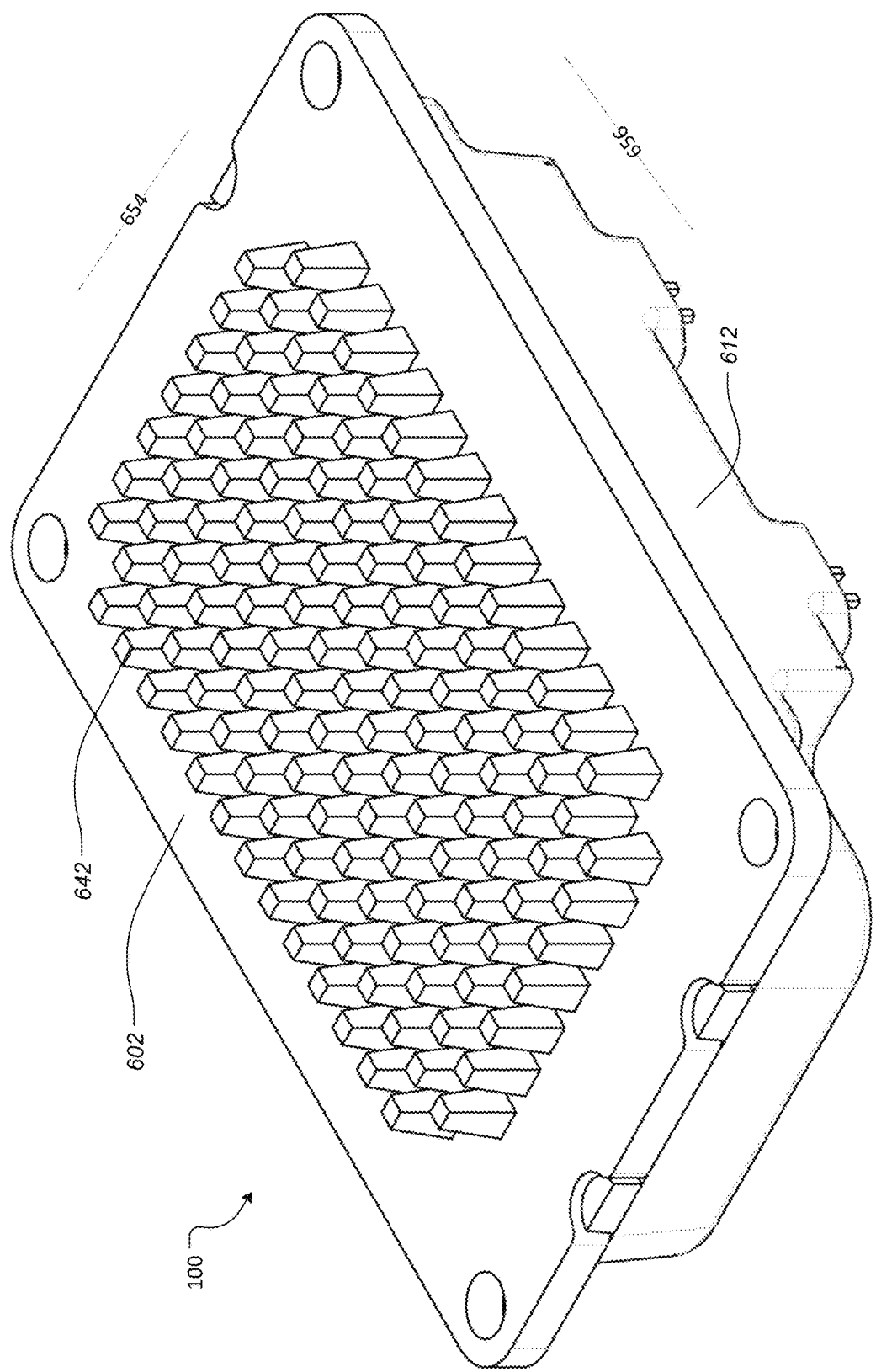
FIG. 51 illustrates a perspective bottom side view of a power module according to an aspect of the disclosure.
Figure 52:
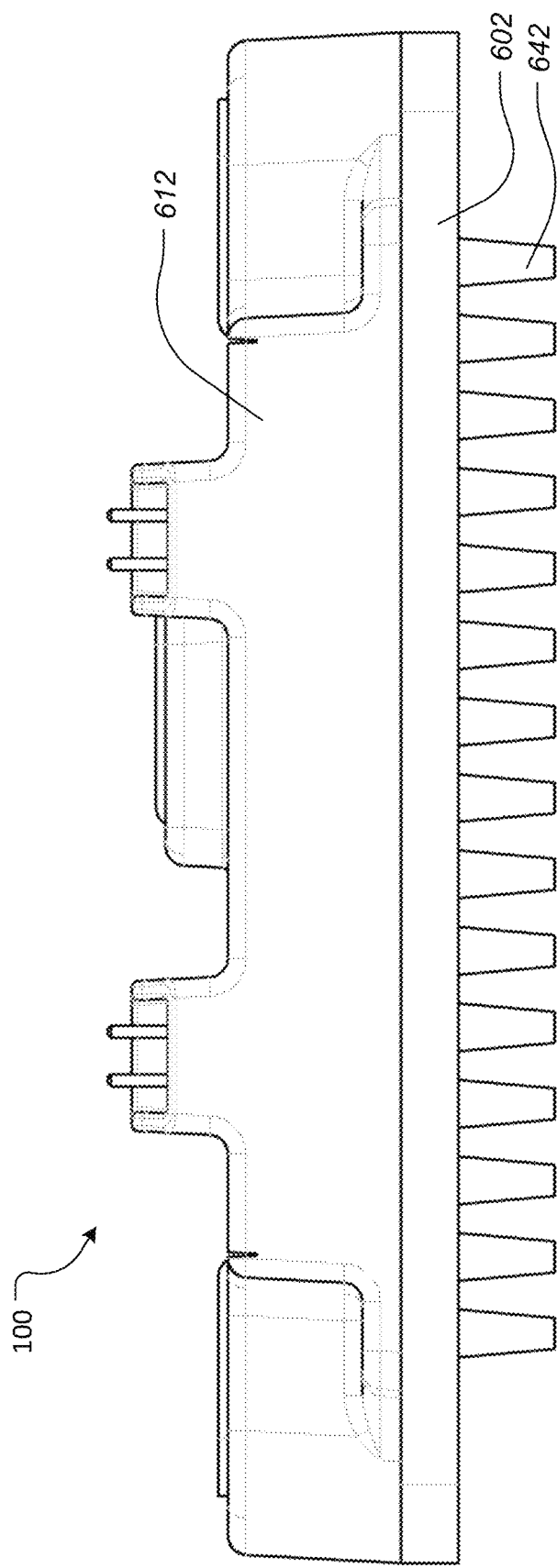
FIG. 52 illustrates a side view of a power module according to FIG. 51.
Figure 53:
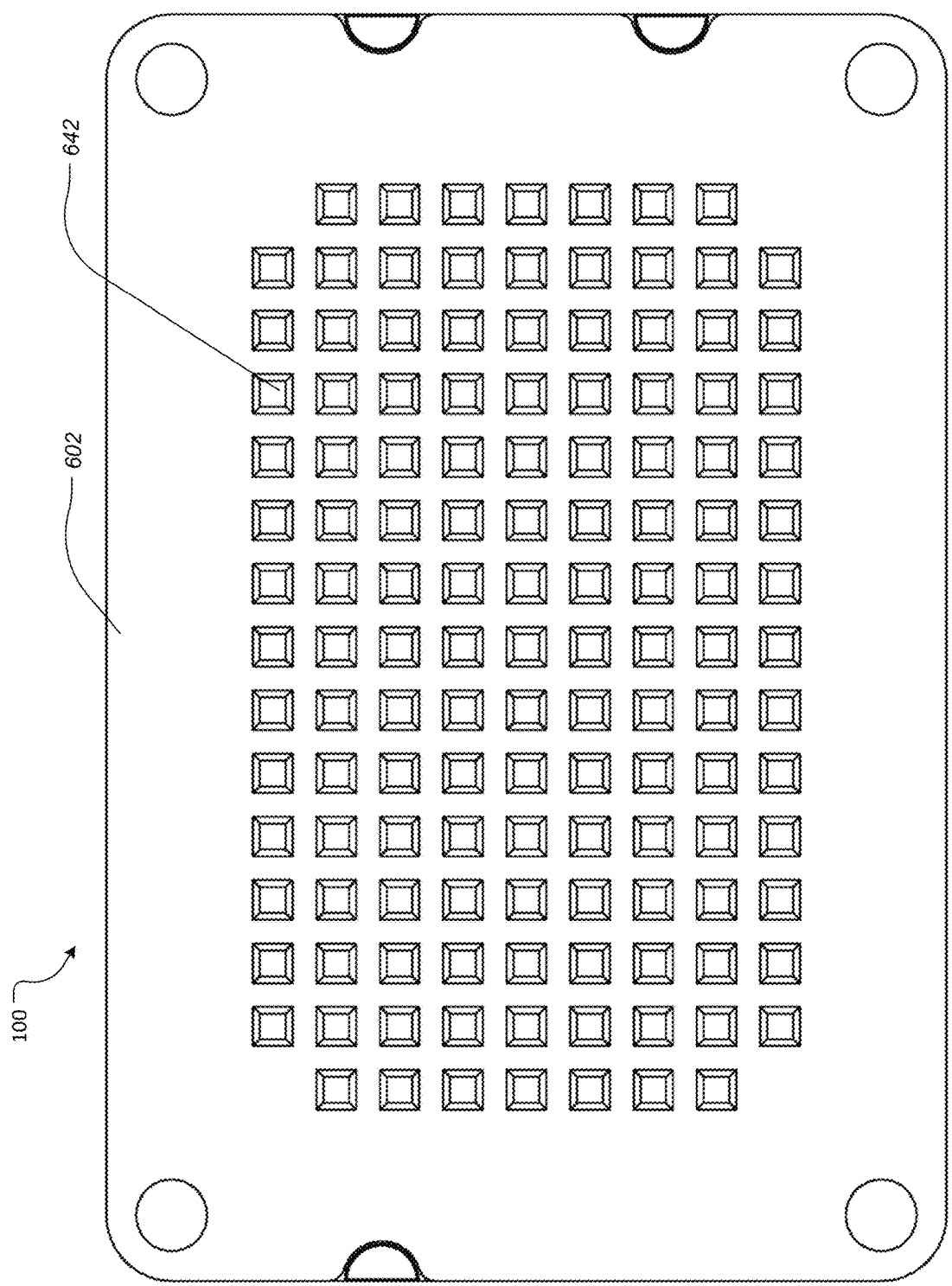
FIG. 53 illustrates a bottom side view of a power module according to FIG. 51.

FIG. 51 illustrates a perspective bottom side view of a power module according to an aspect of the disclosure; FIG. 52 illustrates a side view of a power module according to FIG. 51; FIG. 53 illustrates a bottom side view of a power module according to FIG. 51; and FIG. 54 illustrates a partial perspective bottom side view of a power module according to FIG. 51.

With reference to FIGS. 51-54, each of the pin fins 642 may include one or more surfaces 646 extending from the base portion 644. In one aspect, each of the pin fins 642 may have a terminating surface 648. In one aspect, the terminating surface may be flat or the like. In one aspect, the one or more surfaces 646 may taper as they extend to the terminating surface 648.

In one aspect, the terminating surface 648 may have a cross-sectional shape with respect to a plane that is parallel to a surface of the base plate 602. In this regard, the terminating surface 648 may have a square cross-sectional shape, a rectangular cross-sectional shape, a symmetric cross-sectional shape, or the like.

In one aspect, the base portion 644 may have a cross-sectional shape with respect to a plane that is parallel to a surface of the base plate 602. In this regard, the base portion 644 may have a square cross-sectional shape, a rectangular cross-sectional shape, a symmetric cross-sectional shape, or the like.

In one aspect, the base portion 644 may have a cross-sectional shape that is the same as the cross-sectional shape of the terminating surface 648. In one aspect, the base portion 644 may have a cross-sectional shape that is the same as the terminating surface 648 and a size that is different.

In one aspect, the plurality of pin fins 642 may form channels parallel to an axis 654. In one aspect, the plurality of pin fins 642 may form channels parallel to an axis 656.

Figure 55:
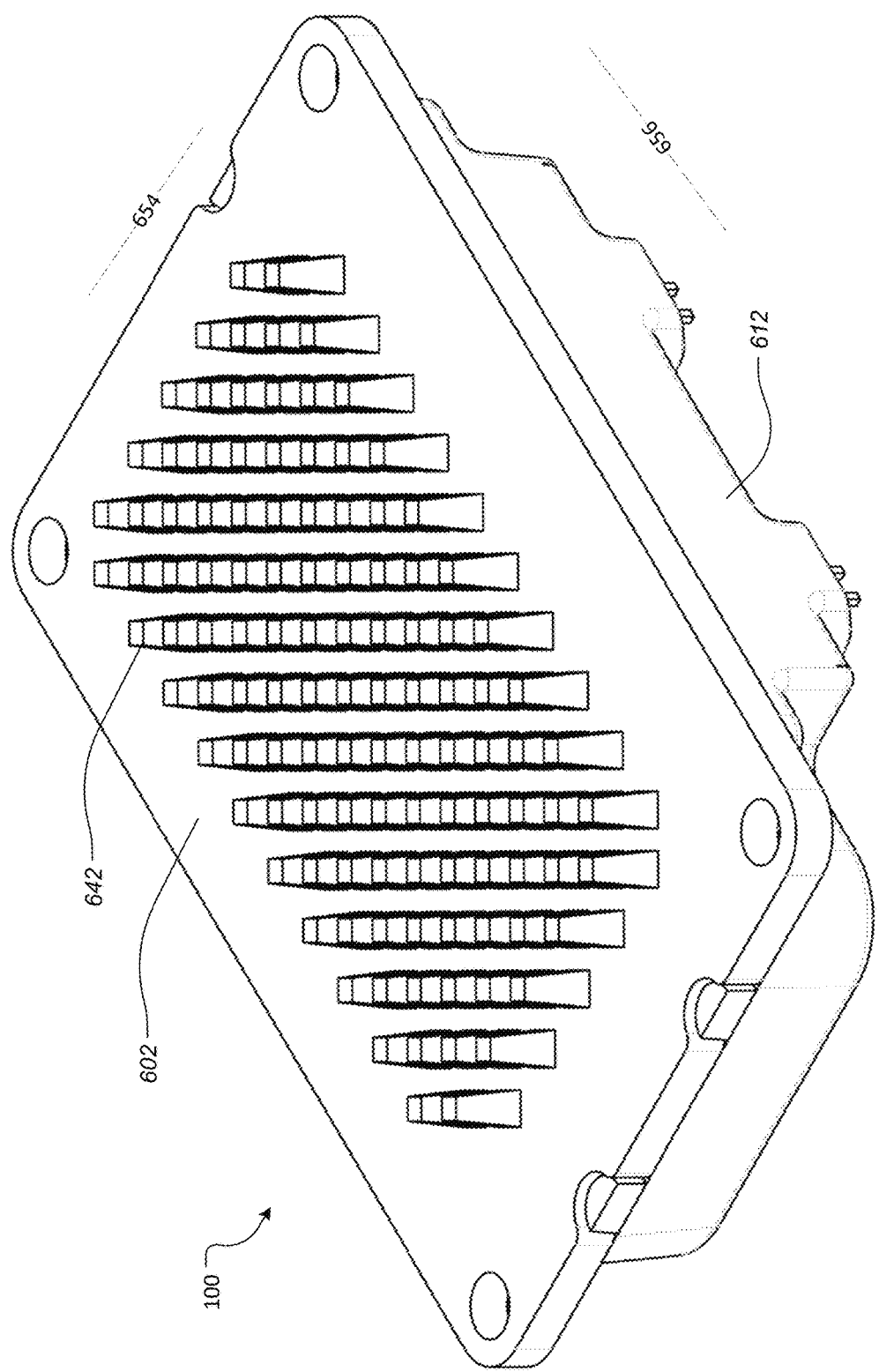
FIG. 55 illustrates a perspective bottom side view of a power module according to an aspect of the disclosure.
Figure 56:
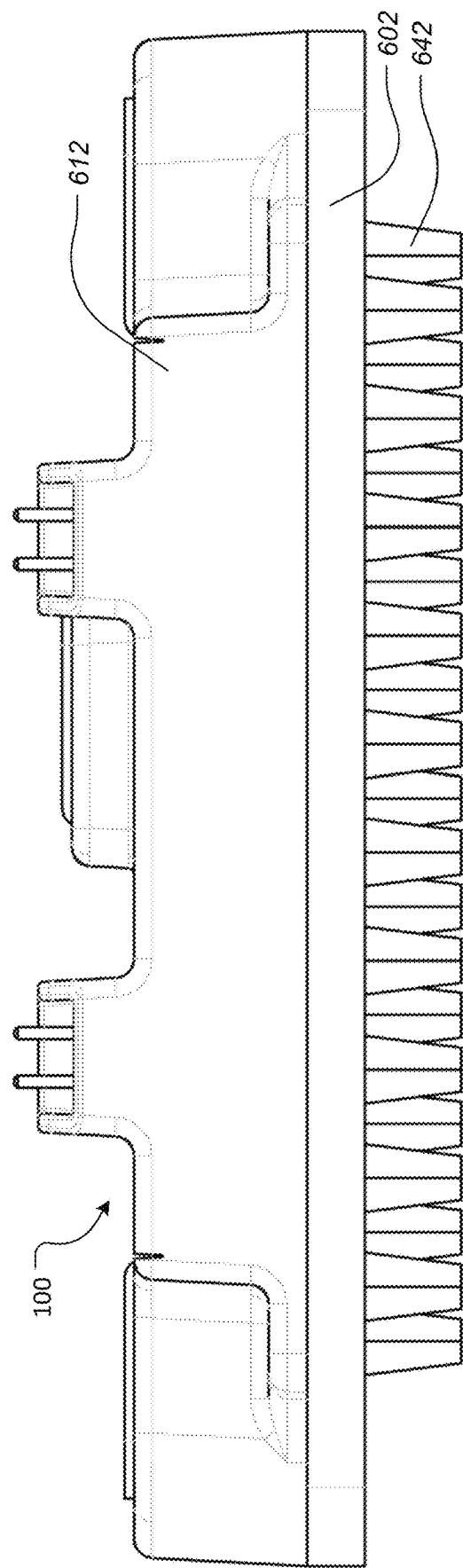
FIG. 56 illustrates a side view of a power module according to FIG. 55.

FIG. 55 illustrates a perspective bottom side view of a power module according to an aspect of the disclosure; FIG. 56 illustrates a side view of a power module according to FIG. 55; and FIG. 57 illustrates a bottom side view of a power module according to FIG. 55.

Figure 57:
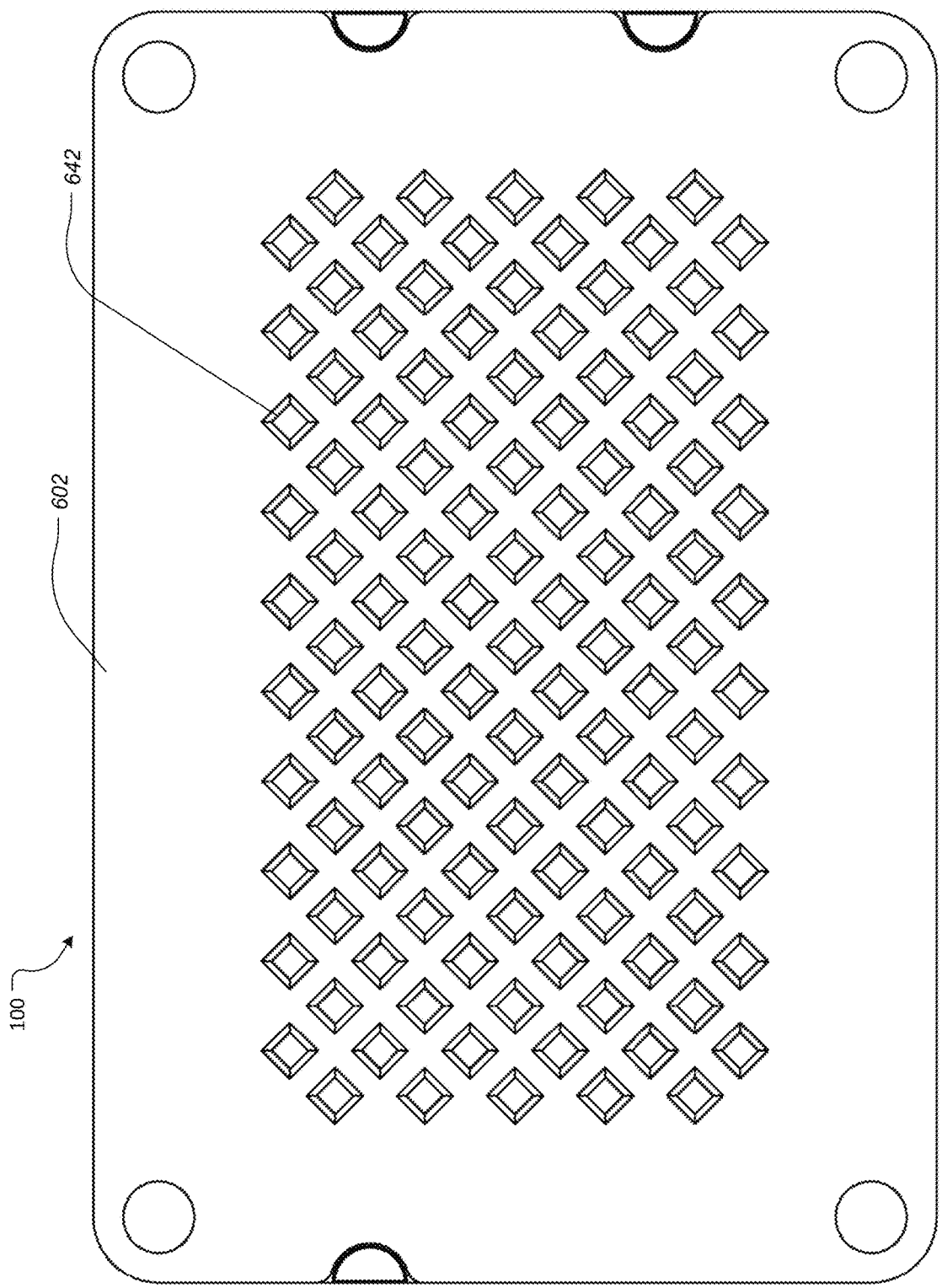
FIG. 57 illustrates a bottom side view of a power module according to FIG. 55.

With reference to FIGS. 55-57, each of the pin fins 642 may include one or more surfaces 646 extending from the base portion 644. In one aspect, each of the pin fins 642 may have a terminating surface 648. In one aspect, the terminating surface may be flat or the like. In one aspect, the one or more surfaces 646 may taper as they extend to the terminating surface 648.

In one aspect, the terminating surface 648 may have a cross-sectional shape with respect to a plane that is parallel to a surface of the base plate 602. In this regard, the terminating surface 648 may have a square cross-sectional shape, a rectangular cross-sectional shape, a symmetric cross-sectional shape, or the like.

In one aspect, the base portion 644 may have a cross-sectional shape with respect to a plane that is parallel to a surface of the base plate 602. In this regard, the base portion 644 may have a square cross-sectional shape, a rectangular cross-sectional shape, a symmetric cross-sectional shape, or the like.

In one aspect, the base portion 644 may have a cross-sectional shape that is the same as the cross-sectional shape of the terminating surface 648. In one aspect, the base portion 644 may have a cross-sectional shape and size that is the same as the terminating surface 648.

In one aspect, the plurality of pin fins 642 may form channels that are staggered or angled with respect to the axis 654. In one aspect, the plurality of pin fins 642 may form channels that are staggered or angled with respect to the axis 656.

Figure 58:
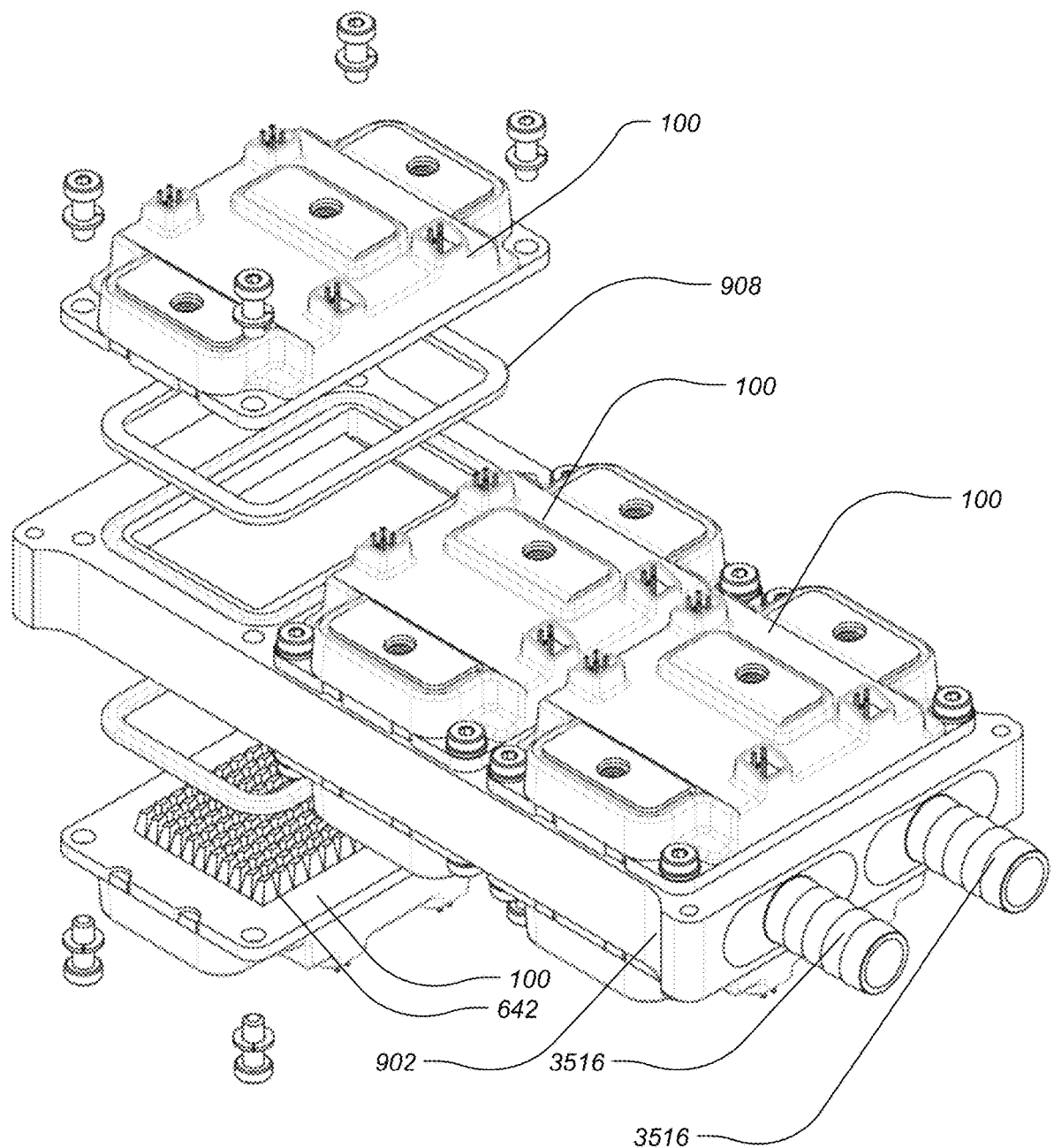
FIG. 58 illustrates a perspective view of a power module implementation according to an aspect of the disclosure.

FIG. 58 illustrates a perspective view of a power module implementation according to an aspect of the disclosure.

Referring to FIG. 58, the power modules 100 implementing direct cooling with the pin fins 642 may be placed on and/or in a cold plate 902. In particular, FIG. 58 illustrates one of the power modules 100 implementing direct cooling with the pin fins 642 as disclosed. In this regard, the FIG. 58 implementation may include one, a plurality, or all of the power modules 100 implementing direct cooling with the pin fins 642 as disclosed. In one aspect, the power modules 100 may be placed on both sides of the cold plate 902. In this regard, the power modules 100 arranged on both sides of the cold plate 902 may maximize power density, reduce complexity, and/or the like. In one aspect, the power modules 100 may be placed on one side of the cold plate 902. Accordingly, the power modules 100 may be directly cooled utilizing the pin fins 642, the cold plate 902, and the like. As further described herein, the directly cooled power module 100 may exhibit significantly higher thermal performance.

In one aspect, the cold plate 902 may contain any number of the power modules 100 in a line on a top of the cold plate 902 and on a bottom of the cold plate 902 depending on a desired topology. In one aspect, the cold plate 902 may contain any number of the power modules 100 in a line on one side of the cold plate 902 depending on a desired topology. In this regard, the cold plate 902 may be lengthened or shortened to match a number of the power modules 100.

As further illustrated in FIG. 58, a seal 908 may be arranged between the power module 100 and the cold plate 902. The seal 908 may be an O-ring, a gasket, and/or the like. In some aspects, the seal 908 may be an epoxy, a RTV silicone (Room-Temperature-Vulcanizing silicone), a similar sealing material, and/or the like. In other aspects, the seal 908 may be formed by directly welding, brazing, or the like the base plate 602 to the cold plate 902.

In one aspect, the cold plate 902 may have fluid connections 3516 that may be configured to receive a cooling fluid source and/or deliver cooling fluid for cooling purposes in association with the cold plate 902. In one aspect, the fluid connections 3516 may include threaded fittings, flanged fittings, quick connect fittings, hose barb fittings, soldered tubes, welded tubes, and the like. In one aspect, the cold plate 902 may have inlet ports, outlet ports, fluid channels and/or the like that may be configured to evenly distribute fluid flow to the power modules 100. The cold plate 902 may further include other considerations for mounting and sealing the power modules 100 as well to mount the cold plate 902 assembly itself to another structure in an application, such as an inverter, converter, or the like.

In one aspect, the power module 100 of FIGS. 43-58 may be inserted into an application, implemented with the application, configured with the application, or the like. The application may be a system implementing the power module 100 of FIGS. 43-58. The application may be a power system, a motor system, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, and electric vehicles (EVs), a converter, and the like.

Figure 59:
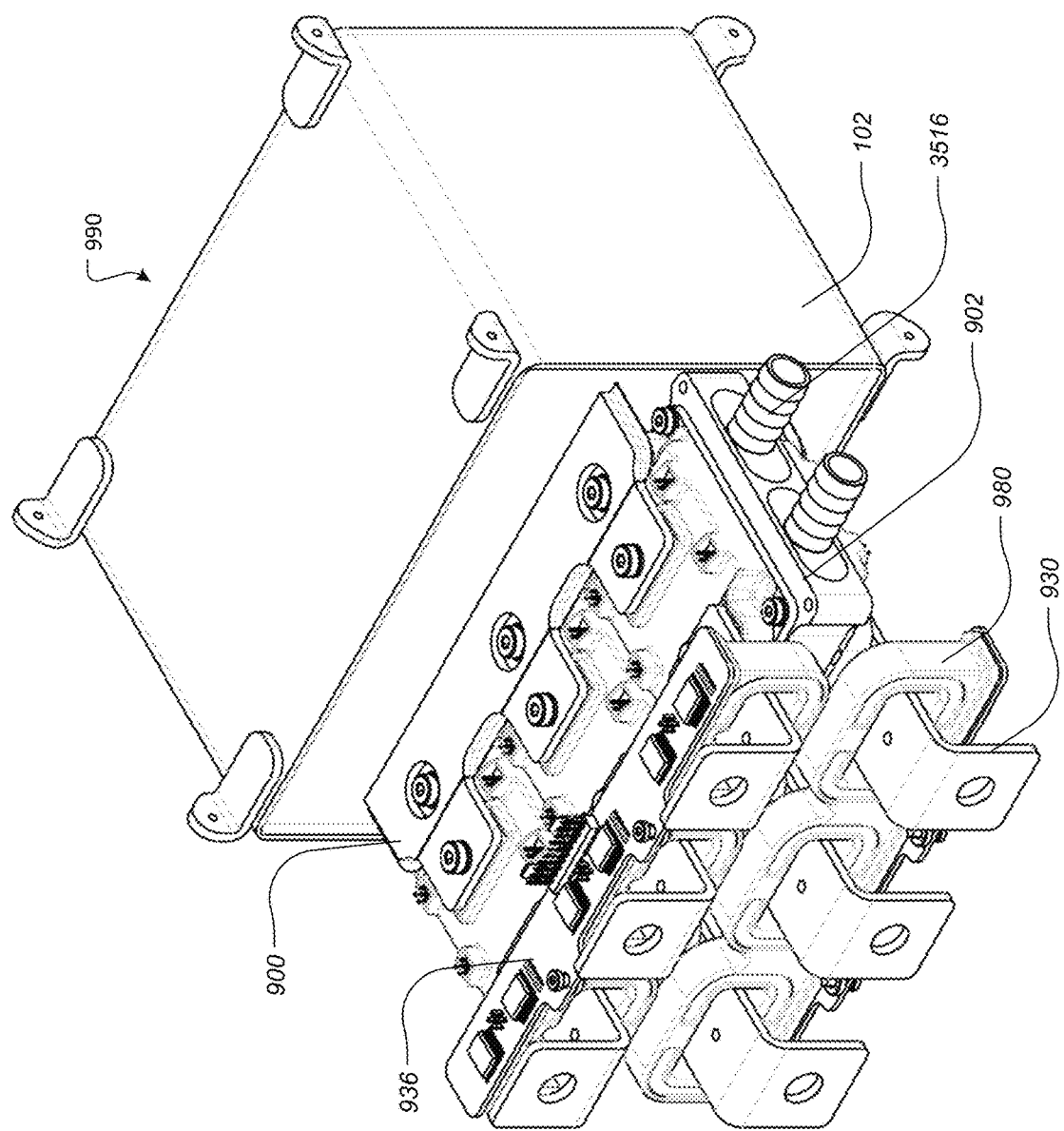
FIG. 59 illustrates a perspective view of a power module implementation according to an aspect of the disclosure.

FIG. 59 illustrates a perspective view of a power module implementation according to an aspect of the disclosure.

In particular, FIG. 59 illustrates an inverter 990 that may be implemented as a 3-phase inverter. In aspects, the inverter 990 may be configured as two separate 3-phase inverters, one 3-phase inverter, one full-bridge, one half-bridge, and/or the like. In one aspect, the inverter 990 may be configured with six dedicated half bridges. In one aspect, the above-noted configurations may be structured and arranged with connections outside of the inverter 990. In one aspect, the above-noted configurations may include different versions of the power module 100 and/or other assembly components. However, the various features described herein with respect to FIG. 59 may be implemented with any of the applications described herein. With further reference to FIG. 59, the inverter 990 may include phase outputs 930, sensors 980, capacitors 102, a cold plate 902, fluid connections 3516, a PCB 936, buss bars 900, and the like as described in detail herein.

In one aspect, the phase outputs 930 may be stamped, laser cut, or the like. In one aspect, the phase outputs 930 may be formed of metal that may include copper, may be copper, and/or may include other metals. In one aspect, the phase outputs 930 may include a bend for size optimization. In one aspect, the phase outputs 930 may include an L-shaped bend for size optimization. In one aspect, the phase outputs 930 may include a 90° bend for size optimization. In one aspect, the phase outputs 930 may include threaded holes for enclosure mounting, strain relief, and the like.

In one aspect, the sensors 980 may include current sensing for each output terminal of the phase outputs 930. In one aspect, the sensors 980 may be configured to operate in conjunction with a closed loop system for addressing signal quality and the like. In other aspects, the inverter 990 may operate open loop for reduced cost and size.

In one aspect, the PCB 936 may be implemented for signal conditioning. In one aspect, the PCB 936 may be implemented for interconnection. In one aspect, the PCB 936 may be implemented for signal conditioning and interconnection.

In one aspect, the capacitor 102 may be configured as a rectangular block to allow for better usage of space. In one aspect, the capacitor 102 may be configured with integrated buss bars 900 to connect the power module 100 to the capacitor 102 as described herein. In one aspect, the capacitor 102 may be a polypropylene film capacitor.

Figure 60:
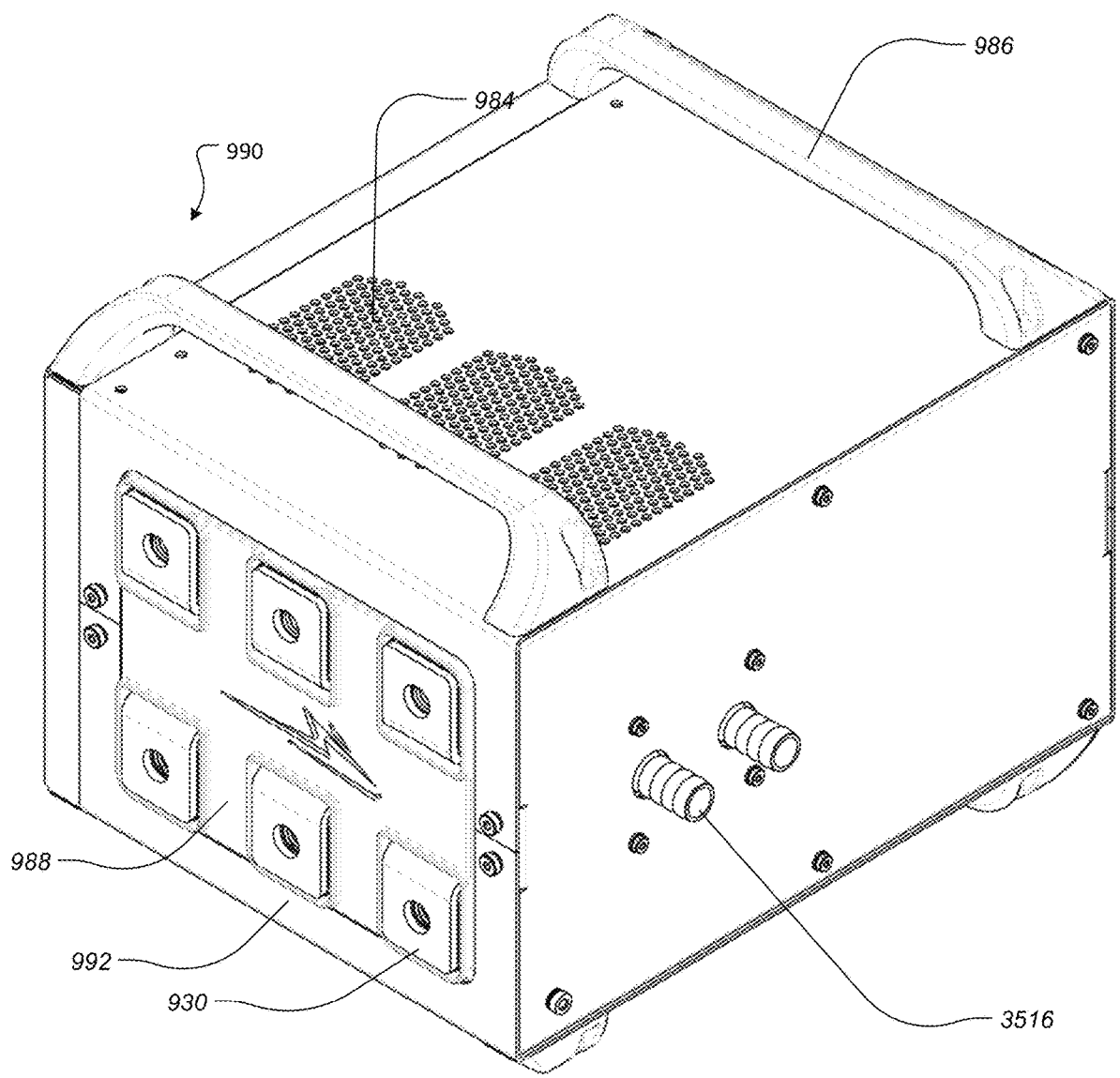
FIG. 60 illustrates a perspective view of a power module implementation according to FIG. 59.

FIG. 60 illustrates a perspective view of a power module implementation according FIG. 59.

FIG. 60 further illustrates the inverter 990 together with multiple housing components 992. In one aspect, the multiple housing components 992 may include sheet-metal portions, vents 984, powder coating, solid front and welded edges for EMI, snap in covers 988, synthetic material portions, plastic material portions, handles 986, grounded portions, standoffs, cooling port openings, embossed terminal markings, windows for displaying components such as a controller, and the like.

In one aspect, the snap in covers 988 may include synthetic materials such as plastic. In one aspect, the snap in covers 988 may be molded. In one aspect, the snap in covers 988 may include captive fastener portions for ease of connection. For example, the snap in covers 988 may include captive hex nuts for ease of connection. In one aspect, the inverter 990 may include various permutations and/or configurations of the phase outputs 930 and the snap in covers 988, and these configurations may be built-in the inverter 990.

Figure 61:
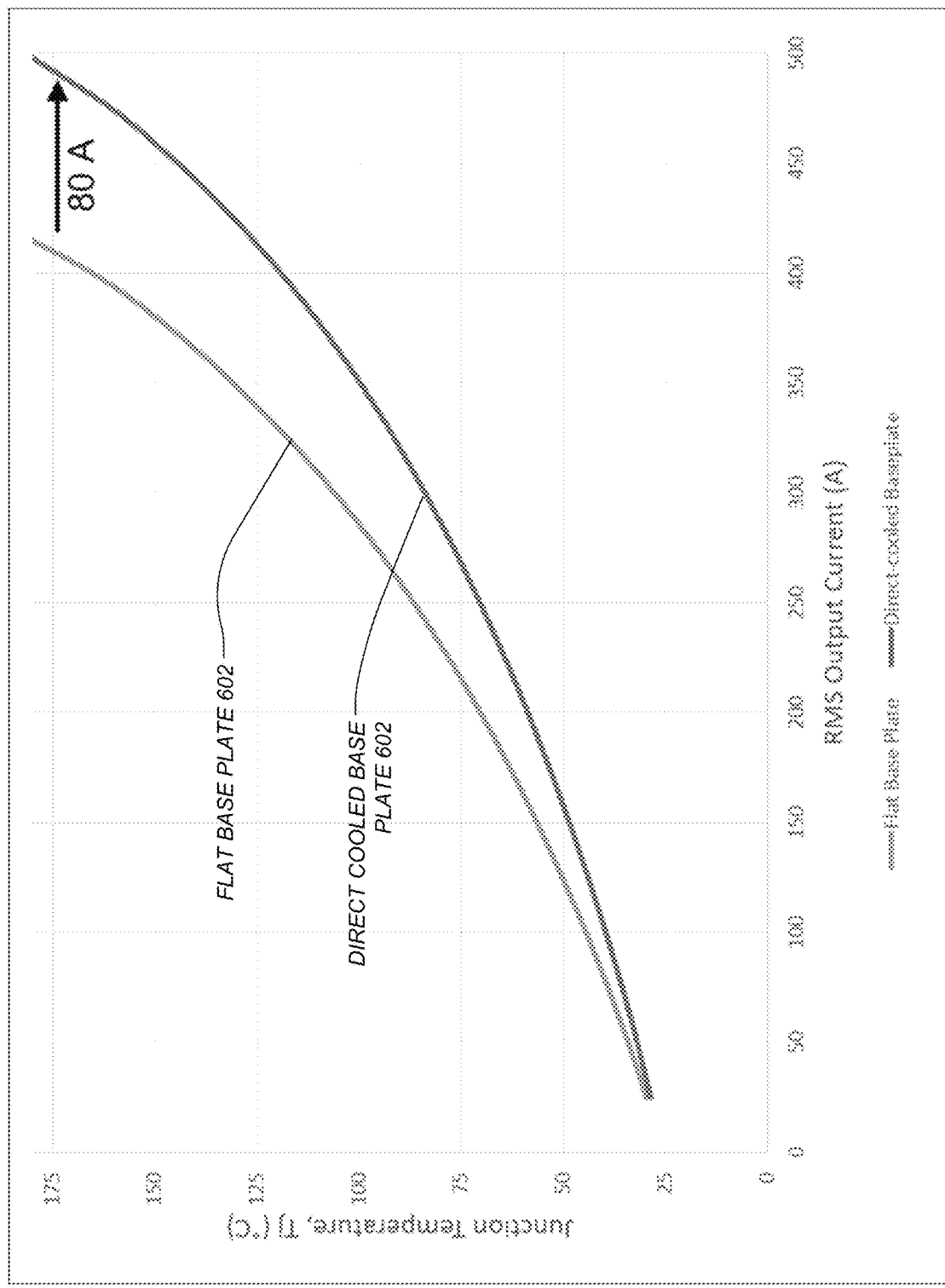
FIG. 61 illustrates a graph plotting Junction Temperature vs. Output Current for two different power modules.

FIG. 61 illustrates a graph plotting Junction Temperature vs. Output Current for two different power modules.

With reference to FIG. 61, two versions of the power module were tested. The first version of the power module was implemented as a 1200 V half-bridge power module with a maximum case temperature rating of 125° C. (degrees Celsius). The power module had a drain-source on-state resistance of 4.6 ms) (milli-Ohms) at the max junction temperature of 175° C. The power module was implemented with a flat copper base plate mounting surface.

The second version of the power module utilized the same power devices 302 and implemented a direct-cooled, copper pin-fin base plate having the pin fins 642 arranged on the base plate 602 as disclosed herein with reference to FIGS. 43-58 and the associated description.

The flat base plate version of the power module required a thermal interface material (TIM) to be applied between the power module and a heatsink or cold plate to fill any voids in the thermal path. The effect of this TIM provided an additional thermal impedance between power module case and the cold plate. The direct-cooled power module included the pins fins 642 as disclosed herein with reference to FIGS. 43-58 and the associated description and was designed to be in direct contact with a coolant negating the need for a TIM.

The results demonstrated a reduction in thermal impedance when using a direct-cooled power module as disclosed herein with reference to FIGS. 43-58 and the associated description in comparison to a flat base plate power module. For the flat base plate version of the power module, the testing was performed using a custom micro deformation liquid cooled cold plate with a coolant temperature of 25° C. and a high-performance TIM. Maximum power dissipation was measured at 750 W per switch position.

For the direct-cooled version of the power module as disclosed herein with reference to FIGS. 43-58 and the associated description, the testing was performed using the cold plate 902 with interior coolant channels and machined cavities with the base plate 602 sitting inside and allowing the coolant to pass through the pin fins 642 and a gasket seal to prevent leaks. Maximum power dissipation was measured at 1000 W per switch position. For both tests, a junction temperature was monitored with a thermal camera as well as a virtual junction technique.

To demonstrate the performance advantage of the direct-cooled power modules 100 at the system level as disclosed herein with reference to FIGS. 43-58 and the associated description, the power modules were installed in a 3-phase inverter and tested under application conditions. Using an 800 V DC bus, a switching frequency of 20 kHz, a 3-phase load, and a constant coolant temperature of 25° C.

After applying the DC bus voltage to the inverter, the output current of the inverter was slowly increased while monitoring the temperature sensor built into the power modules. The temperature sensor measurement was correlated to the junction temperature by testing a specially constructed power module without a lid to allow thermal imaging of the power devices.

As shown in FIG. 61, the flat base plate version of the power module implemented in an inverter was found to process a maximum of 410 $A_{RMS}$ (amps–root mean square), while the direct-cooled version the power module 100 of the disclosure was found to process 490 $A_{RMS}$. Accordingly, the power module 100 implementing the pin fins 642 according to FIGS. 43-58 and the associated description corresponded to a 20% increase in output current capability.

It should be noted that the power module 100 associated with FIGS. 43-58 may be implemented with different voltages, temperature ratings, on-state resistances, different max junction temperatures, different coolant temperatures, different switching frequencies, and the like and likewise will increase an output current capability in comparison to non-direct cooled power modules. In this regard, the output current capability may be increased 5%-40%, 5%-10%, 10%-15%, 15%-20%, 20%-25%, 25%-30%, 30%-35%, 35%-40%, 10%-30%, 20%-40%, 15%-35%, or 15%-40% in comparison to non-direct cooled power modules. In this regard, the output current capability may be increased at least 5%, 10%, 15%, 20%, 25%, 30%, 35% or 40% in comparison to non-direct cooled power modules. Moreover, numerous other improvements in performance are contemplated by the power module 100 associated with FIGS. 43-58 implemented as described herein.

In one or more aspects of the disclosure, the power module 100 may be implemented in a high-performance, compact, modular 3-phase inverter based on the disclosed power modules 100, which are specifically optimized to fully utilize Silicon Carbide (SiC) MOSFETs. In some aspects, a modular AC output may allow the inverter to be configured as either a dual inverter or single inverter. In some aspects, a double-sided cold plate, custom capacitor, and direct-cooled SiC modules may enable ultra-high power density for the inverter. Parasitic elements of all critical components including the power module 100 and capacitors have been validated to ensure the lowest overall stray inductance. In some aspects, the unit may operate under application conditions with an 800 V DC bus and a 480 V/830 A phase current.

In this regard, conventional power packages are an effective and well accepted industrial solution for state of the art Silicon (Si) IGBTs. However, the conventional power packages struggle to take full advantage of what SiC based technology offers. The conventional power package footprints and internal layouts were originally designed for Si devices, which typically have a single or small number of paralleled large devices with signal networks following long paths. The bipolar nature of IGBTs limit the switching speeds such that the mentioned design trade-off is acceptable.

To fully utilize the high-performance attributes of SiC devices, a technology centric design has applied in conjunction with the disclosed power module 100. The power module 100 of the disclosure overcomes the shortcomings of existing module designs. In this regard, the SiC centric designs of the disclosure enable arranging multiple smaller die in parallel such that they share dynamic current evenly and optimize the signal network with short path parallel planes such that the SiC die switch evenly even under high speeds.

To meet these needs, the disclosed power module 100 has been highly optimized to achieve the maximum performance out of all sizes of commercially available 650-1700 V SiC MOSFETs. Some aspects of the disclosed power module 100 offer the capability to carry high currents (300 to >600 A) in a small footprint (53 mm×80 mm) with a terminal arrangement that allows for straight-forward bussing and interconnection. A low inductance, evenly matched layout of the disclosed power module 100 results in high quality switching events, minimizing oscillations internal and external to the power module 100. In some implementations, the disclosed power module 100 may have a stray inductance of ~6.7 nH and only ~60% the area of a 62 mm module. The disclosed current loops of the power module 100 have been designed such that they are wide, low profile, and evenly distributed between the devices so that they each have equivalent impedances across a switch position. The power terminals may be vertically offset such that the bus bars between the DC link capacitors and the power module 100 may be laminated all the way up to the power module 100 without requiring bends, coining, standoffs, or complex isolation. Ultimately this achieves a low inductance throughout the entire power loop from the DC link capacitors and the SiC devices.

Due to the high current density of SiC power devices, the thermal performance of the power module 100 and cold plate may allow for maximizing heat flux and reducing system size and cost. The disclosed direct-cooled power module may implement a copper pin-fin baseplate that improves on the thermal performance of the existing flat baseplate power modules. The flat baseplate power modules require a thermal interface material (TIM) to be applied between the module and a heatsink or cold plate to fill any voids in the thermal path. The effect of this TIM is an additional thermal impedance between module case and cold plate. The direct-cooled power module 100 has pins designed to be in direct contact with a coolant negating the need for a TIM. As shown in FIG. 61, the flat baseplate version of the power module can process a maximum of 410 $A_{RMS}$ while the direct-cooled version of the power module 100 can process 490 $A_{RMS}$. This corresponds to a 20% increase in output current capability.

In some aspects, the disclosed power module 100 may be implemented in an inverter design that adds a number of power modules 100 with a unique double-sided cold and the same low parasitic, high performance design. In one aspect, a double-sided cold plate may be utilized that features cooling surfaces on the top and bottom surface allowing for twice as many power modules 100 in the same footprint area, which when used in conjunction with the direct-cooled power module 100 of the disclosure results in more than double the power density in comparison to prior art implementations. In some aspects, a custom DC-link capacitor may be implemented with integrated laminated terminals as disclosed herein, which mount directly to both the top and bottom bank the power modules. This design has low stray inductance between the power modules 100 and the capacitor and eliminates the need for separate bus bars. The non-planar power modules 100 of the disclosure enable the capacitor terminal assembly to have no bends, which reduces cost and maximize overlap. The DC input terminals may be built into the capacitor creating a tightly integrated solution to interconnecting six half-bridge modules.

In some aspects, the disclosed power module 100 may be supported by a gate driver with high-noise immunity and high-speed protections to effectively switch the devices and provide maximum survivability under fault conditions.

In some aspects, the AC output terminals may be designed and implemented as a modular subassembly. This allows the inverter to be configured as a dual 3-phase inverter with 430 ARMS or more output and six or more current sensors or as a single 3-phase inverter with 860 ARMS or more output current and three or more current sensors.

The disclosed double-sided cold plate assembly may be implemented with direct-cooled power modules 100 as described herein mounted to top and bottom sides with gasket seals and an inverter with sensors, modules, cold plate, and capacitor.

To validate the high-performance nature of the system, the components have been evaluated in both the frequency and time domains. In some aspects, small-signal parasitic extraction enables an accurate measurement of parasitic elements which can be utilized in an iterative design process to minimize stray inductance. The quality of the switching waveforms for both overshoot voltage and ringing has been verified via a double pulse test of the module and DC-link capacitors at 800 V and 600 A per power module. In some aspects, a DC-link capacitor design may be implemented with optimal terminal spacing and arrangement to balance current density and minimize stray inductance.

Accordingly, the disclosure has set forth an improved power module 100 and associated system configured to address heat and increase an output current capability in comparison to non-direct cooled power modules. Moreover, the disclosed power module 100 may be implemented in numerous topologies including a half-bridge configuration, a full-bridge configuration, a common source configuration, a common drain configuration, a neutral point clamp configuration, a three phase configuration, and the like. Applications of the power module 100 may include a power system, a motor system, an automotive motor system, a charging system, an automotive charging system, a vehicle system, an industrial motor drive, an embedded motor drive, an uninterruptible power supply, an AC-DC power supply, a welder power supply, military systems, an inverter, an inverter for wind turbines, solar power panels, tidal power plants, and electric vehicles (EVs), a converter, and the like.

Accordingly, the disclosure has also set forth an improved power module 100 and associated system configured to address parasitic impedances, such as loop inductance, to increase stability, decrease switching losses, reduce EMI, and limit stresses on system components. In particular, the disclosed power module has the ability with the disclosed arrangement to reduce inductance in some aspects by as much as 10%. Moreover, the disclosed power module 100 may be implemented in numerous topologies including a half-bridge configuration, a full-bridge configuration, a common source configuration, a common drain configuration, a neutral point clamp configuration, and a three phase configuration. Applications of the power module 100 include motor drives, solar inverters, circuit breakers, protection circuits, DC-DC converters, and the like.

The power module 100 of the disclosure is adaptable for most systems within the power processing needs and size and weight restrictions specific for a given application. The power module design and system level structures described in the disclosure allow for a high level of power density and volumetric utilization to be achieved.

Aspects of the disclosure have been described above with reference to the accompanying drawings, in which aspects of the disclosure are shown. It will be appreciated, however, that this disclosure may, however, be embodied in many different forms and should not be construed as limited to the aspects set forth above. Rather, these aspects are provided so that this disclosure will be thorough and complete, and will fully convey the scope of the disclosure to those skilled in the art. Additionally, the various aspects described may be implemented separately. Moreover, one or more the various aspects described may be combined. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the disclosure. The term "and/or" includes any and all combinations of one or more of the associated listed items.

The terminology used herein is for the purpose of describing particular aspects only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Aspects of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical aspects of the disclosure and, although specific terms are employed, they are used in a generic and descriptive sense only and not for purposes of limitation, the scope of the disclosure being set forth in the following claims.

Aspects of the disclosure may be implemented in any type of computing devices, such as, e.g., a desktop computer, personal computer, a laptop/mobile computer, a personal data assistant (PDA), a mobile phone, a tablet computer, cloud computing device, and the like, with wired/wireless communications capabilities via the communication channels.

Further in accordance with various aspects of the disclosure, the methods described herein are intended for operation with dedicated hardware implementations including, but not limited to, PCs, PDAs, semiconductors, application specific integrated circuits (ASIC), programmable logic arrays, cloud computing devices, and other hardware devices constructed to implement the methods described herein.

It should also be noted that the software implementations of the disclosure as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the disclosure is considered to include a tangible storage medium or distribution medium, as listed herein and including art-recognized equivalents and successor media, in which the software implementations herein are stored.

Additionally, the various aspects of the disclosure may be implemented in a non-generic computer implementation. Moreover, the various aspects of the disclosure set forth herein improve the functioning of the system as is apparent from the disclosure hereof. Furthermore, the various aspects of the disclosure involve computer hardware that it specifically programmed to solve the complex problem addressed by the disclosure. Accordingly, the various aspects of the disclosure improve the functioning of the system overall in its specific implementation to perform the process set forth by the disclosure and as defined by the claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure. In this regard, the various aspects, features, components, elements, modules, arrangements, circuits, and the like are contemplated to be interchangeable, mixed, matched, combined, and the like. In this regard, the different features of the disclosure are modular and can be mixed and matched with each other.

What is claimed is:

1. A power module, comprising:
   at least one electrically conductive power substrate;
   a housing arranged on the at least one electrically conductive power substrate;
   a first terminal electrically connected to the at least one electrically conductive power substrate;
   the first terminal;
   a second terminal;
   a third terminal electrically connected to the at least one electrically conductive power substrate;
   a plurality of power devices arranged on and connected to the at least one electrically conductive power substrate;
   a base plate and the at least one electrically conductive power substrate being arranged on the base plate; and
   a plurality of pin fins arranged on the base plate and the plurality of pin fins configured to provide direct cooling for the power module.

2. The power module of claim 1, wherein:
   the plurality of pin fins are arranged on a bottom of the base plate;
   the plurality of pin fins are structured and arranged to form channels therebetween;
   the first terminal comprises a contact surface located on the housing;
   the second terminal comprises a contact surface located on the housing; and
   the third terminal being electrically connected to at least one of the plurality of power devices.

3. The power module of claim 1, wherein each of the plurality of pin fins is formed integral with the base plate and comprise a same material as the base plate.

4. The power module of claim 1, wherein the plurality of pin fins include a base portion, a terminating surface, and one or more surfaces, the one or more surfaces extending from the base portion to the terminating surface.

5. The power module of claim 4, wherein:
the terminating surface comprises a cross-sectional shape with respect to a plane that is parallel to a surface of the base plate; and
the cross-sectional shape comprises at least one of the following: an asymmetric cross-sectional shape, an airfoil shaped cross-sectional shape, and a wing shaped cross-sectional shape.

6. The power module of claim 4, wherein:
the base portion comprises a cross-sectional shape with respect to a plane that is parallel to a surface of the base plate; and
the cross-sectional shape comprises at least one of the following: a square cross-sectional shape, a rectangular cross-sectional shape, a circular cross-sectional shape, an oval cross-sectional shape, and a symmetric cross-sectional shape.

7. The power module of claim 1, wherein:
the plurality of pin fins comprise a base portion attached to the base plate, at least one surface extending away from the base plate and the base portion, and a terminating surface connected to the at least one surface; and
the at least one surface extending away from the base plate and the at least one surface tapering as the at least one surface extends to the terminating surface.

8. The power module of claim 1, wherein an output current capability is 5%-40% greater than non-direct cooled power modules.

9. The power module of claim 1, wherein an output current capability is 15% greater than non-direct cooled power modules.

10. A system comprising the power module of claim 1 and further comprising a cold plate.

11. A system comprising the power module of claim 1 and further comprising a cold plate and at least one of the following: an inverter, a power system, a motor system, a converter, and an AC-DC power supply.

12. A power module, comprising:
a base plate;
at least one power substrate arranged on the base plate;
a housing arranged on the at least one power substrate;
a first terminal electrically connected to the at least one power substrate;
a second terminal;
a third terminal electrically connected to the at least one power substrate;
a plurality of power devices electrically connected to the at least one power substrate;
a gate-source board electrically connected to the plurality of power devices; and
a plurality of pin fins arranged on the base plate and the plurality of pin fins are configured to provide direct cooling for the power module.

13. The power module of claim 12, wherein:
the plurality of pin fins are arranged on a bottom of the base plate; and
the plurality of pin fins are structured and arranged to form channels therebetween.

14. The power module of claim 12, wherein each of the plurality of pin fins is formed integral with the base plate and comprise a same material as the base plate.

15. The power module of claim 12, wherein the plurality of pin fins include a base portion, a terminating surface, and one or more surfaces, the one or more surfaces extending from the base portion to the terminating surface.

16. The power module of claim 15, wherein:
the terminating surface comprises a cross-sectional shape with respect to a plane that is parallel to a surface of the base plate; and
the cross-sectional shape comprises at least one of the following: an asymmetric cross-sectional shape, an airfoil shaped cross-sectional shape, and a wing shaped cross-sectional shape.

17. The power module of claim 15, wherein:
the base portion comprises a cross-sectional shape with respect to a plane that is parallel to a surface of the base plate; and
the cross-sectional shape comprises at least one of the following: a square cross-sectional shape, a rectangular cross-sectional shape, a circular cross-sectional shape, an oval cross-sectional shape, and a symmetric cross-sectional shape.

18. The power module of claim 12, wherein:
the plurality of pin fins comprise a cross-sectional shape with respect to a plane that is parallel to a surface of the base plate; and
the cross-sectional shape comprises at least one of the following: a contoured cross-sectional shape, a circular cross-sectional shape, a square cross-sectional shape, and a rectangular cross-sectional shape.

19. The power module of claim 12, wherein:
the plurality of pin fins comprise a base portion attached to the base plate, at least one surface extending away from the base plate and the base portion, and a terminating surface connected to the at least one surface; and
the at least one surface extending away from the base plate and the at least one surface tapering as the at least one surface extends to the terminating surface.

20. The power module of claim 12, wherein an output current capability is 5%-40% greater than non-direct cooled power modules.

21. The power module of claim 12, wherein an output current capability is 15% greater than non-direct cooled power modules.

22. A system comprising the power module of claim 12 and further comprising a cold plate.

23. A system comprising the power module of claim 12 and further comprising a cold plate and at least one of the following: an inverter, a power system, a motor system, a converter, and an AC-DC power supply.

24. A process of configuring a power module, comprising:
providing at least one power substrate;
arranging a housing on the at least one power substrate;
electrically connecting a first terminal to the at least one power substrate;
providing a second terminal;
electrically connecting a third terminal to the at least one power substrate;
electrically connecting a plurality of power devices to the at least one power substrate;
mounting a gate-source board electrically connected to the plurality of power devices, the gate-source board configured to receive at least one electrical signal;
providing a base plate and arranging the at least one power substrate on the base plate;

providing a plurality of pin fins arranged on the base plate; and configuring the plurality of pin fins to cool at least one component of the power module.

25. The process of configuring a power module of claim 24, further comprising:

configuring the plurality of pin fins to provide direct cooling for the power module;

arranging the plurality of pin fins on a bottom of the base plate; and arranging the plurality of pin fins to form channels therebetween.

26. The process of configuring a power module of claim 24, further comprising configuring the plurality of pin fins to include a base portion, a terminating surface, and one or more surfaces, the one or more surfaces extending from the base portion to the terminating surface.

27. The process of configuring a power module of claim 26, wherein:

the terminating surface comprises a cross-sectional shape with respect to a plane that is parallel to a surface of the base plate; and the cross-sectional shape comprises at least one of the following: an asymmetric cross-sectional shape, an airfoil shaped cross-sectional shape, and a wing shaped cross-sectional shape.

28. The process of configuring a power module of claim 26, wherein:

the base portion comprises a cross-sectional shape with respect to a plane that is parallel to a surface of the base plate; and the cross-sectional shape comprises at least one of the following: a square cross-sectional shape, a rectangular cross-sectional shape, a circular cross-sectional shape, an oval cross-sectional shape, and a symmetric cross-sectional shape.

29. The process of configuring a power module of claim 26, wherein an output current capability is 5%-40% greater than non-direct cooled power modules.

30. The process of configuring a power module of claim 26, wherein an output current capability is 15% greater than non-direct cooled power modules.

* * * * *